United States Patent
Kondo et al.

(10) Patent No.: US 6,405,895 B1
(45) Date of Patent: Jun. 18, 2002

(54) ARRANGING AND SUPPLYING APPARATUS

(75) Inventors: Takeshi Kondo, Chiryu; Yoshiyuki Kondo, Nagoya; Mamoru Tsuda, Okazaki, all of (JP)

(73) Assignee: Fuji Machine Mfg. Co., Ltd., Chiryu (JP)

( * ) Notice: Subject to any disclaimer, the term of this patent is extended or adjusted under 35 U.S.C. 154(b) by 0 days.

(21) Appl. No.: 09/559,091

(22) Filed: Apr. 27, 2000

(30) Foreign Application Priority Data

May 12, 1999 (JP) ........................................... 11-131293
Dec. 7, 1999 (JP) ........................................... 11-347600

(51) Int. Cl.⁷ ................................................ B65H 5/00
(52) U.S. Cl. ........................ 221/236; 221/220; 198/396
(58) Field of Search .............................. 221/236, 200, 221/223, 224, 157, 163, 156, 263, 268; 139/396

(56) References Cited

U.S. PATENT DOCUMENTS

| | | | | |
|---|---|---|---|---|
| 4,201,313 A | * | 5/1980 | Kirsch | 221/171 |
| 4,828,142 A | * | 5/1989 | McKnight | 221/171 |
| 5,054,363 A | * | 10/1991 | Scharch | 86/47 |
| 5,636,725 A | * | 6/1997 | Saito et al. | 198/396 |
| 5,934,505 A | | 8/1999 | Shimada | |
| 6,062,423 A | * | 5/2000 | Saito et al. | 221/236 |
| 6,073,800 A | | 6/2000 | Saito et al. | |
| 6,098,838 A | * | 8/2000 | Saho et al. | 221/163 |
| 6,234,298 B1 | * | 5/2001 | Nakagawa et al. | 198/396 |
| 6,264,061 B1 | * | 6/2001 | Fukai et al. | 221/171 |
| 6,267,223 B1 | * | 7/2001 | Nakagawa et al. | 198/396 |
| 6,283,325 B1 | * | 9/2001 | Saito et al. | 221/200 |
| 6,290,095 B1 | | 9/2001 | Saito et al. | |

FOREIGN PATENT DOCUMENTS

| | | |
|---|---|---|
| CN | 1 183 024 A | 5/1998 |
| EP | 0 484 224 A | 5/1992 |
| EP | 0 688 159 A1 | 12/1995 |
| EP | 0 817 558 A | 1/1998 |
| JP | A-8-48419 | 2/1996 |
| JP | 10 178297 A | 6/1998 |

* cited by examiner

Primary Examiner—Christopher P. Ellis
Assistant Examiner—Khoi H. Tran
(74) Attorney, Agent, or Firm—Oliff & Berridge, PLC

(57) ABSTRACT

An apparatus for arranging and supplying a plurality of objects, the apparatus including a chute which includes at least one end portion extending in a direction inclined with respect to a horizontal plane, and which causes the objects arranged in an array to be moved, a hopper which is provided on a side of the one end portion of the chute, which stores the objects in bulk, and which includes a funnelform bottom portion, a guide which is provided between a lower end of the bottom portion of the hopper and an upper end of the one end portion of the chute, and which guides, in a guiding direction, the objects from the hopper to the chute while arranging the objects into the array, the guide including a plurality of guide members comprising at least one movable guide member which is movable relative to at least one other guide member in the guiding direction, arid a movable-guide-member moving device which moves the movable guide member relative to the other guide member in the guiding direction.

38 Claims, 38 Drawing Sheets

ARRANGING AND SUPPLYING APPARATUS

BACKGROUND OF THE INVENTION

1. Field of the Invention

The present invention relates to an apparatus for arranging a number of objects each of which has a short columnar shape, into an array, and supplying the objects arranged in the array, and particularly to the art of improving reliability with which the apparatus supplies the objects.

2. Related Art Statement

Japanese Patent Application laid open for inspection under Publication No. 8(1996)-48419 discloses an example of the above-indicated apparatus. This apparatus includes a chute, a hopper, and a discharging-promoting tube. An upper end portion of the chute is provided by a pipe which extends vertically. The hopper is located on the side of an upper end portion of the pipe, includes a funnelform bottom portion, and stores a number of electric components ("ECs") in bulk, i.e., in such a manner that each EC takes an arbitrary posture. The discharging-promoting tube is externally fitted on the upper end portion of the pipe, such that the tube is vertically movable relative to the pipe, and the tube is driven by a driving device, such that the tube is moved to an advanced position where the tube projects into the hopper over an upper end of the pipe and to a retracted position located below the upper end of the pipe and retracted from the hopper. The driving device is designed such that each time one EC is taken out from the apparatus, the driving device reciprocates, one time, the discharging-promoting tube between its advanced and retracted positions. The reciprocative movement of the tube moves the ECs present in the bottom portion of the hopper, thereby preventing the ECs from engaging one another and making a "bridge" over the pipe, and thereby promoting discharging of the ECs into the pipe. Through the discharging-promoting tube, the ECs enter the pipe, and then move downward because of their own weights, so that the ECs are arranged in an array and are moved toward the other end portion of the chute. It can be thought that the discharging-promoting tube provides a guide which is located between a lower end of the bottom portion of the hopper and an upper end of the upper end portion of the chute and which guides the ECs from the hopper to the chute.

However, even the above-described apparatus that employs the discharging-promoting tube sometimes fails to supply the ECs. For example, an EC cannot enter the tube unless the EC takes a posture which allows the EC to enter the tube, i.e., a posture in which the lengthwise direction of the EC is vertical and simultaneously the entire transverse cross section of the EC is positioned in an opening of the tube. For example, an EC which lies on an upper end surface of the tube, in such a posture that the lengthwise direction of the EC is horizontal, cannot change its posture even if the tube may be vertically moved, and can just move together with the tube, and accordingly the EC cannot enter the tube. Meanwhile, the upper end surface of the tube is inclined downward as it extends radially inward toward the center of the tube, thereby providing a guide surface for guiding each EC to the tube. However, in a state in which a plurality of ECs fill a space surrounded by the guide surface and prevent one another from entering the tube, that is, the tube is clogged with the ECs, this clogging cannot be easily eliminated even if the tube is vertically moved. Thus, the ECs cannot enter the discharging-promoting tube, and accordingly the apparatus fails to supply the ECs.

SUMMARY OF THE INVENTION

The present invention provides an arranging and supplying apparatus which has one or more of the technical features that are described below in respective paragraphs given parenthesized sequential numbers (1) to (40). Any technical feature which includes another technical feature shall do so by referring, at the beginning, to the parenthesized sequential number given to the latter feature. Thus, two or more of the following technical features may be combined, if appropriate. Each technical feature may be accompanied by a supplemental explanation, as needed. However, the following technical features and the appropriate combinations thereof are just examples to which the present invention is by no means limited. In addition, in the case where one technical feature recites a plurality of items, it is not essentially required that all those items be simultaneously employed. That is, it is possible that only a portion (one, two, . . . , but not all) of those items be selected and employed.

(1) According to a first feature of the present invention, there is provided an apparatus for arranging and supplying a plurality of objects, the apparatus comprising a chute which includes at least one end portion extending in a direction inclined with respect to a horizontal plane, and which causes the objects arranged in an array to be moved; a hopper which is provided on a side of the one end portion of the chute, which stores the objects in bulk, and which includes a funnelform bottom portion; a guide which is provided between a lower end of the bottom portion of the hopper and an upper end of the one end portion of the chute, and which guides, in a guiding direction, the objects from the hopper to the chute while arranging the objects into the array, the guide including a plurality of guide members comprising at least one movable guide member which is movable relative to at least one other guide member in the guiding direction; and a movable-guide-member moving device which moves the movable guide member relative to the other guide member in the guiding direction. Generally, each of the objects has a short columnar shape, such as a short prismatic shape or a short cylindrical shape. Each object may be an electric component according to the thirty-ninth feature (39). Thus, each object may have a polygonal transverse cross section, such as a quadrangular or triangular transverse cross section, or a circular transverse cross section. A passage formed through the guide, and/or the chute, may have a transverse cross section which may, or may not, be identical with that of each object. The one end portion of the chute may be vertical, or may be inclined relative to a vertical direction, so long as the one end portion causes each object to be moved by gravity. In the former case, the weight of each object can be most effectively utilized; and in the latter case, if the other end portion of the chute is horizontal, an angle contained by the two end portions is smaller than 90 degrees and accordingly each object can be moved more smoothly. All of the plurality of guide members of the guide may be movable in the guiding direction, or only a portion (one, two, . . . , but not all) of the guide members may be movable. In the former case, for example, respective movement amounts, respective movement directions, and/or respective movement timings of the guide members may differ from each other, so that the guide members are moved relative to each other in the guiding direction. In the latter case, naturally, one or more movable guide members are moved relative to one or more stationary guide members. If, in the latter case, the guide includes two or more movable guide members, those movable guide members may be moved relative to each other. When at least one movable guide member of the guide is moved relative to at least one other guide member of the same, the objects present in the bottom portion of the hopper are moved, so that those objects are prevented from making a bridge over the guide, or clogging the guide, and are smoothly introduced into the guide. In addition, as compared with the conventional arranging and supplying device in which a guide member is entirely moved, each object can take, with higher probability, its specific posture which allows itself to enter the guide. For example, in the case where an object lies on its side on two guide members which are movable relative to each other, if those two guide members are moved relative to each other in the guiding direction, the object can be easily raised from its horizontal posture to its vertical posture. As is apparent from the foregoing explanation, the movable guide member of the guide can be said as an object-discharging promoting member. Typically, the "funnelform" bottom portion of the hopper is one whose lowest portion is located at the center of a bottom surface of the hopper, defined by the bottom portion thereof. However, as far as the present invention is concerned, the "funnelform" bottom portion may be one whose lowest portion is located on one side, or at one corner, of the bottom surface. In the present arranging and supplying apparatus, the movement of the movable guide member promotes each object to enter the guide, and the relative movement of the guide members in the guiding direction causes, with high probability, each object to take its specific posture which allows itself to enter the guide. Thus, each object is supplied with stability, and failure of supplying of the object is effectively prevented.

(2) According to a second feature of the present invention that includes the first feature (1), the guide has an upper surface which is inclined, with respect to the horizontal plane, by a first angle which falls within a predetermined angle range within which a second angle by which a bottom surface of the hopper, defined by the bottom portion thereof, is inclined with respect to the horizontal plane falls. The angle range may range from 10 degrees to 80 degrees with respect to the horizontal plane. The inclined, upper surface of the guide may be a planar surface, or a curved surface which is curved convexly toward the center of the guide. In the former case, the upper surface may be defined by a single planar surface, or a plurality of planar surfaces which are inclined by different angles with respect to the horizontal plane. It can be speculated that many objects which have been moved on the inclined, bottom surface of the hopper, toward the guide, are largely deflected by the lower edge of the planar upper surface or surfaces of the guide, and eventually enter the guide. In the latter case, it can be speculated that many objects are gradually deflected by the curved upper surface of the guide, and eventually enter the guide. It is desirable that the upper surface of the guide be so greatly inclined relative to the horizontal plane that an angle contained by two portions of the upper surface that are opposed to each other in a direction perpendicular to the guiding direction is an acute angle which easily causes each object which has been moved on the inclined upper surface, to take a vertical posture. Since the upper surface of the guide is inclined, the transverse cross section of a passage formed in the guide decreases in a direction toward the chute, and accordingly there is some possibility that a plurality of objects simultaneously ride on the inclined upper surface of the guide, thereby preventing each other from entering the guide. However, when the guide members of the guide are moved relative to each other, those objects are moved relative to each other, so that the objects are prevented from clogging the guide and are promoted to enter the guide. Thus, the inclined upper surface of the guide guides, owing to its inclination, each object to enter the guide, so that each object more easily enters the guide and eventually is supplied with reliability.

(3) According to a third feature of the present invention that includes the second feature (2), the first angle is greater than the second angle. If the angle of inclination of the bottom surface of the hopper is too great, the number of the objects that can be accommodated in the bottom portion of the hopper decreases, and additionally the objects present in the bottom portion strongly bind one another owing to wedge effect. Thus, each object cannot easily enter the guide. In contrast, it is desirable as explained above that the angle of inclination of the upper surface of the guide be so great that the angle contained by the opposed portions of the upper surface is acute, in order to cause the objects to enter easily the guide. According to the third feature (3), the objects can easily enter the guide, while the objects are not caused to bind strongly one another. However, if the angle contained by the opposed portions of the upper surface is acute, each object is more likely bitten, when the movable guide member is moved downward, between the upper surface of the guide and a side surface of the movable guide member, owing to the wedge effect, so that the present apparatus comes to a deadlock state. If, in this state, the movable guide member is forcedly lowered, at least one of the object and the guide member may be damaged. Therefore, it is desirable that the upward (or advancing) movement of the movable guide member be forcedly caused and the downward (or retracting) movement of the same be caused by an elastic force which is produced by an elastic member such as a spring member. The elastic force of the elastic member is so predetermined that when an object is bitten between the upper surface of the guide and the side surface of the movable guide member and accordingly the present apparatus falls in the deadlock state, the movable guide member can be stopped at that position where the deadlock has occurred. The biting of the object is released when the movable guide member is moved upward next.

(4) According to a fourth feature of the present invention that includes the second or third feature (2) or (3), the upper surface of the guide includes a first portion which is located on a side of the bottom portion of the hopper, and a second portion which is located on the side of the one end portion of the chute and is inclined, with respect to the horizontal plane, by an angle greater than an angle by which the first portion is inclined with respect to the horizontal plane. As explained above, the greater the angle of inclination of the upper surface of the guide is, the more easily each object is caused to take its specific posture which enables itself to enter the guide. According to the fourth feature (4), each object can enter the guide with higher reliability.

(5) According to a fifth feature of the present invention that includes any one of the first to fourth features (1) to (4), the at least one other guide member of the guide comprises at least one stationary guide member which is not movable. In this case, the movable-guide-member moving device enjoys a simpler construction, as compared with the case where all the guide members of the guide are movable guide members.

(6) According to a sixth feature of the present invention that includes any one of the first to fifth features (1) to (5), the plurality of guide members of the guide comprise at least two movable guide members each of which is movable in the guiding direction, and at least one of a movement amount, a movement direction, and a movement timing of one of the two movable guide members differs from a corresponding one of a movement amount, a movement direction, and a movement timing of the other of the two movable guide members. According to the sixth feature, at least two movable guide members are moved relative to each other in the guiding direction. In a particular case where the guide includes three or more guide members including at least one stationary guide member and at least two movable guide members, and at least one of a movement amount, a movement direction, and a movement timing of one of the two movable guide members differs from a corresponding one of a movement amount, a movement direction, and a movement timing of the other movable guide member, the three or more guide members are moved relative to one another in at least three steps, so that the objects are more effective prevented from making a bridge or each object is more easily caused to take its specific posture which allows itself to enter the guide.

(7) According to a seventh feature of the present invention that includes the sixth feature (6), the movement direction of the one movable guide member is opposite to the movement direction of the other movable guide member. According to this feature, the two movable guide members are simultaneously moved in opposite directions, respectively. Therefore, when one of the two movable guide members is moved upward to lift up the objects, the other movable guide member is moved downward to create positively a space thereabove, so that the objects around the other guide member can easily move into the space, and are effectively prevented from making a bridge. In addition, the objects receive only a small force from the one guide member which is moving upward, and accordingly are effectively prevented from being damaged. Moreover, the respective movement amounts (i.e., respective strokes) of the two movable guide members may be half the movement amount of a movable guide member in the case where the guide includes, in addition to the movable guide member, a stationary guide member. Since the two movable guide members are moved in opposite directions, respectively, the amount of relative movement of the two movable guide members is twice the movement amount of each of the two movable guide members. Hence, the speed of movement of each object caused by the respective movements of the movable guide members can be low. Therefore, each object can easily enter the guide. In the case where the present arranging and supplying apparatus is employed in an object supplying system which supplies objects to a different apparatus, the present apparatus can easily position each object, without delay, at an object-supply position at an appropriate timing at which the object supplying system supplies the each object to the different apparatus. Since the respective movement speeds of the movable guide members are low, the forces applied by the movable guide members to the objects are small, which contributes to preventing the objects from being damaged.

(8) According to an eighth feature of the present invention that includes any one of the first to seventh features (1) to (7), the each object has a prismatic shape having a convex quadrilateral transverse cross section, the chute has a convex quadrilateral transverse cross section corresponding to the transverse cross section of the each object, and the at least one movable guide member of the guide defines at least one side of four sides of a convex quadrilateral corresponding to the transverse cross section of the chute, and is movable, in the guiding direction, relative to the at least one other guide member of the guide that defines at least one other side of the convex quadrilateral. The convex quadrilateral transverse cross section of each prismatic object may be a square, a rectangle, or any other convex quadrilateral. The guide may be provided by four guide members which define the four sides of the quadrilateral, respectively, two guide members which define two pairs of sides of the four sides, respectively, or a first guide member which defines three sides of the four sides and a second guide member which defines the fourth or last side of the four sides. In the case where the transverse cross section of each prismatic object is a rectangle, it is desirable, in view of the ease to change the posture of each object, that a long-side guide member which defines a long side of the rectangle be moved. Since the long-side guide member has a great area to contact each object, it has more chances to change the posture of the object. Meanwhile, in view of the ease to produce the present apparatus, it is more advantageous, in many cases, that a short-side guide member which defines a short side of the rectangle is moved. If the angular position of the transverse cross section of each prismatic object (hereinafter, expressed in terms of a rotation phase of each object about its central axis parallel to its lengthwise direction) coincides with that of the transverse cross section of the guide, the object can enter the guide, so that the object is introduced into the chute. Therefore, it is desirable that the shape and dimensions of the narrowest portion of a passage which is defined by the guide and which has a quadrilateral transverse cross section be substantially the same as those of the transverse cross section of a passage defined by the chute.

(9) According to a ninth feature of the present invention that includes the eighth feature (8), a portion of the guide that defines the four sides of the quadrilateral corresponding to the quadrilateral transverse cross section of the chute, is divided into less than four guide members comprising the at least one movable guide member and the at least one other guide member.

(10) According to a tenth feature of the present invention that includes the eighth feature (8), a portion of the guide that defines the four sides of the quadrilateral corresponding to the quadrilateral transverse cross section of the chute, is divided into four guide members comprising the at least one movable guide member and the at least one other guide member.

(11) According to an eleventh feature of the present invention that includes the eighth feature (8), the guide is divided into more than four guide members comprising the at least one movable guide member and the at least one other guide member.

(12) According to a twelfth feature of the present invention that includes any one of the eighth to eleventh features (8) to (11), a portion of the guide that defines the four sides of the quadrilateral corresponding to the quadrilateral transverse cross section of the chute, is divided into the plurality of guide members by a plurality of dividing planes comprising at least one dividing plane which includes a vertex of the quadrilateral and extends parallel to the guiding direction. In a particular case where the portion of the guide that defines the four sides of the quadrilateral is divided by two dividing planes which respectively include two vertices of the quadrilateral that cooperate with each other to define one side of the quadrilateral, and which extend parallel to that one side, the two dividing planes may exist on the one side.

(13) According to a thirteenth feature of the present invention that includes any one of the eighth to twelfth features (8) to (12), a portion of the guide that defines the four sides of the quadrilateral corresponding to the quadrilateral transverse cross section of the chute, is divided into the plurality of guide members by a plurality of dividing planes comprising at least one dividing plane which extends from an intermediate point on one of the four sides of the quadrilateral.

(14) According to a fourteenth feature of the present invention that includes the eighth feature (8), the guide includes four guide members which define the four sides of the quadrilateral, respectively, and which comprise two movable guide members that are opposed to each other and are movable in the guiding direction, and two stationary guide members which are not movable. The arranging and supplying apparatus in accordance with this feature (14) is a special one in accordance with the eighth feature (8). According to this feature (14), the arranging and supplying apparatus can be easily produced in many cases.

(15) According to a fifteenth feature of the present invention that includes the fourteenth feature (14), respective movement amounts of the two movable guide members differ from each other. According to this feature (15), the four guide members of the guide are moved relative to one another, in three steps, and the relative movements of the guide members change the respective postures of the objects to their specific postures which allow themselves to enter the guide.

(16) According to a sixteenth feature of the present invention that includes the eighth feature (8), the guide includes four guide members which define the four sides of the quadrilateral, respectively, and which comprise at least three movable guide members each of which is movable in the guiding direction, and two movable guide members of the three movable guide members are simultaneously moved in opposite directions, respectively. The fourth or last guide member of the guide other than the three movable guide members may be movable or stationary. In either case, it is desirable that the respective movement directions, the respective movement mounts, and/or the respective movement timings, of the three movable guide members differ from one another, and it is desirable that at least two movable guide members of the three movable guide members are moved, at at least one timing, in opposite directions, respectively.

(17) According to a seventeenth feature of the present invention that includes the eighth feature (8), the quadrilateral is a rectangle having two long sides opposed to each other, and two short sides opposed to each other, and the plurality of guide members of the guide comprise a first movable guide member which defines one of the two long sides and is movable in the guiding direction, and two second movable guide members which define the two short sides, respectively, and are movable in the guiding direction, and wherein the first movable guide member is moved in a direction opposite to a direction in which the two second movable guide members are moved. The two second movable guide members which define the two short sides, respectively, are always moved in the same direction, but the first movable guide member is moved in a direction opposite to a direction in which the two second movable guide members are moved. Thus, the present arranging and supplying apparatus can enjoys the advantage of the apparatus in accordance with the seventh feature (7), that is, can easily prevent the objects from making a bridge over the guide.

(18) According to an eighteenth feature of the present invention that includes the seventeenth feature (17), the two second movable guide members are moved at different speeds. Since the two movable guide members are moved at different speeds, the objects can be moved in various manners. For example, in the case where the two second movable guide members which define the two short sides, respectively, are always moved in the same direction, one of the two second movable guide members that is moved at the higher speed can be moved over the other second movable guide member that is moved at the lower speed. Hence, when the two second movable guide members are moved upward, the one second guide member is moved upward over the other second guide member, while pushing the objects thereabove aside toward the side of the other second guide member, and thereby preventing the objects from making a bridge. In addition, when the two second movable guide members are moved downward, the one second guide member creates a greater space thereabove, while causing the objects thereabove to move into the space, and thereby preventing the objects from producing a bridge.

(19) According to a nineteenth feature of the present invention that includes the eighth feature (8), the quadrilateral is a rectangle having two long sides opposed to each other, and two short sides opposed to each other, and the plurality of guide members of the guide comprise a first movable guide member which defines one of the two long sides and one of the two short sides that is adjacent to the one long side, a second guide member which defines the other long side, and a third guide member which defines the other short side, and wherein at least one of the second and third guide members comprises a movable guide member which is different from the first movable guide member and is moved in a direction opposite to a direction in which the first movable guide member is moved. The present apparatus enjoys the advantages which results from the feature that two movable guide members are simultaneously moved in opposite directions, respectively. In addition, when at least two movable guide members of the guide are moved, at least three sides of the rectangle can be moved. Since the greater number of sides of the rectangle than the total number of the movable guide members can be moved, the present apparatus can enjoy a simple construction.

(20) According to a twentieth feature of the present invention that includes the nineteenth feature (19), the second guide member is a stationary guide member which is not movable.

(21) According to a twenty-first feature of the present invention that includes the eighth feature (8), the guide is separated, by a plane which extends parallel to the guiding direction, into a first separated portion and a second separated portion which defines the other side of the convex quadrilateral, and wherein the second separated portion is divided into a middle stationary guide member defining the other side and two side movable guide members which are located on both sides of the middle stationary guide member, respectively. The second separated portion may be divided into two guide members by a plane which extends from an intermediate point on the other side of the quadrilateral. However, according to the present feature (21), the second separated portion is divided into three guide members, i.e., a middle guide member and two side guide members. In the latter case, it is easy to form the narrowest portion of the guide along the middle guide member and connect the chute to the narrowest portion.

(22) According to a twenty-second feature of the present invention that includes the twenty-first feature (21), each of the two side movable guide members has a parallel guide surface extending parallel to the guiding direction, and an inclined guide surface which cooperates with the parallel guide surface to guide the each object to a narrowest portion of the guide that is provided along the middle stationary guide member.

(23) According to a twenty-third feature of the present invention that includes the twenty-second feature (22), the parallel guide surface and the inclined guide surface are formed on respective integral portions of the each side movable guide member.

(24) According to a twenty-fourth feature of the present invention that includes any one of the eighth to twenty-third feature (8) to (23), the guide includes four portions which define the four sides of the quadrilateral, respectively, and comprise a first pair of portions opposed to each other and a second pair of portions opposed to each other, the two portions of the first pair have respective first planar surfaces which respectively define two first sides of the quadrilateral that are opposed to each other and which extend parallel to the guiding direction, and at least one first inclined surface which extends from an upper end of at least one of the two first planar surfaces and is inclined in a direction away from the other first planar surface as the first inclined surface extends upward, and the two portions of the second pair have two second planar surfaces which are located between the two first planar surfaces and extend parallel to the guiding direction, and at least one second inclined surface which extends from an upper end of at least one of the two second planar surfaces and is inclined in a direction away from the other second planar surface as the second inclined surface extends upward, and a greatest distance between a first portion of the second inclined surface that is located between the two first planar surfaces, and a second portion which is opposed to the first portion in a direction parallel to the two first sides, taken at at least one timing during movement of the movable guide member of the guide, is more than two times greater than a length of each of the two first sides. It is desirable that the above-indicated greatest distance be three, four, five, or seven times greater than the length of each first side. In the case where the above-indicated one end portion of the chute is vertical, the first and second planar surfaces are vertical. On the other hand, in the case where the one end portion of the chute is inclined relative to a vertical direction, the first and/or second planar surfaces are also inclined relative to the vertical direction. The quadrilateral may be a square or a rectangle. In the case of the square, each first side and each second side have the same length. The two first planar surfaces and the second inclined surface may be designed such that during the movement of the movable guide member, the entire second inclined surface is always positioned between the two first planar surfaces, irrespective of which position is currently taken by the movable guide member; such that during the movement of the movable guide member, a portion of the second inclined surface is always positioned between the two first planar surfaces, irrespective of which position is currently taken by the movable guide member, and another portion of the second inclined surface is positioned, or not positioned, between the two first planar surfaces, depending upon the current position of the movable guide member; or such that at an appropriate timing during the movement of the movable guide member, the entire second inclined surface is moved away from a space defined by, and between, the two first planar surfaces. In the present arranging and supplying apparatus, as the objects present in the lower end portion of the bottom portion of the hopper move downward, they are guided by the first and second inclined surfaces and introduced into a portion of the guide that is located on the side of the chute and is defined by the first and second planar surfaces as guide surfaces. The second inclined surface, positioned between the two first planar surfaces, reliably guides the objects, and additionally the greatest distance between a first portion of the second inclined surface that is located between the two first planar surfaces, and a second portion which is opposed to the first portion in a direction parallel to the two first sides, taken at at least one timing during the movement of the movable guide member, is more than two times greater than the length of each first side. Thus, each object can easily enter the space defined between the two first planar surfaces, and accordingly can easily enter the portion of the guide that is located on the side of the chute.

(25) According to a twenty-fifth feature of the present invention that includes the twenty-fourth feature (24), the quadrilateral is a rectangle, and the each first side is longer than each of the second sides. In this case, the transverse cross section of the guide is a rectangle.

(26) According to a twenty-sixth feature of the present invention that includes the twenty-fourth or twenty-fifth feature (24) or (25), each of the two portions of the second pair has the second inclined surface. The objects are guided by the two second inclined surfaces. Each of the two portions of the first pair may have the first inclined surface.

(27) According to a twenty-seventh feature of the present invention that includes the eighth feature (8), the plurality of guide members of the guide comprise a first guide member which defines two sides of the quadrilateral that are adjacent to each other, and a second guide member which defines the other two sides of the quadrilateral that are adjacent to each other, and wherein the at least one movable guide member of the guide comprises one of the first and second guide members and the at least one other guide member of the guide comprises the other of the first and second guide members. According to this feature (27), one of the first and second guide members is moved in the guiding direction relative to the other of the first and second guide members, so that a first pair of opposed sides of the quadrilateral are moved relative to each other in the guiding direction and a second pair of opposed area of the same are also moved relative to each other in the guiding direction. Therefore, in many postures of various postures in which each object may possibly ride on the guide, the lengthwise opposite end portions of the object ride on the first and; second guide members which are moved relative to each other in the guiding direction, so that the posture of the object may be changed, with high probability, to its specific or vertical posture which allows itself to enter the guide. In a particular case where all the respective upper surfaces of the guide members that correspond to the four sides of the quadrilateral are inclined downward as they extend toward the center of the guide, an object which rides on one guide member, in fact, rides on the two inclined upper surfaces of the one guide member. Thus, it is hard for the object to stay still on the one guide member, so that the object is advantageously introduced into the guide.

(28) According to a twenty-eighth feature of the present invention that includes the twenty-seventh feature (27), the other of the first and second guide members is a stationary guide member which is not movable. The present apparatus can employ the guide and the movable-guide-member moving device each of which has a simple construction, and can efficiently arrange and supply the objects.

(29) According to a twenty-ninth feature of the present invention that includes the twenty-seventh feature (27), the first and second guide members of the guide are two movable guide members, and at least one of a movement direction and a movement amount of one of the two movable guide members differs from a corresponding one of a movement direction and a movement amount of the other movable guide member.

(30) According to a thirtieth feature of the present invention that includes any one of the first to twenty-ninth features (1) to (29), the arranging and supplying apparatus further comprises a stationary guide-member holding member which holds the movable guide member of the guide such that the movable guide member is movable in the guiding direction. In the case where the plurality of guide members of the guide comprises at least one stationary guide member, the stationary guide member may provide the stationary guide-member holding member. Alternatively, the stationary guide-member holding member may be one which is independent of the guide members of the guide.

(31) According to a thirty-first feature of the present invention that includes any one of the sixth to thirtieth features (6) to (30), the movable-guide-member moving device comprises a pivotable member which is pivotable about an axis line perpendicular to the guiding direction, and which includes two engaging portions which respectively engage the two movable guide members which are simultaneously moved in opposite directions, respectively. The movement of one of the two movable guide members is transmitted by the pivotable member to the other movable guide member, such that the direction of movement of the one movable guide member is changed by the pivotable member. Thus, it can be said that the pivotable member provides a movement-direction changing member. If the two movable guide members are engaged with the pivotable member, at respective positions which are equally distant from the axis line of pivotal motion of the pivotable member, the two guide members are moved at the same speed; and if those positions are not equally distant from the axis line, the two guide members are moved at different speeds, i.e., in different manners. In addition, since the pivotable member is pivotable about one axis line, it can be disposed and operated in a small space and accordingly can be easily employed.

(32) According to a thirty-second feature of the present invention that includes any one of the first to thirty-first features (1) to (31), the movable-guide-member moving device comprises a cam follower which is provided on the movable guide member of the guide such that the cam follower is movable with the movable guide member; and a pivotable cam which is pivotable about an axis line perpendicular to a direction in which the movable guide member is moved, and which engages the cam follower and converts an own pivotal motion into a linear motion of the cam follower. Since the movable-guide-member moving device is provided by the cam follower and the pivotable cam, the movement amount (i.e., stroke), movement direction, movement timing, and/or movement frequency of the movable guide member can be easily selected to desired ones by selecting the shape of the cam.

(33) According to a thirty-third feature of the present invention that includes the thirty-second feature (32), the cam follower comprises an engage pin which projects from the movable guide member such that the engage pin extends in a direction perpendicular to the direction in which the movable guide member is moved, and the pivotable cam comprises a cam lever which includes a cam portion which engages the engage pin.

(34) According to a thirty-fourth feature of the present invention that includes the thirty-second or thirty-third feature (32) or (33), the movable-guide-member moving device comprises a driven member which is driven by a drive member which is driven by a drive source which is provided outside the apparatus. In the case where both the drive source and the drive member are provided outside the present arranging and supplying apparatus, the present apparatus can enjoy a simple construction as such. In the case where a plurality of arranging and supplying apparatuses are used while being exchanged with each other, or are simultaneously used with each other, it is possible to use the outside drive source and drive member commonly for those arranging and supplying apparatuses. In the latter case, the present apparatuses cost much lower. In addition, since the present apparatus needs only the driven member and elements to be provided on a downstream side of the driven member, it does not need an electric wire or a hose to supply an electric current or a pressurized fluid to the drive source. This advantage is emphasized in the case where the arranging and supplying apparatus is of a type which supplies objects while moving. In addition, the outside drive source may be used as the drive source of a different device, which leads to reducing the cost of the present apparatus. For example, in the case where the present arranging and supplying apparatus is employed in an EC feeder which supplies ECs to an EC mounting device, a plurality of EC feeders are placed on a movable table, and respective EC-supply portions of the EC feeders are sequentially moved to an EC-supply position while the table is moved, the drive member may be provided at the EC-supply position, and may be commonly used by the respective arranging and supplying apparatuses of the EC feeders. In the last case, the arranging and supplying apparatuses enjoys the first two advantages of the above-indicated three advantages. In addition, if the drive source of the EC supplying device is used as the outside drive source of the arranging and supplying apparatuses, they additionally enjoy the last one of the three advantages.

(35) According to a thirty-fifth feature of the present invention that includes the thirty-fourth feature (34), the driven member comprises a reciprocateable member, and the movable-guide-member moving device comprises a motion converting device which converts a single reciprocative movement of the reciprocateable member into a plurality of reciprocative movements of the movable guide member. Since a single reciprocative movement of the reciprocateable member is converted into a plurality of reciprocative movements of the movable guide member, the objects are moved more frequently and are more effectively prevented from making a bridge. In addition, the respective postures of the objects are more frequently changed, and the objects enjoy more chances to enter the guide. Thus, the objects are supplied with higher reliability.

(36) According to a thirty-sixth feature of the present invention that includes the thirty-second or thirty-third feature (32) or (33), the arranging and supplying apparatus further comprises a drive source which drives the pivotable cam. In the case where a drive source is provided outside the present arranging and supplying apparatus and, in particular, a drive source of an external device is used as the outside drive source of the present apparatus, the timing and/or frequency at which the driven member is driven by the outside drive source are adversely limited in many cases. In contrast, according to this feature (36), the arranging and supplying apparatus includes a drive source and accordingly the drive source can drive the movable-guide-member moving device at an arbitrary timing and at an arbitrary frequency. Thus, the objects can be introduced into the chute with higher reliability. For example, in place of, or in addition to, a reciprocation of the movable guide member at a timing at which an object is supplied, the movable guide member may be reciprocated at least one time at at least one timing while the external device waits for the supplying of the next object, so that another or other objects may enter the chute.

(37) According to a thirty-seventh feature of the present invention that includes the thirty-sixth feature (36), the drive source comprises an electric motor. The electric motor may be a servomotor or a stepper motor as a sort of rotary motor which is controllable with respect to its rotation angle or amount.

(38) According to a thirty-eighth feature of the present invention that includes the thirty-sixth or thirty-seventh feature (36) or (37), the movable-guide-member moving device comprises a driving control device which operates, while the apparatus supplies each one object, the drive source by an amount which causes the plurality of reciprocative movements of the movable guide member. For example, in the case where the pivotable cam is an eccentric cam and, when the eccentric cam is rotated by 360 degrees, the movable guide member is reciprocated one time, the drive source is controlled such that while one object is supplied, the eccentric cam is fully rotated a plurality of times. Alternatively, in the case where the pivotable cam has a plurality of projection on its cam surface and, when the cam is rotated by 360 degrees, the movable guide member is reciprocated a plurality of times, the drive source may be controlled to rotate the cam by only an angle smaller than 360 degrees. In short, it is essentially required that the drive source be rotated by an angle which causes the plurality of reciprocative movements of the movable guide member. In the case where the guide includes a plurality of movable guide members, the movable-guide-member moving device may employ respective exclusive cams for the movable guide members, or a common cam for all of them. In the former case, the cams may be of a same sort or of different sorts. In the first case of the former case, the exclusive cams may be provided by eccentric cams which have different rotation phases for the movable guide members. In this case, the cost can be reduced because of use of the same sort of cams, and the movable guide members can be moved at different timings and accordingly be moved relative to each other. In the second case of the former case, one of the exclusive cams may be provided by an eccentric cam and the other cam may be provided by a cam having a projection on its cam surface.

(39) According to a thirty-ninth feature of the present invention that includes any one of the first to thirty-eighth features (1) to (38), the each object is an electric component which has a generally rectangtilar-parallelopiped shape. The present arranging and supplying apparatus may be employed in an EC feeder which supplies ECs. The EC feeder may be used for supplying ECs to an EC mounting device which mounts the ECs on a circuit board such as a printed-wiring board. However, the present apparatus may be employed in an EC feeder other than the EC feeder for supplying the ECs to the EC mounting device.

(40) According to a fortieth feature of the present invention, there is provided an apparatus for arranging and supplying a plurality of objects, the apparatus comprising a chute which includes at least one end portion extending in a direction inclined with respect to a horizontal plane, and which causes the objects arranged in an array to be moved; a hopper which is provided on a side of the one end portion of the chute, which stores the objects in bulk, which includes a funnelform bottom portion, and which has an outlet at a lower end of the bottom portion; a discharging-promoting member which is provided in a vicinity of the outlet of the hopper, which is movable to an advanced position where the discharging-promoting member projects into the hopper and to a retracted position away from the advanced position, and which promotes discharging of the objects from the hopper to the chute while arranging the objects into the array; a positioning device which sequentially positions the objects which have been moved in the array through the chute, one by one, at a predetermined supply position; and a reciprocating device which reciprocates, while each one object is positioned at the supply position by the positioning device, the discharging-promoting member between the advanced and retracted positions, a plurality of times. The discharging-promoting member of the present apparatus is readable on the movable guide member, or each of the movable guide members, recited in each of the first to thirty-ninth features (1) to (39). That is, the present feature (40) may be combined with any one of the features (1) to (39). It is desirable that the retracted position be a position where the discharging-promoting member does not project into the hopper. The discharging-promoting member may be provided by the movable guide member, or each of the movable guide members, of the guide, as indicated above. However, in the case where the guide is provided by a single integral member, the discharging-promoting member may be provided by the single integral member. In either case, it is desirable, but not essentially required, that the discharging-promoting member be provided in a state in which the promoting member defines at least a portion of a passage which introduces each object into the chute. It is possible that one end portion of the chute be directly connected to an outlet of the hopper and the discharging-promoting member be provided in the vicinity of the one end portion of the chute. In the case where the discharging-promoting member is provided by the movable guide member, or each of the movable guide members, of the guide, as indicated above, the present apparatus may enjoy the advantages of each of the features (1) to (39). Even if the discharging-promoting member may be provided by the single integral member of the guide, the promoting member is reciprocated two or more times, so that the objects stored in the hopper are moved frequency and accordingly are effectively prevented from making a bridge over the guide, and so that each object enjoys more chances that the posture thereof is changed to a specific posture which allows the object to enter an inner space of the promoting member. Thus, each object can be supplied with high reliability. Moreover, in the case where the discharging-promoting member is provided in the vicinity of the one end portion of the chute, the objects are moved by the reciprocative movements of the promoting member, and are thus promoted to enter the chute. Since the promoting member is reciprocated two or more times, each object enjoys more chances to enter the chute, so that each object can be supplied with reliability.

BRIEF DESCRIPTION OF THE DRAWINGS

The above and optional objects, features, and advantages of the present invention will be better understood by reading the following detailed description of the preferred embodiments of the invention when considered in conjunction with the accompanying drawings, in which.

DETAILED DESCRIPTION OF THE PREFERRED EMBODIMENTS

Hereinafter, preferred embodiments of the present invention will be described in detail by reference to the drawings.

Figure 1:
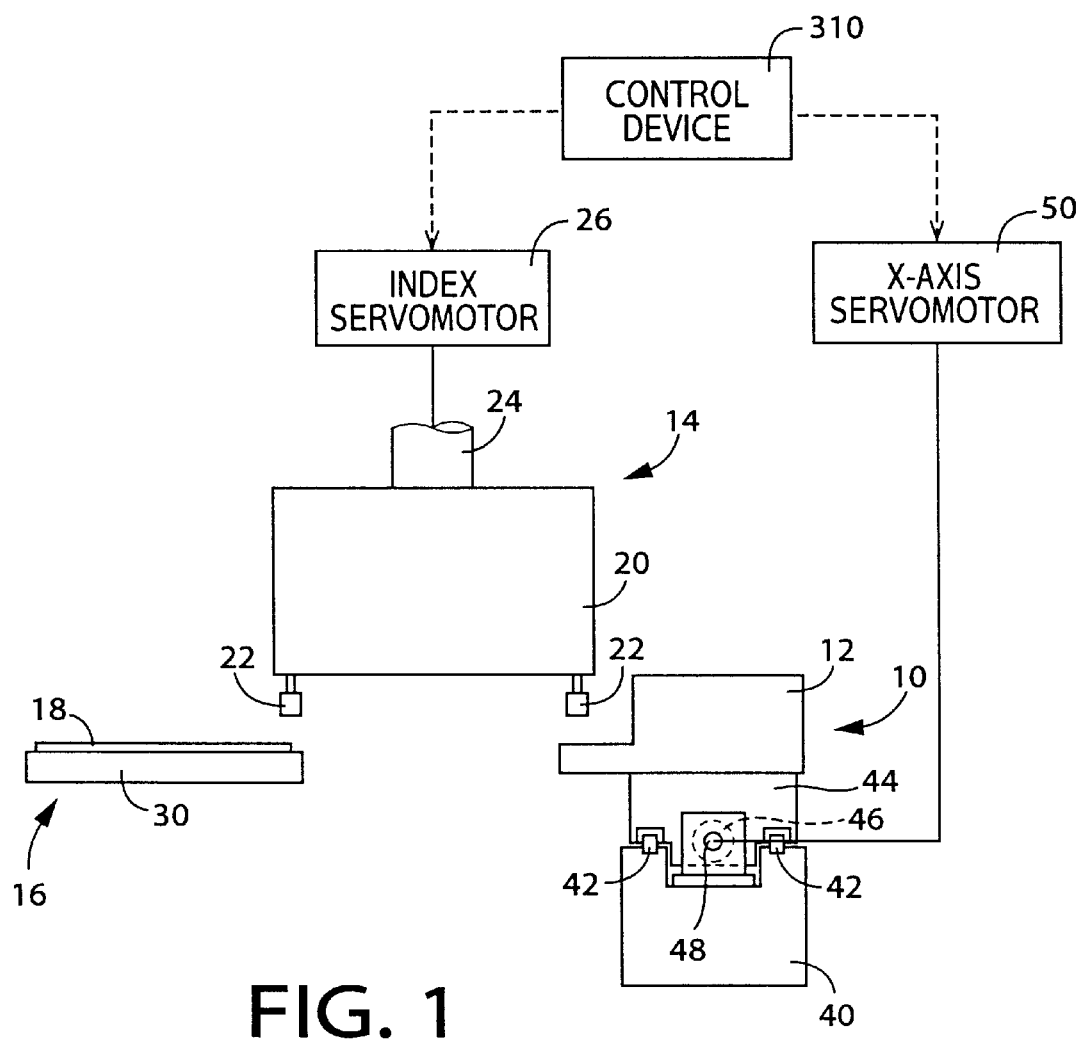
FIG. 1 is a schematic front elevation view of an an electric-component ("EC") mounting machine including an EC supplying system including an EC feeder which includes an EC arranging and supplying apparatus to which the present invention is applied.

In FIG. 1, reference numeral 10 designates an electric-component ("EC") supplying system which includes a plurality of EC feeders 12 (only one EC feeder 12 is shown in FIG. 1). Each of the EC feeders 12 supplies electric components ("ECs") to an EC mounting system 14 as a sort of EC taking-out system. The EC mounting system 14 mounts the ECs on a printed-wiring board ("PWB") 18 which is positioned and supported by a PWB positioning and supporting system 16. The EC supplying system 10, the EC mounting system 14, and the PWB positioning and supporting system 16 cooperate with one another to provide an EC mounting machine.

The EC mounting system 14 includes an index table 20 which is intermittently rotatable about a vertical axis line. The index table 20 has a plurality of (e.g., twelve) EC-suck heads 22 each as an EC holder (only two EC-suck heads 22 are shown in FIG. 1), and is intermittently rotated by an intermittently rotating device which is provided by a cam and a cam follower (both not shown), a rotary shaft 24, an index servomotor 26 which rotates the cam, etc., so that the twelve EC-suck heads 22 are sequentially moved to, and stopped at, an EC-suck position, an EC-posture-detect position, an EC-posture-correct position, an EC-mount position, etc. The EC-suck heads 22 are supported by the index table 20, such that each of the heads 22 can be elevated and lowered, and two elevating and lowering devices (not shown) each of which elevates and lowers each EC-suck head 22 are provided at the EC-suck position and the EC-mount position, respectively. The rotation of the index servomotor 26 is converted by a motion converting device which is provided by a cam and a cam follower (not shown), etc., into upward and downward movement of an elevator member (not shown), which causes each EC-suck head 22 to be elevated and lowered.

The PWB positioning and supporting system 16 includes a PWB-support table 30 which positions and supports the PWB 18. The PWB-support table 30 is provided on an X-Y table (not shown) which is movable in an X-axis direction (i.e., a direction perpendicular to the sheet of FIG. 1) and a Y-axis direction (a widthwise direction of the sheet of FIG. 1) which are perpendicular to each other on a horizontal plane. Thus, owing to the movement of the X-Y table, the PWB 18 is movable to an arbitrary position on the horizontal plane. The PWB 18 is conveyed, and carried in onto the PWB-support table 30, by a carry-in conveyor (not shown), and is carried out off the PWB-support table 30, and conveyed, by a carry-out conveyor (not shown), all in a direction parallel to the X-axis direction. When the ECs are mounted on the PWB 18, the PWB 18 is moved by the X-Y table, so that each of EC-mount locations on the PWB 18 is positioned right below the EC-suck head 22 being positioned at the EC-mount position and the EC held by the EC-suck head is mounted at the each EC-mount location on the PWB 18.

Next, the EC supplying system 10 will be described.

The EC supplying system 10 includes a base 40 on which a pair of guide rails 42 each as a guide member are provided to extend parallel to the X-axis direction and provide a guide device. An X-axis table 44 as a sort of movable table fits on the guide rails 42, such that the X-axis table 44 is movable in the X-axis direction. On the X-axis table 44, the above-indicated plurality of EC feeders 12 are provided in a state in which respective EC-supply portions of the EC feeders 12 are arranged along a reference line (in the present embodiment, a straight line parallel to the X-axis direction) and each of the EC feeders 12 feeds ECs in an EC-feed direction thereof parallel to the Y-axis direction. The EC-supply portion of each EC feeder 12 is a portion thereof from which ECs are supplied to the EC mounting system 14, and can also be said as an EC-take-out portion thereof from which the ECs are taken out by the EC mounting system 14.

A nut 46 is fixed to the X-axis table 44, and is threadedly engaged with a feed screw 48 which is provided on the base 40 such that the feed screw 48 is not movable relative to the base 40 in an axial direction of the screw 48 and is rotatable relative to the base 40 about an axis line of the screw 48 parallel to the X-axis direction. When the feed screw 48 is rotated by an X-axis servomotor 50, the X-axis table 44 is moved in the X-axis direction, so that the EC-supply portion of each of the EC feeders 12 is selectively positioned at a predetermined EC-supply position right below the EC-suck head 22 being positioned at the EC-mount position. The nut 46, the feed screw 48, and the X-axis servomotor 50 cooperate with one another to provide a table moving device 52. Each of the X-axis servomotor 50 and the above-mentioned index servomotor 26 is an electric motor as a sort of drive source that is accurately controllable with respect to rotation angle and rotation speed, and may be replaced with a stepper motor.

Next, each EC feeder 12 will be described.

Figure 2:
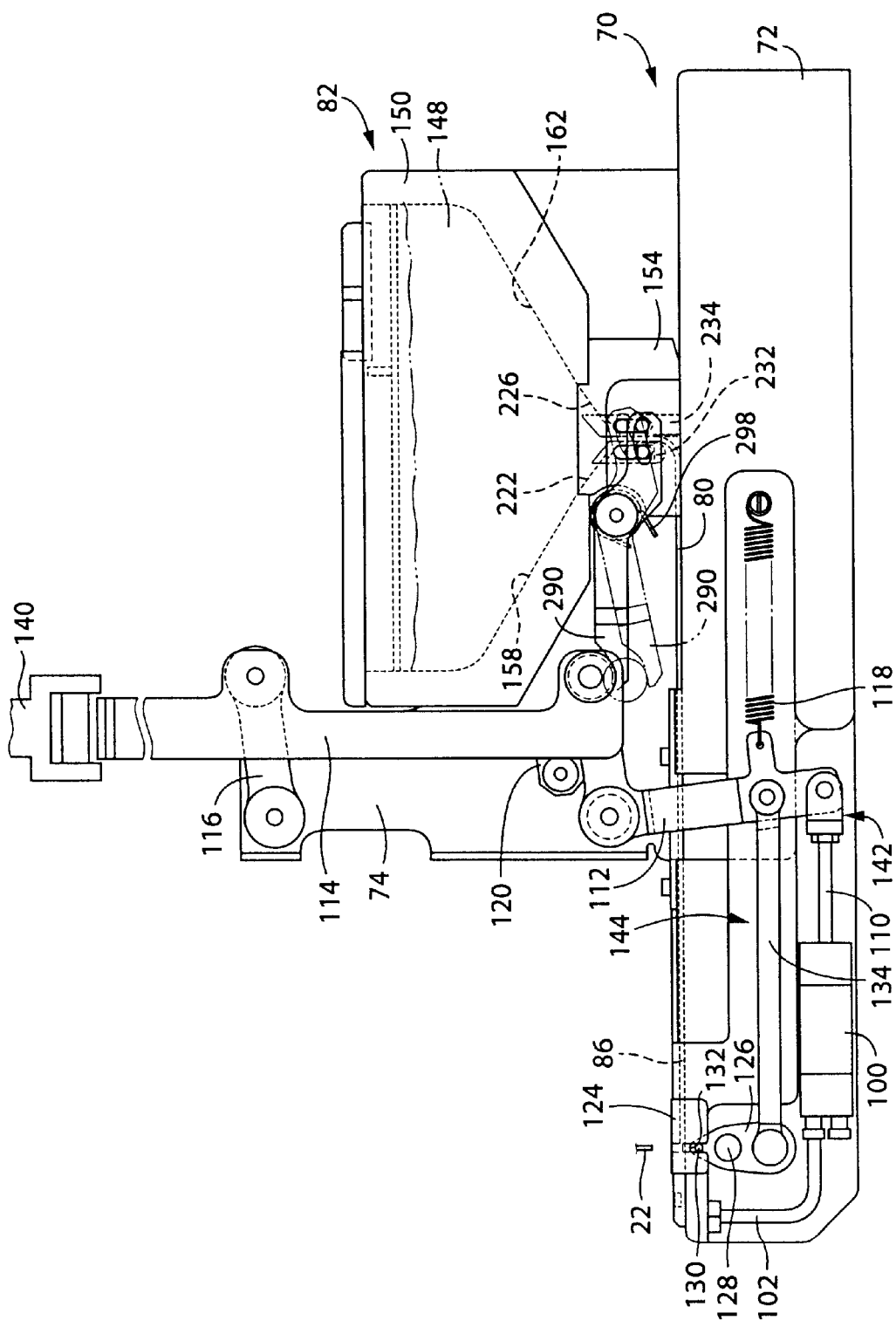
FIG. 2 is a front elevation view of the EC feeder.

As shown in FIG. 2, each EC feeder 12 includes a main frame 70 which is obtained by assembling, for easier production, a plurality of members including a first member 72, a second member 74, etc. The first and second members 72, 74 and other members that have been assembled with one another function as the integral main frame 70. The first member 72 has a generally elongate, plate-like shape. A lengthwise direction of the first member 72 is parallel to the Y-axis direction, and a widthwise direction of the same 72 that is perpendicular to both the EC-feed direction and a vertical direction is parallel to the X-axis direction. The plurality of EC feeders 12 take respective upright postures on the X-axis table 44, such that as described previously the respective EC-supply portions of the EC feeders 12 are arranged along one straight line parallel to the X-axis direction. The first member 72 is positioned, by a positioning device (not shown), relative to the X-axis table 44, in the lengthwise and widthwise directions of the first member 72, and is attached, by an engaging device (not shown), to the table 44 such that the first member 72 cannot be lifted up off the table 44. The EC feeder 12 can be removed or detached from the X-axis table 44, by disengaging the engaging device from the table 44 and thereby releasing the first member 72 from the same 44.

A chute 80 is provided on the main frame 70. The chute 80 starts at a rear portion of the main frame 70, i.e., a portion thereof which is remote from the EC mounting system 14 in the state in which the EC feeder 12 is attached to the X-axis table 44, and to which a hopper 82 is detachably attached, and ends at a front portion of the main frame 70 which is near to the EC mounting system 14. The chute 80 has a tubular shape, and is open at only each of opposite ends of the tube.

The hopper 82 accommodates, in bulk, a number of "leadless" ECs 84 each of which has no lead wires and has a generally rectangular-parallelopiped shape. Each leadless EC 84 is a sort of EC as an object to be supplied. Thus, each leadless EC 84 is a short prismatic object which has a rectangular transverse cross section. The chute 80 has a rectangular transverse cross section corresponding to that of each EC 84. The rectangle as the transverse cross section of the chute 80 has such dimensions which permit each EC 84 to move through the chute 80 but does not permit the same 84 to change its posture in the chute 80.

Each of the ECs 84 stored in the hopper 82 is moved to the front portion of the main frame 70 through the chute 80. One end portion of the chute 80 located on the side of the hopper 82 is an initial end portion of the same 80, and the other end portion of the same 80 located on the front portion of the main frame 70 is a terminal end portion of the same 80. The terminal end portion of the chute 80 provides a horizontal portion 86 which horizontally extends parallel to the lengthwise direction of the main frame 70 and which has, at its terminal end, an EC-take-out aperture 88 (FIG. 3) which opens upward. The EC-take-out aperture 88 is formed at a position on the main frame 70 that is positioned, when the EC feeder 12 is positioned at the EC-supply position, right below the EC-suck head 22 being positioned at the EC-suck position.

Figure 3:
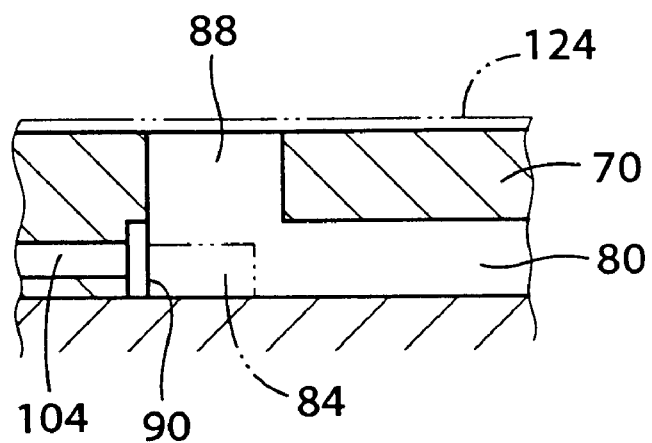
FIG. 3 is a front cross-section view of a terminal end portion of a chute of the EC feeder.

Each of the ECs 84 moved through the chute 80 is brought into contact with an end surface 90 which extends perpendicularly to a lengthwise direction of the chute 80 and defines the terminal end of the same 80, and accordingly is stopped by the end surface 90. As shown in FIG. 3, the end surface 90 is flush with one of two side-wall surfaces of the EC-take-out aperture 88 that are opposed to each other in the EC-feed direction, the one surface being a downstream-side surface as seen in the direction of movement of each EC 84 in the terminal end portion of the chute 80. Therefore, each EC 84 held in contact with the end surface 90 is positioned within the EC-take-out aperture 88. The EC-take-out portion of each EC feeder 12, i.e., the EC-supply portion thereof which supplies the ECs 84, includes the EC-take-out aperture 88. Thus, the end surface 90 provides a stopper, or a positioning device which positions, in the EC-supply portion, the ECs 84, one by one, which are moved in an array through the chute 80.

Figure 4:
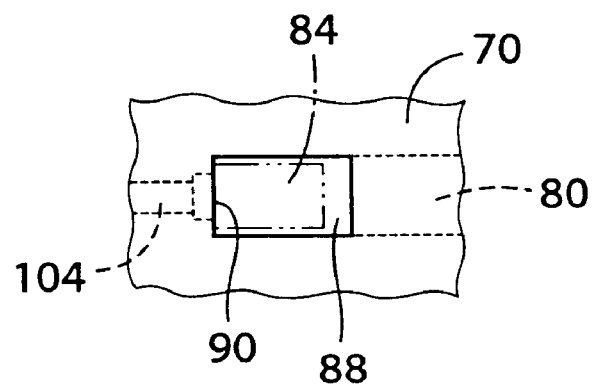
FIG. 4 is a plan view of the terminal end portion of the chute of the EC feeder.

Air in the chute 80 is sucked by a plunger pump 100 as a reciprocating pump, so that air flows in the chute 80. As shown in FIGS. 2 and 3, a suction inlet of the plunger pump 100 is connected to the chute 80 via a hose 102 as a connecting member, and a passage 104 formed in the main frame 70. As shown in FIGS. 3 and 4, the passage 104 has, in the end surface 90, an opening whose width is smaller than a width of each EC 84 and whose length is greater than a thickness of the same 84. Thus, the suction inlet of the plunger pump 100 is connected to the terminal end of the chute 80. A discharge outlet of the pump 100 is communicated with the atmosphere. The suction inlet and discharge outlet of the pump 100 are provided with a suction valve and a discharge valve, respectively.

As shown in FIG. 2, the plunger pump 100 has a rod 110 which is pivotally connected to one end portion of a drive lever 112 as a drive member that is attached to the main frame 70 such that the drive lever 112 is pivotable about an axis line parallel to the widthwise direction of the EC feeder 12. To the other end portion of the drive lever 112, a lower end portion of an elevator link 114 as a driven member is pivotally connected. An upper portion of the elevator link 114 is pivotally connected to a link 116 which is pivotally attached to the main frame 70. Thus, the elevator link 114 is attached to the main frame 70, such that the elevator link 114 is movable (in the present embodiment, movable up and down) relative to the main frame 70. The elevator link 114 provides a reciprocating member which reciprocates relative to the main frame 70. The drive lever 112 is biased, by a tension coil spring 118 as a sort of elastic member as a sort of biasing device, in a direction in which the elevator link 116 is moved upward. The pivotal movement of the drive lever 112 caused by the biasing action of the spring 118 is limited or stopped by butting of the lever 112 against a stopper 120 provided on the main frame 70. A position of the elevator link 116 when the drive lever 112 butts on the stopper 120 is an upper-dead position as a first position of the elevator link 116, and the spring 118 maintains the elevator link 114 at its upper-dead position.

The main frame 70 is provided with a shutter 124 which covers the EC-take-out aperture 88. The shutter 124 fits on the main frame 70, such that the shutter 124 is movable parallel to the lengthwise direction of the main frame 70 and the horizontal portion 86 of the chute 80, and such that the shutter 124 is movable to an operative position where the shutter 124 covers the aperture 88 and to an inoperative position where the shutter 124 opens the aperture 88. A drive plate 126 as a drive member is attached to the main frame 70 via an axis member 128, such that the drive plate 126 is pivotable about an axis line parallel to the widthwise direction of the EC feeder 12. The drive plate 126 includes a projection 130 which fits in a recess 132 formed in the shutter 124. One end portion of a link 134 is pivotally connected to the drive plate 126, and the other end portion of the link 134 is pivotally connected to the drive lever 112.

The elevator link 114 is driven by an elevator member 140 as a drive member that is provided at the EC-supply position. The elevator member 140 is provided at a position above the elevator link 114 of the EC feeder 12 whose EC-supply portion is positioned at the EC-supply position. Thus, the elevator member 140 is provided outside each EC feeder 12. The rotation of the index servomotor 26 as a drive source provided outside each EC feeder 12 is converted, by the motion converting device which is provided by the cam and the cam follower (not shown), etc., into the upward and downward movements of the elevator member 140. Thus, the elevator member 140 is moved upward and downward in relation with the upward and downward movements of each EC-suck head 22 to take out the EC 84 from the EC feeder 12.

When each EC-suck head 22 is moved downward to take out the EC 84 from the EC feeder 12, the elevator member 140 is moved downward concurrently with the downward movement of the EC-suck head 22, and engages the elevator link 114, thereby moving the same 114 downward. The downward movement of the elevator link 114 is allowed since the drive lever 112 is pivoted against the biasing force of the spring 118 and the spring 118 is extended. Thus, the elevator link 114 is moved from its upper-dead position to its lower-dead position as its second position. The lower-dead position of the elevator link 114 is defined by a lower-dead position of the elevator member 140. When the drive lever 112 is pivoted against the biasing action of the spring 118, the rod 110 is advanced, so that the discharge valve of the plunger pump 100 is opened and the air is discharged from the pump 100. In addition, the link 134 is moved and the drive plate 126 is pivoted in a backward direction (clockwise in FIG. 2), so that the shutter 124 is moved to its inoperative position to open the EC-take-out aperture 88. Thus, the shutter 124 allows the EC-suck head 22 to take out the EC 84.

After the EC-suck head 22 sucks the EC 84 and is elevated to take out the EC 84 from the EC feeder 12, the elevator member 140 is elevated, and the elevator link 114 follows the elevator member 114 owing to the rotation of the drive lever 112 caused by the biasing action of the spring 118. Accordingly, the rod 110 is moved backward, the suction valve of the plunger pump 100 is opened to suck the air in the chute 80, and the drive plate 126 is pivoted in a forward direction (counterclockwise in FIG. 2), so that the shutter 124 is moved forward to its operative position to cover the EC-take-out aperture 88. The suction valve of the plunger pump 100 is designed such that after the rod 110 starts moving backward, the suction valve is opened to suck the air. Thus, when the shutter 124 covers the EC-take-out aperture 88, the air in the chute 80 is sucked, and the air flows in a direction from the hopper 82 toward the aperture 88. Therefore, the ECs 84 in the chute 80 are moved toward the terminal end of the chute 80, i.e., the EC-supply portion of the EC feeder 12, so that one EC 84 butts on, and is stopped by, the end surface 90, and is positioned in the aperture 88. The suction valve of the plunger pump 100 is closed at a timing around the time when the rod 110 is stopped. In the present embodiment, the drive lever 112 which is provided between the elevator link 114 and the plunger pump 100, provides a plunger-pump driving device 142 as a negative-pressure-producing-device driving device that drives, owing to the movement of the elevator link 114 between its upper-dead and lower-dead positions, the plunger pump 100 as a negative-pressure producing device. The drive lever 112, drive plate 126, and link 134 which are provided between the elevator link 114 and the shutter 124, cooperate with one another to provide a shutter driving device which converts the movement of the elevator link 114 between its upper-dead and lower-dead position, into the movement of the shutter 124 between its operative and inoperative positions.

Figure 5:
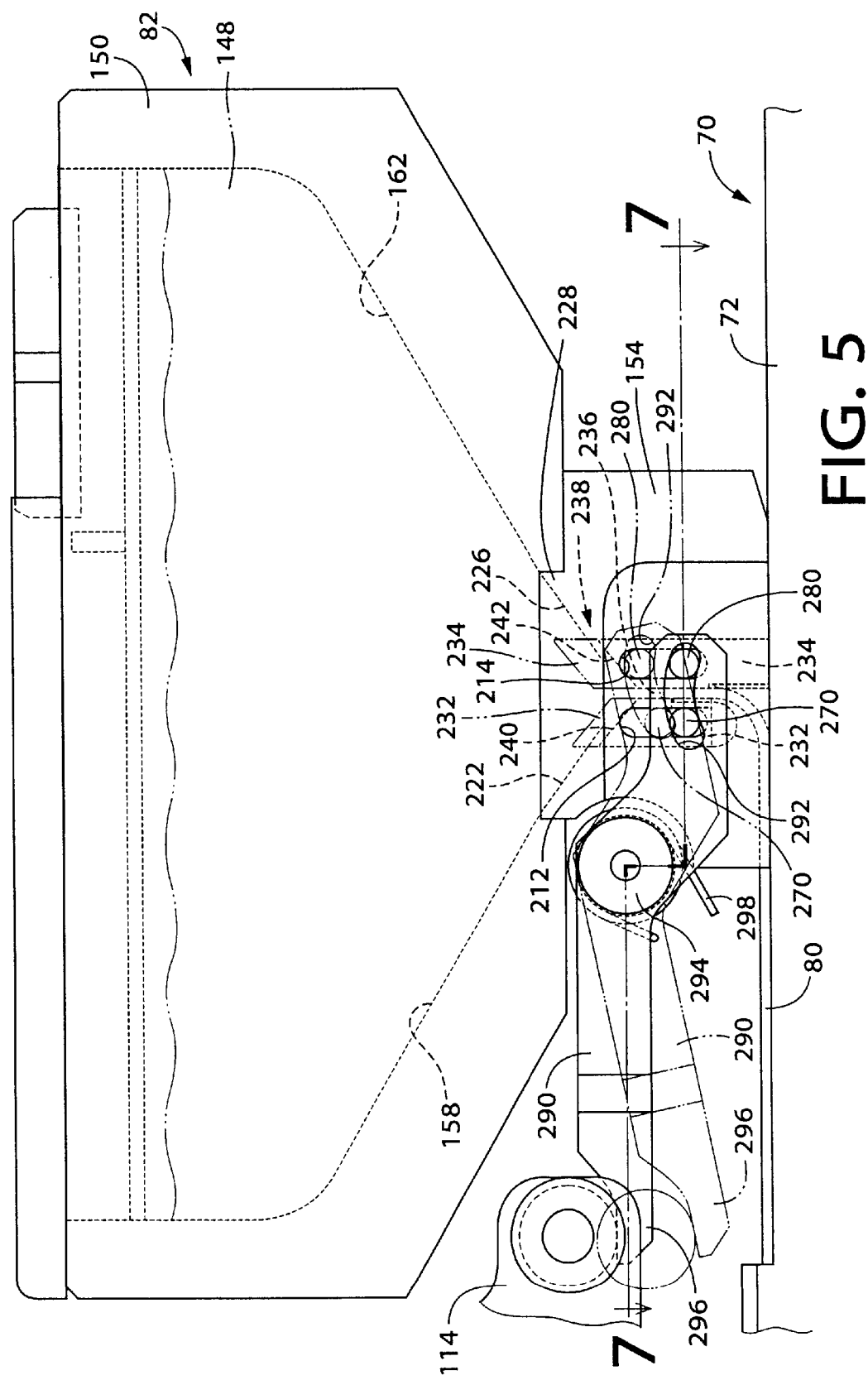
FIG. 5 is a front view of a hopper, a guide, and an initial end portion of the chute of the EC feeder.
Figure 6:
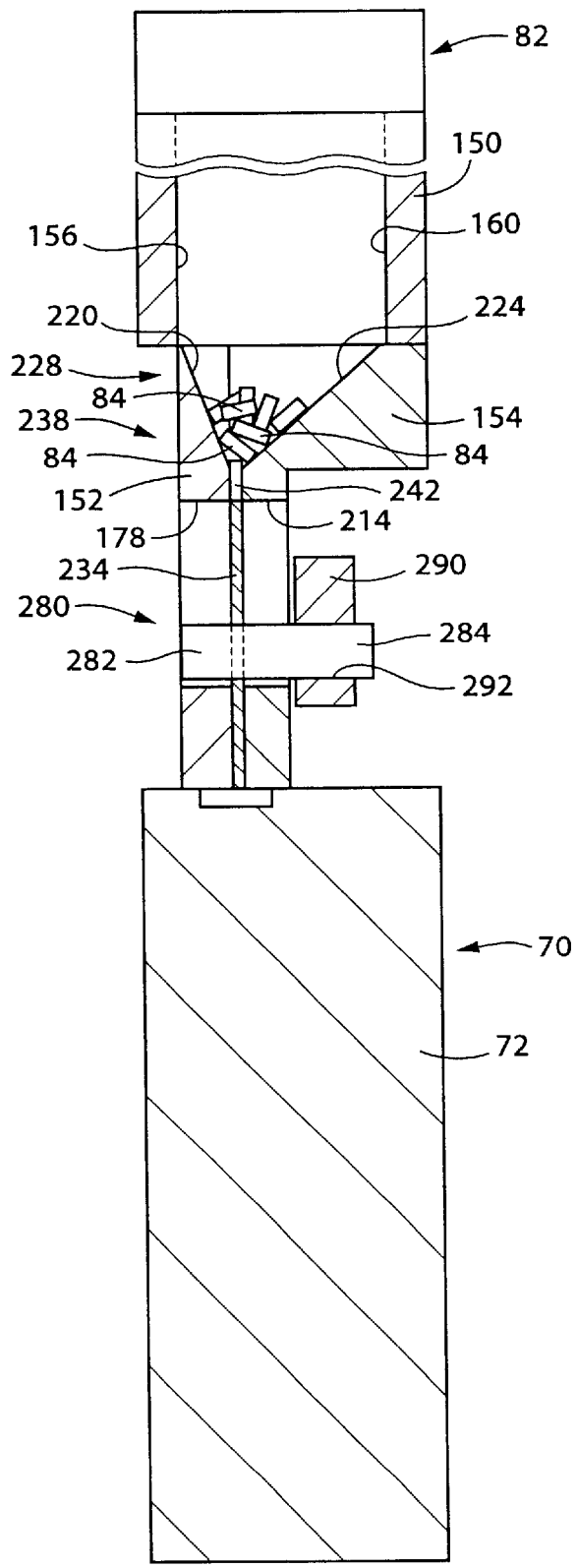
FIG. 6 is a side cross-section view of the EC feeder, taken along a vertical plane passing through a second movable guide plate.

As shown in FIGS. 5 and 6, the hopper 82 are produced by assembling a first member 150, a second member 152, and a third member 154, and the first, second, and third members 150, 152, 154 that have been assembled with one another function as the integral hopper 82. The hopper 82 accommodates a number of ECs 84 therein. The ECs 84 are accumulated in the hopper 82 such that each EC 84 takes an arbitrary posture, and the ECs 84 accumulated in the hopper 82 provide a EC layer 148. The first member 150 has a frame-like member which has a rectangular cross section taken along a horizontal plane, and a lengthwise direction of the first member 150 is parallel to the lengthwise direction of the EC feeder 12. The first member 150 has four inner side surfaces 156, 158, 160, 162, and two surfaces 158, 162 of those four surfaces that are distant from each other in the lengthwise direction of the hopper 82 or the feeder 12 have respective lower portions which are inclined toward each other as those two surfaces extend downward, as shown in FIG. 5. The respective inclined lower portions of the two surfaces 158, 162 contain an obtuse angle.

Figure 8:
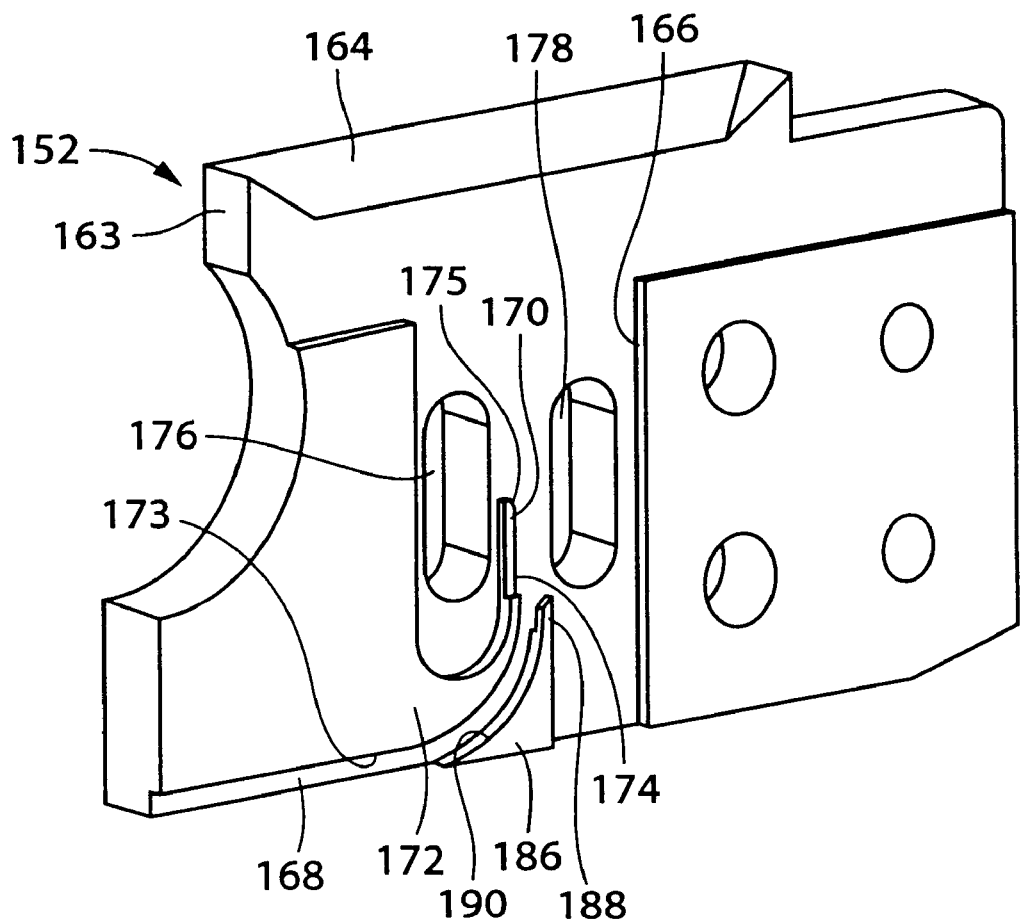
FIG. 8 is a perspective view of a second member of the EC feeder that provides the hopper and the guide.

The second and third members 152, 154 are provided at a lower end of the first member 150. As shown in FIG. 8, the second member 152 has a plate-like shape, and includes a projecting portion 163 projecting from an upper surface thereof. The second member 152 has a recess 164 which opens in an upper surface of the projecting portion 163 and a side surface of the second member 152 that is to be assembled with the third member 154 and which has a rectangular cross section taken along a horizontal plane. The recess 164 is defined by three planes which are inclined toward one another as those three planes extend downward.

The second member 152 additionally has a recess 166 which opens in the side surface of the member 152 in which the recess 164 opens, extends vertically, and reaches the recess 164; and a chute-forming groove 168 which opens both in the side surface of the member 152 in which the recess 166 opens and in a lower surface of the same 152. The chute-forming groove 168 extends parallel to the lengthwise direction of the second member 152, and includes, on the side of the recess 166, an end portion which is curved to extend vertically and open in an intermediate portion of the recess 166 in a widthwise direction thereof parallel to the lengthwise direction of the second member 152.

Figure 10:
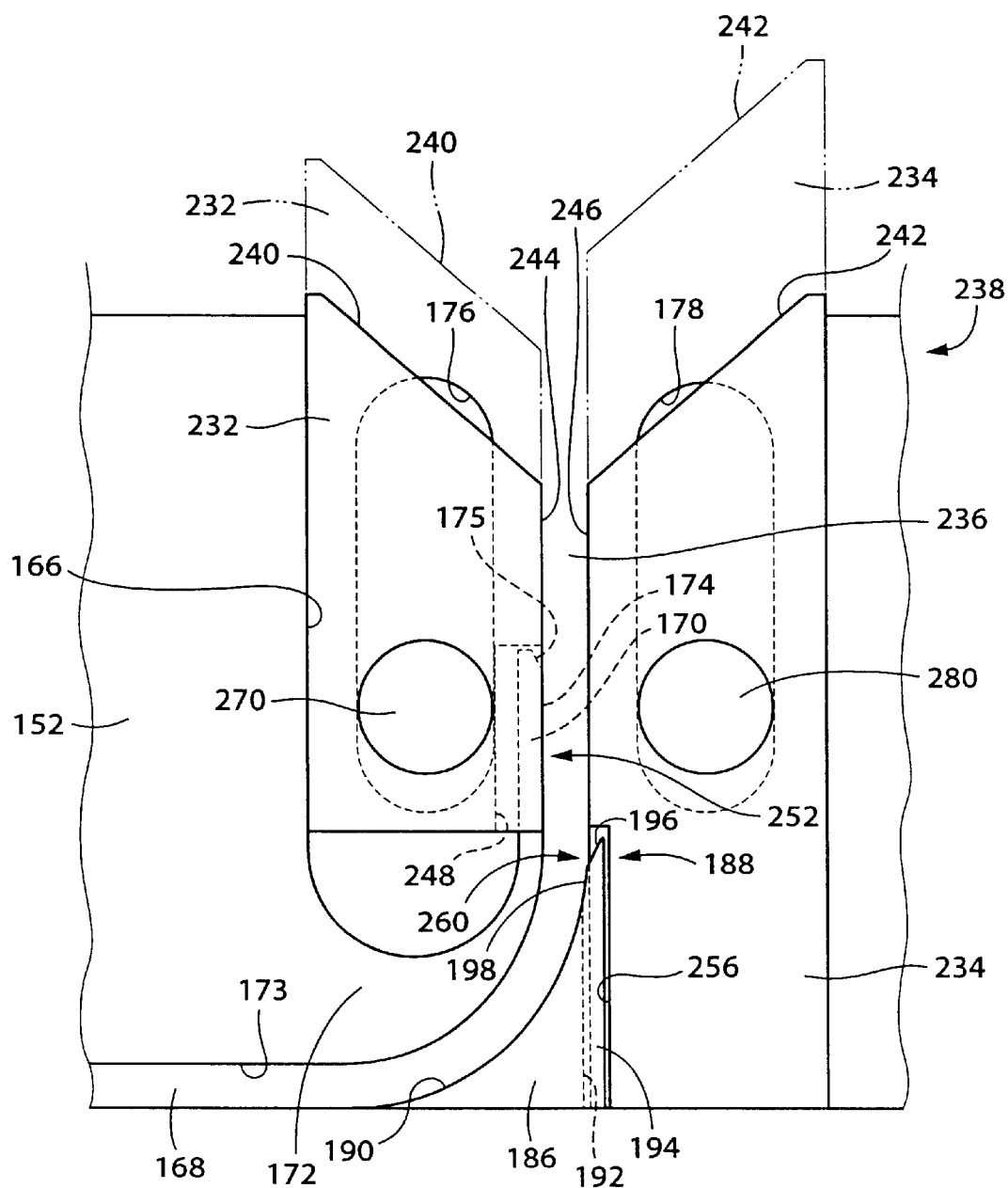
FIG. 10 is a front elevation view showing a state in which a first movable guide plate and the second movable guide plate are fitted in the second member.
Figure 11:
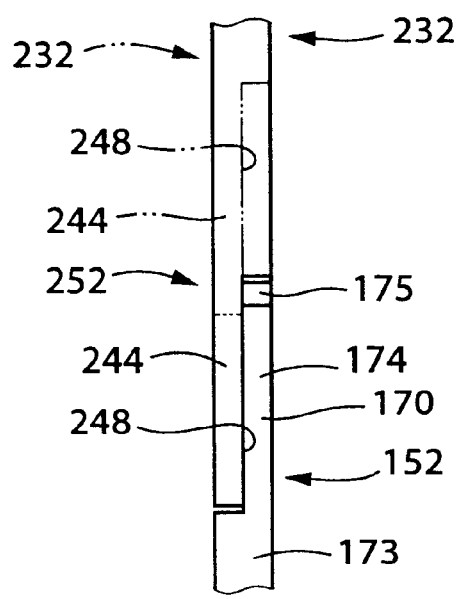
FIG. 11 is a side elevation view showing a state in which the first movable guide plate is fitted on a ridge of the second member.

The second member 152 has a ridge 170 formed in the intermediate portion of the recess 166 in its widthwise direction. As shown in FIG. 11, the ridge 170 has a thickness that is smaller than a depth of the recess 166 (in the present embodiment, half the depth), extends upward from a upper wall 172 which defines the chute-forming groove 168, and reaches an intermediate portion of the recess 166 in a lengthwise (i.e., vertical) direction thereof. A side surface of the ridge 170 provides a guide surface 174 which is continuous with an upper side surface 173 of the chute-forming groove 168. As shown in FIGS. 8 and 10, the guide surface 174 includes, in an upper end portion thereof, an inclined surface 175 which is inclined in a direction away from a remaining portion of the guide surface 174 as the surface 175 extends upward. The second member 152 additionally has two elongate holes 176, 178 which are formed in the recess 166, and are located on both sides of the ridge 170 in the lengthwise direction of the member 152, and each extend vertically.

As shown in FIG. 10, the second member 152 has a scraper 188 which is provided by a lower wall 186 which defines the curved portion of the chute-forming groove 168. A lower side surface 190 which is defined by the lower wall 186 is so curved as to contact a vertical plane. The lower wall 186 has an end surface 192 which extends vertically, and a projecting portion 194 projects from the end surface 192 in a direction away from the chute-forming groove 168. The projecting portion 194 has a thickness that is half that of the lower wall 186, i.e., half the depth of the recess 166. The projecting portion 194 has, in an upper end portion thereof, a guide surface 196 which is continuous with an upper end portion of the lower side surface 190 and is inclined in a direction away from the side surface 190 as the guide surface 196 extends upward. The upper end portion of the lower side surface 190 provides a scoop surface 198 which is so curved or inclined as to be away from a vertical plane as the scoop surface 198 extends downward. Thus, the respective portions of the lower wall 186 and the projecting portion 194 that provide the scoop surface 198 and the guide surface 196, respectively, cooperate with each other to provide the scraper 188.

Figure 9:
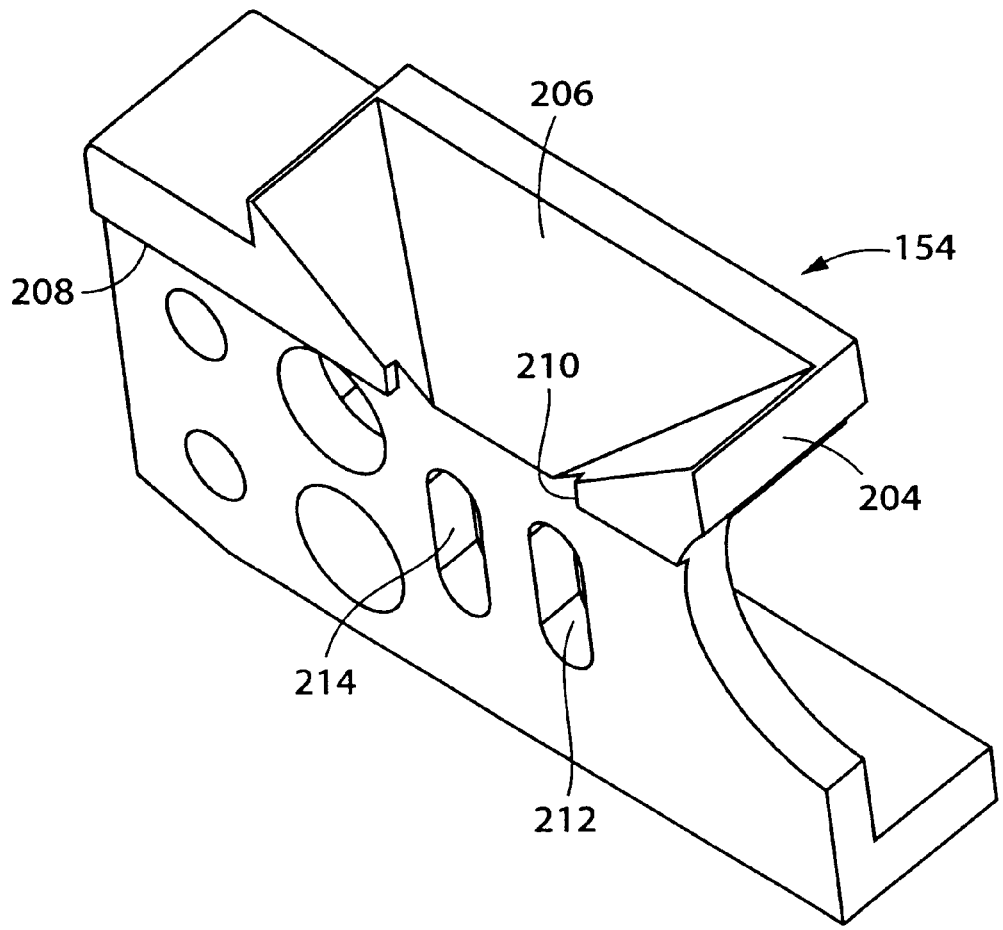
FIG. 9 is a perspective view of a third member of the EC feeder that cooperates with the second member to provide the hopper and the guide.

As shown in FIG. 9, the third member 154 has a block-like shape, and includes a projecting portion 204 which projects upward from an intermediate portion of an upper surface thereof in a lengthwise direction thereof. The third member 154 has a recess 206 which opens in an upper surface of the projecting portion 204 and in a side surface of the member 154 that is to be assembled with the second member 152 and which has a rectangular cross section taken along a horizontal plane. The recess 206 is defined by three planes which are inclined toward one another as those planes extend downward. The third member 154 additionally has a recess 208 which has the same depth as that of the recess 166 formed in the second member 152, and a recess 210 which has the same depth as that of the recess 166, extends vertically, and opens in the recess 206. Moreover, the third member 154 has two elongate holes 212, 214 which are arranged in a lengthwise direction of the member 154 and each of which extends vertically.

The second and third members 152, 154 are vertically positioned relative to each other in a state in which two upward facing surfaces of the second member 152 located on both sides of the recess 166 support two downward facing surfaces of the third member 154 that define the recess 208 and are located on both sides of the recess 208. Respective side surfaces of the recess 166 are aligned with respective side surfaces of the recess 210, and the lower end of the first member 150 is fitted on, and fixed to, the respective projecting portions 163, 204 of the second and third members 152, 154 thus assembled with each other. Thus, as shown in FIGS. 5 and 6, the second and third members 152, 154 provide four inclined surfaces 220, 222, 224, 226 which are continuous with the inner side surfaces 156, 158, 160, 162 of the first member 150, respectively, and which are inclined toward one another as those inclined surfaces extend downward. In the present embodiment, respective upper portions of the inclined surfaces 220, 222, 224, 226 that are located on the side of the first member 150 cooperate with one another to provide a bottom surface of the hopper 82; and respective portions of the second and third members 152, 154 cooperate with each other to provide a bottom portion 228 of the hopper 228 which has a funnel-like shape.

As shown in FIG. 6, two surfaces 220, 224 of the four inclined surfaces 220, 222, 224, 226 that are distant from each other in a direction parallel to the widthwise direction of the hopper 82 or the EC feeder 12 are inclined such that the two inclined surfaces 220, 224 contain an acute angle. The remaining two inclined surfaces 222, 226 that are distant from each other in the lengthwise direction of the hopper 82 are inclined, relative to a horizontal plane, by respective angles which are somewhat greater than those of the respective lower portions of the corresponding side surfaces 222, 226 of the first member 150 that are distant from each other in the lengthwise direction of the member 150, and the two inclined surfaces 222, 226 contain an obtuse angle.

Figure 13:
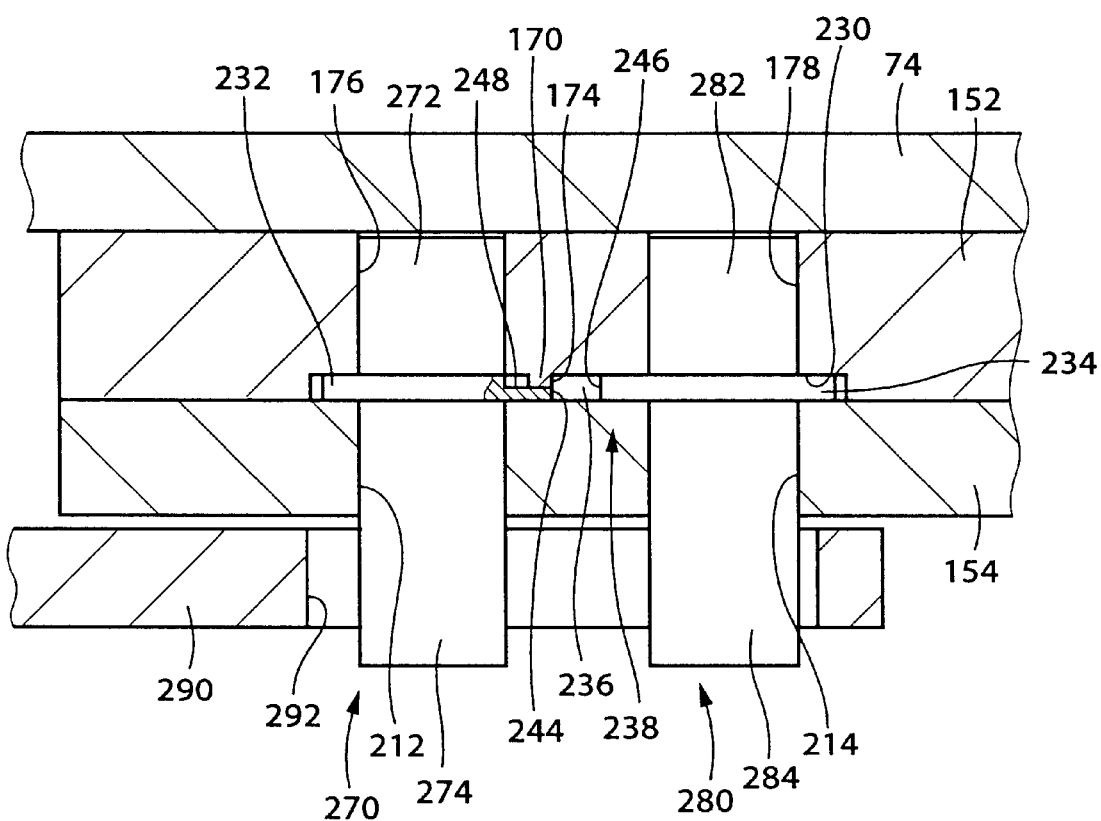
FIG. 13 is a partly cross-sectioned, plan view of a guide hole which is defined by the second and third members and the first and second movable guide plates.

As shown in FIG. 13, the second and third members 152, 154 assembled with each other cooperate with each other to define a movable-guide-plate-fit hole 230 as a movable-guide-member-fit hole that opens in a space defined by the above-described four inclined surfaces 220, 222, 224, 226 and extends vertically. A first movable glide plate 232 as a first movable guide member and a second movable guide plate 234 as a second movable guide member are fitted in the movable-guide-plate-fit hole 230, such that each of the guide plates 232, 234 is vertically movable. Thus, the second and third members 152, 154 and the first and second movable guide plates 232, 234 cooperate with one another to define a guide hole 236 which has a rectangular transverse cross section taken along a horizontal plane and extends vertically. The guide hole 236 can be called as a guide passage. The guide hole 236 is defined such that the two long sides of the rectangular cross section of the hole 236 are parallel to the lengthwise direction of the EC feeder 12. The second and third members 152, 154 define the two long sides of the rectangular cross section, respectively, which corresponds to that of the chute 80; and the two guide plates 232, 234 define the two short sides of the rectangular cross section, respectively. The four members 152, 154, 232, 234 which defines the four sides of the rectangular cross section cooperate with one another to provide a guide 238. Thus, the second and third members 152, 154 cooperate with each other to provide not only the bottom portion 228 of the hopper 82 but also the guide 238. In addition, the two members 232, 234 of the four members 152, 154, 232, 234 which cooperate with one another to provide the guide 238, are opposed to each other and are movable in an axial direction of the guide hole 236, i.e., a vertical direction. The remaining two members 152, 154 provide two stationary guide members, respectively, or two stationary guide-holding members, respectively.

As shown in FIG. 5, the first movable guide plate 232 has an inclined upper surface 240 which is inclined, with respect to a horizontal plane, by an angle slightly greater than that of the corresponding inclined surface 222 and has the same orientation as that of the surface 222. Similarly, the second movable guide plate 234 has an inclined upper surface 242 which is inclined, with respect to a horizontal plane, by an angle slightly greater than that of the corresponding inclined surface 226 and has the same orientation as that of the surface 226. Respective lower portions of the four inclined surfaces 220, 222, 224, 226 that are located on the side of the two movable guide plates 232, 234 cooperate with the inclined upper surfaces 240, 242 of the two guide plates 232, 234 to provide an upper surface of the guide 238. Thus, the bottom surface of the hopper 82 is continuous with a portion of the upper surface of the guide 238, and an upper end portion of the guide hole 236 that is located on the side of the hopper 82 has a funnel-like shape whose cross section increases in an upward direction.

In the state in which the second and third members 152, 154 are assembled with each other, an opening of the chute-forming groove 168 is closed by the third member 154, and an initial end portion of the chute 80 as one end portion thereof is provided. Thus, the second and third members 152, 154 cooperate with each other to define the chute 80 as well. In the state in which the two movable guide plates 232, 234 are fitted in the fit hole 230, a guide surface 244 of the first guide plate 232 that defines a first side surface of the guide hole 236 and vertically extends, is flush, as shown in FIGS. 10, 11, and 13, with the guide surface 174 of the ridge 170, on a common plane. In addition, a guide surface 246 of the second guide plate 234 that defines a second side surface of the guide hole 236 and vertically extends, contacts the lower side surface 190 of the lower wall 186. The second and third members 152, 154 define a third and a fourth side surface of the guide hole 236, respectively. Thus, respective portions of the four members 152, 154, 232, 234 cooperate with one another to provide the initial end portion of the chute 80 that vertically extends and is connected to the guide hole 236. The hopper 82 is provided on the side of the initial end portion of the chute 80, and the guide 238 is provided between the lowermost end portion of the hopper 82 and the uppermost end portion of the chute 80, and introduces the ECs 84 from the hopper 82 into the chute 80. Minimum dimensions of the guide hole 236 defined by the guide 238, that is, dimensions of a portion of the hole 236 that is continuous with the four inclined surfaces 240, 242, 220, 224 and is defined by the four vertical surfaces (i.e., the two guide surfaces 244, 246 and the respective vertical surfaces of the second and third members 152, 154) are substantially equal to those of the rectangular cross section of a passage defined by the chute 80. This portion will be referred to as the "narrowest" portion of the guide hole 236.

An opening of a portion of the chute-forming groove 168 that extends parallel to the lengthwise direction of the second member 152 is closed by the third member 154 to provide a horizontally extending portion of the chute 80 that is, as shown in FIG. 2, connected to the horizontal portion 86 of the chute 80. The ECs 84 enter, one by one, the guide hole 236 and then the chute 80, while taking a posture in which the lengthwise direction of each EC 84 is vertical, so that the chute 80 causes the ECs 84 to be arranged in an array and moved to the EC-supply portion of the EC feeder 12. The chute 80 is twisted by 90 degrees between its vertical, initial end portion and its horizontal, terminal end portion. Therefore, the vertical, initial end portion of the chute 80 that is connected to the guide hole 236 has an angular phase identical with that of the rectangular cross section of the guide hole 236, that is, the two long sides of the rectangular cross section of the vertical portion are parallel to the lengthwise direction of the EC feeder 12 and the two short sides of the same are parallel to the widthwise direction of the feeder 12. On the other hand, the two long sides of the rectangular cross section of the horizontal, terminal end portion of the chute 80 are parallel to the widthwise direction of the feeder 12 and the two short sides of the same are vertical. Thus, each EC 84 is moved while taking a posture capable of being sucked and held by the EC-suck head 22. Hereinafter, a direction parallel to the two long sides of the rectangular cross section of the chute 80 will be referred to as the widthwise direction of the chute 80, and a direction parallel to the two short sides of the same will be referred to as the thicknesswise direction of the chute 80, with respect to all portions of the chute 80 that include the vertical and horizontal end portions.

As shown in FIGS. 10 and 11, the first movable guide plate 232 has a recess 248, and is fitted in a left half portion of the recess 166 of the second member 152, such that the recess 248 is vertically movable relative to the ridge 170 of the second member 152. As described previously, the thickness of the ridge 170 is half the depth of the recess 166 and half the thickness of the first guide plate 232, and a depth of the recess 248 is, as shown in FIG. 11, half the thickness of the guide plate 232. In the state in which the first movable guide plate 232 is fitted in the movable-guide-plate-fit hole 230, the guide surface 244 should be flush with the guide surface 174 of the ridge 170. Owing to dimensional errors, the guide surface 174 may not be strictly flush with the guide surface 244, at a position somewhat away from the guide hole 236. This error is, however, allowed. Since the inclined surface 175 which is formed at the upper end of the guide surface 174 such that the surface 175 is inclined in a direction away from the guide surface 174 as the surface 175 extends upward, functions as a guide surface which guides the movement of each EC 84, each EC 84 can be moved without any problems even though the guide surface 174 may be located at a position somewhat deviated toward the guide hole 236.

As indicated at two-dot chain line in FIG. 11, the ridge 170 and the recess 248 have respective vertical lengths which assure that even in a state in which the first guide plate 232 is positioned at its upper-dead position, the plate 232 is not completely separated from the ridge 170 in a vertical direction. Therefore, even in the state in which the guide plate 232 is positioned at its upper-dead position, the two guide surfaces 244, 174 partly overlap each other in the vertical direction, that is, are not completely separated from each other. Thus, the first guide plate 232 and the ridge 170 cooperate with each other to provide one side surface of the initial end portion of the chute 80, and one end portion of the guide plate 232 that is located on the side of the chute 80 is fitted on the ridge 170 such that irrespective of which position may be taken by the guide plate 232, the above-indicated one side surface of the initial end portion of the chute 80 is continuous in the lengthwise direction of the chute 80.

When the first guide plate 232 is moved upward, a portion of the guide plate 232 is disengaged from the ridge 170, and a portion of the ridge 170 is disengaged from the guide plate 232, so that the above-indicated one side surface of the initial end portion of the chute 80 is continuous only partly through those disengaged portions of the plate 232 and the ridge 170, in the lengthwise direction of the chute 80, and is continuous fully through respective portions of the plate 232 and the ridge 170 that remain engaged with each other. In addition, the depth of the recess 248 (i.e., the dimension of the recess 248 in the thicknesswise direction of the guide plate 232) and the thickness of the ridge 170 are smaller than the thickness of the guide plate 232 (in the present embodiment, half the thickness of the plate 232), and substantially half the length of the short sides of the rectangular transverse cross section of each EC 84. Therefore, a thickness of each of two small spaces produced when the guide plate 232 is partly disengaged from the ridge 170 is smaller than a dimension of the above-indicated one side surface of the initial end portion of the chute 80 that is parallel to the thicknesswise direction of the chute 80 (in the present embodiment, substantially half the above-indicated dimension of the one side surface). Thus, each EC 84 cannot enter each of the above-indicated small spaces, with respect to both the lengthwise and thicknesswise directions of the chute 80. Thus, each EC 84 can enter the chute 80 while being guided by the guide surfaces 244, 174. That is, a connection portion 252 which has an inner side surface completely continuous in the vertical direction as the lengthwise direction of the initial end portion of the chute 80, is provided between one end portion of the guide hole 236 that is located on the side of the chute 80, and the initial end portion of the chute 80. The connection portion 252 may be called as the transitional portion where the chute 80 starts guiding each EC 84 which has been guided so far by the guide hole 236.

The connection or transitional portion 252 includes the recess 248 as a fitting recessed portion of the first guide plate 232 that extends parallel to a direction of movement of the plate 232, and the ridge 170 as a fitting projecting portion of the second member 152 that extends parallel to the direction of movement of the plate 232. However, it can be said that a portion of the first guide plate 232 that defines the recess 248 provides a fitting projecting portion and a recess of the second member 152 that reduces the thickness of the ridge 170 provides a fitting recessed portion. In the latter case, the first guide plate 232 includes the fitting projecting portion and the second member 152 includes the fitting recessed portion. This is also true with a connection or transitional portion 260 which will be described below.

Figure 12:
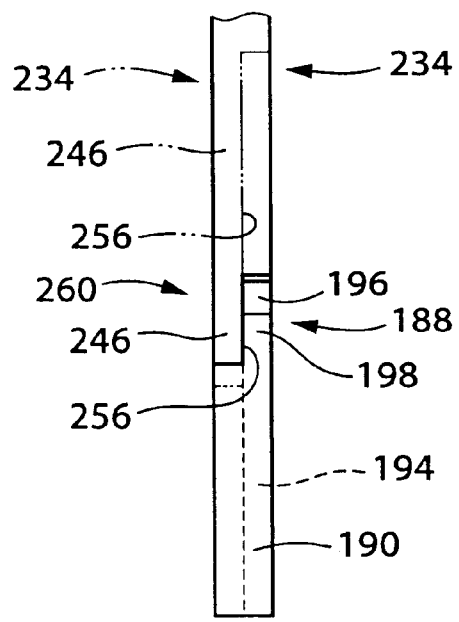
FIG. 12 is a side elevation view showing a state in which the second movable guide plate is fitted on a projecting portion of the second member.

As shown in FIG. 10, the second movable guide plate 234 has a recess 256, and is fitted in a right half portion of the recess 166 such that the guide plate 234 is vertically movable relative to the projecting portion 194 which provides the scraper 188. The thickness of the projecting portion 194 is half the depth of the recess 166, and a depth of the recess 256 is, as shown in FIG. 12, half the thickness of the guide plate 234. In the state in which the second movable guide plate 234 is fitted in the movable-guide-plate-fit hole 230, the guide surface 246 of the guide plate 234 that defines another side surface of the guide hole 236 and extend vertically should contact the curved side surface 190 of the lower wall 186. Owing to dimensional errors, the scoop surface 198 provided at the upper end of the side surface 190 may not be strictly flush with the guide surface 246, at a position somewhat away from the guide hole 236. This error is, however, allowed. Since the inclined guide surface 196 which is adjacent to the upper end of the scoop surface 198 and is inclined in a direction away from the scoop surface 198 as the surface 196 extends upward, guides the movement of each EC 84, each EC 84 can be moved without any problems even though the scoop surface 198 may be located at a position somewhat deviated toward the guide hole 236.

As indicated at two-dot chain line in FIG. 12, the projecting portion 194 and the recess 256 have respective vertical lengths which assure that even in a state in which the second guide plate 234 is positioned at its upper-dead position, the plate 234 is not completely separated from the projecting portion 194 (or the scraper 188) in a vertical direction. Therefore, even in the state in which the guide plate 234 is positioned at its upper-dead position, the two guide surfaces 246, 190 partly overlap each other in the vertical direction, that is, are not completely separated from each other. Thus, the second guide plate 234 and the lower wall 186 cooperate with each other to provide the second side surface of the initial end portion of the chute 80, and one end portion of the guide plate 234 that is located on the side of the chute 80 is fitted on the projecting portion 194, such that irrespective of which position may be taken by the guide plate 234, the second side surface of the initial end portion of the chute 80 is continuous in the lengthwise direction of the chute 80. In addition, the depth of the recess 256 and the thickness of the projecting portion 194 are smaller than the thickness of the guide plate 234 (in the present embodiment, half the thickness of the plate 234), and substantially half the length of the short sides of the rectangular transverse cross section of each EC 84. Therefore, a thickness of each of two small spaces produced when the guide plate 234 is partly disengaged from the projecting portion 194 is smaller than a dimension of the second side surface of the initial end portion of the chute 80 that is parallel to the thicknesswise direction of the chute 80 (in the present embodiment, substantially half the above-indicated dimension of the second side surface). Thus, each EC 84 cannot enter each of the above-indicated small spaces, with respect to both the lengthwise and thicknesswise directions of the chute 80. Thus, each EC 84 can enter the chute 80 while being guided by the guide surface 246 and the side surface 190. That is, a connection or transitional portion 260 which has, like the connection portion 252, an inner side surface completely continuous in the vertical direction, is provided between the one end portion of the guide hole 236 that is located on the side of the chute 80, and the initial end portion of the chute 80. The connection portions 252, 260 can be said as the terminal end portion of the guide hole 236 and the initial end portion of the chute 80.

Figure 7:
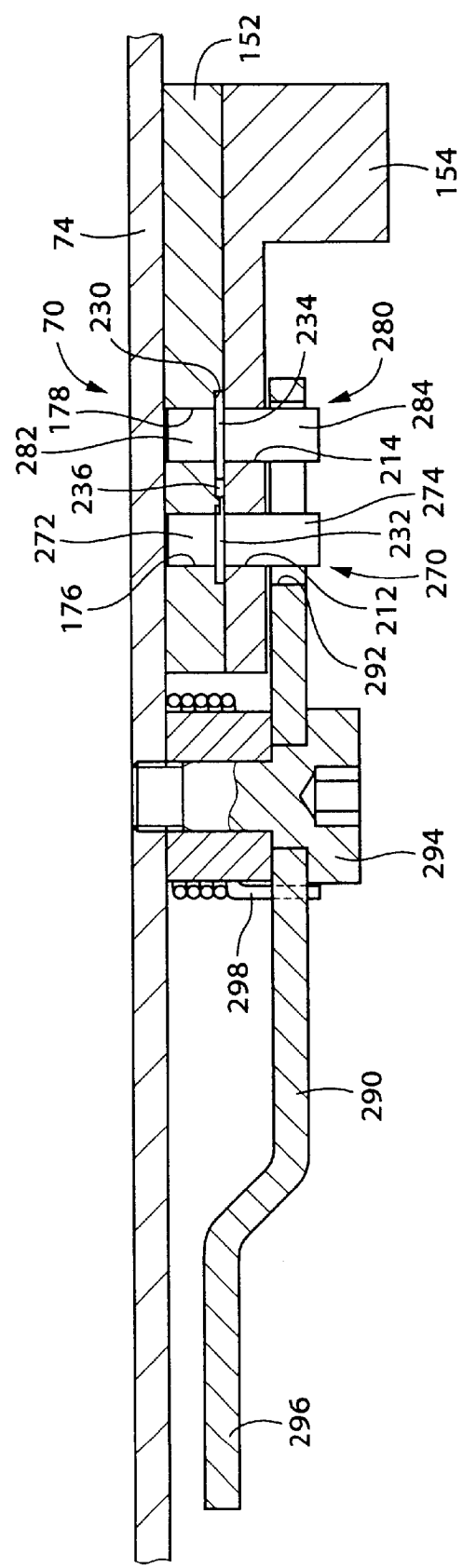
FIG. 7 is a plan cross-section view of the EC feeder, taken along horizontal planes indicated at 7—7 in FIG. 5.

As shown in FIG. 7, an engage pin 270 is fitted in, and fixed to, the first movable guide plate 232, such that the pin 270 extends perpendicularly to the direction of movement of the guide plate 232, and parallel to the widthwise direction of the EC feeder 12. Opposite end portions of the engage pin 270 project from opposite surfaces of the guide plate 232, respectively, so as to provide engage portions 272, 274. The engage portions 272, 274 are fitted in the respective elongate holes 176, 212 of the second and third members 152, 154, respectively, such that the engage portions 272, 274 are movable relative to the elongate holes 176, 212 in a vertical. direction as the lengthwise direction of the holes 176, 212. The engage portions 272, 274 and the elongate holes 176, 212 cooperate with each other to guide the movement of the first guide plate 232 in the vertical direction, i.e., in the lengthwise direction of the guide plate 232. The movement of the guide plate 232 in the widthwise direction thereof is inhibited by the engagement of the engage portions 272, 274 with the inner side surfaces of the elongate holes 176, 212, and the rotation of the guide plate 232 about an axis line parallel to the widthwise direction thereof is inhibited by the engagement of the guide plate 232 with an inner side surface of the fit hole 230. Thus, the engage portions 272, 274 and the elongate holes 176, 212 cooperate with each other to provide a movement limiting device which limits the movement of the first movable guide plate 232, or a guiding device which guides the movement of the same 232, and the fit hole 230 provides a rotation inhibiting device which inhibits the rotation of the same 232.

Similarly, an engage pin 280 is fitted in, and fixed to, the second movable guide plate 234, such that the pin 280 extends perpendicularly to the direction of movement of the guide plate 234, and parallel to the widthwise direction of the EC feeder 12. Opposite end portions of the engage pin 280 project from opposite surfaces of the guide plate 234, respectively, so as to provide engage portions 282, 284. The engage portions 282, 284 are fitted in the respective elongate holes 178, 214 of the second and third members 152, 154, respectively, such that the engage portions 282, 284 are movable relative to the elongate holes 178, 214 in a vertical direction as the lengthwise direction of the holes 178, 214. The engage portions 282, 284 and the elongate holes 178, 214 cooperate with each other to provide a movement limiting device which limits the movement of the second movable guide plate 234 in the widthwise direction thereof, or a guiding device which guides the movement of the same 234 in the vertical direction, and the fit hole 230 provides a rotation inhibiting device which inhibits the rotation of the same 234.

The respective engage portions 274, 284 of the engage pins 270, 280 that are fitted in the third member 154, project from the third member 154, and are fitted in an elongate hole 292 formed in one end portion of a cam lever 290, as shown in FIG. 7. As shown in FIGS. 2 and 5, the cam lever 290 is attached to the main frame 70 via an axis member 294, such that the lever 290 is pivotable about an axis line parallel to the widthwise direction of the main frame 70. The elongate hole 292 is formed in the one end portion of the cam lever 290 that projects from the axis member 294. Thus, the elongate hole 292 is pivotable about the axis line perpendicular to the direction of movement of the two guide plates 232, 234. The cam lever 290 includes, in the other end portion thereof, an engage portion 296 which is engageable with the elevator link 114. A spring member 298 as an elastic member as a sort of biasing device that is provided between the main frame 70 and the cam lever 290, biases the cam lever 290 in a direction in which the engage portion 296 engages the elevator link 114.

Therefore, when the elevator link 114 is moved downward and upward, the cam lever 290 is pivoted, so that the two guide plates 232, 234 are moved upward and downward. In the state in which the elevator link 114 is positioned at its upper-dead position, the cam lever 290 is positioned at its first rotation position indicated at solid line in FIG. 5, and the two guide plates 232, 234 are positioned at their retracted or lower-dead positions. When the elevator link 114 is moved downward, the cam lever 290 is pivoted against the biasing force of the spring member 298, and is moved to its second rotation position indicated at two-dot chain line in FIG. 5, and the two guide plates 232, 234 are positioned at their advanced or upper-dead positions. Since the engage pins 270, 280 are fitted in the elongate holes 212, 214 which vertically extend, the engage pins 270, 280 are moved, when the elongate hole 292 is pivoted, linearly in vertically opposite directions, within the elongate holes 212, 214, respectively, while each of the pins 270, 280 is moved relative to the elongate hole 292. When the elevator link 114 is moved upward, the cam lever 290 is pivoted, owing to the biasing force of the spring member 298, to follow the link 114, so that the two guide plates 232, 234 are moved downward to their lower-dead positions. Thus, when the elevator link 114 is moved downward and then upward one time, the cam lever 290 is pivoted reciprocatively one time. That is, each time the EC-suck head 22 sucks and holds one EC 84 from the EC feeder 12, the two guide plates 232, 234 are reciprocated one time.

The first and second rotation positions of the cam lever 290 are defined by the upper-dead and lower-dead positions of the elevator link 114, respectively, and the lower-dead and upper-dead positions of the two guide plates 232, 234 are defined by the first and second rotation positions of the cam lever 290, respectively. The elongate hole 292 extends along an arc. In the state in which the cam lever 290 is positioned at its first rotation position, the respective engage pins 270, 280 of the two guide plates 232, 234 are positioned at the same height position, and a portion of the elongate hole 292 that is located between respective portions of the pins 270, 280 that are fitted in the hole 292 is curved upwardly convexly. Thus, respective distances of the two pins 270, 280 from the axis line about which the lever 290 is pivotable, differ from each other, and respective angles of inclination of respective portions of the hole 290 in which the pins 270, 280 are fitted, differ from each other. Owing to those differences, the two guide plates 232, 234 are moved over different strokes, such that the movement stroke of the second guide plate 234 is greater than that of the first guide plate 232. The distance of the second pin 280 from the axis line of the lever 290 is greater than that of the first pin 270 and, when the lever 290 is pivoted from its first rotation position toward its second rotation position, the second pin 280 is moved relative to the hole 292 so as to climb up the curved inner, lower surface of the hole 292 whereas the first pin 270 is moved relative to the hole 292 so as to climb down the same surface. Therefore, the stroke of the second pin 280 caused by the pivotal motion of the elongate hole 292 is greater than that of the first pin 270.

The elongate hole 292 may have an arbitrary shape. For example, as the radius of curvature of the elongate hole 292 decreases, the difference between the respective strokes of the first and second movable guide plates 232, 234 increases. However, as the radius of curvature decreases, the frictional force produced between the engage pins 270 and the inner side surfaces of the elongate hole 292, and the frictional force produced between the second and third members 152, 154 and the inner side surfaces of the elongate holes 176, 178, 212, 214 increase. In view of this, it is desirable that rollers be rotatably fitted on respective portions of the engage pins 270, 280 that contact the inner side surfaces of the elongate holes 176, 178, 212, 214 and respective portions of the pins 270, 280 that contact the inner side surfaces of the elongate hole 292. In this case, the frictional forces decrease because of the rotation of the rollers.

In the state in which the two guide plates 232, 234 are positioned at their lower-dead positions, the respective upper inclined surfaces 240, 242 are positioned at the same height position. Since the respective strokes of the two guide plates 232, 234 differ from each other, the second guide plate 234 can project upward over the first guide plate 232. In the present embodiment, in the state in which the two guide plates 232, 234 are positioned at their lower-dead positions, the guide plates 232, 234 do not project into the hopper 82, that is, the respective upper-end portions of the two plates 232, 234 are positioned near the upper-end opening of the guide hole 236. The engage pins 270, 280 provide cam followers; the cam lever 290 provides a cam; the elongate hole 292 provides a cam portion of the cam; the cam and the cam followers cooperate with the elevator link 114 to provide a movable-guide-member driving device. The index servomotor 26 is provided outside each EC feeder 12, and thus functions as a drive source which is provided outside an EC arranging and supplying device. In the present embodiment, the movable-guide-member driving device, the plunger-pump driving device 142, and the shutter driving device 144 share the elevator link 114. Thus, each EC feeder enjoys a simple construction. Those driving devices are mechanically operated, and accordingly each EC feeder 12 does not need any electric wiring.

The EC mounting machine constructed as described above is operated under control of a control device 310 (FIG. 1) which is essentially constituted by a computer and which controls the index servomotor 26, the X-axis servomotor 50, etc.

When the EC mounting machine mounts the ECs 84 on the PWB 18, the X-axis table 44 is moved and the respective EC-supply portions of the EC feeders 12 are sequentially positioned at the EC-supply position where each EC feeder 12 supplies the ECs 84 to the EC mounting system 14. As described previously, when the elevator member 140 is moved downward, the shutter 124 is moved from its operative position to its inoperative or retracted position, thereby allowing each EC-suck head 22 to take out the EC 84 from the EC feeder 12. Thus, the EC-suck head 22 sucks, holds, and takes out the EC 84, and concurrently the two guide plates 232, 234 are moved from their lower-dead positions to their upper-dead positions.

As indicated at two-dot chain line in FIG. 5, the two guide plates 232, 234 are moved relative to the second and third members 152, 154, and are projected into the bottom portion 228 of the hopper 82, over the respective lower portions of the inclined surfaces 220, 222, 224, 226 that define the guide hole 236. Since the stroke of the second guide plate 234 is greater than that of the first guide plate 232, the second guide plate 234 is moved relative to the first guide plate 232. Thus, the second guide plate 234 is moved at a speed higher than that at which the first guide plate 232 is moved. This movement of the two guide plates 232, 234 causes the ECs 84 present in the lowermost portion of the bottom portion 228 of the hopper 82 to move, so that the clogging of the guide hole 236 with the ECs 84 and/or the bridging of the ECs 84 over the guide hole 236 are/is eliminated. Even in the case where one EC 84 lies such that the lengthwise direction of the EC 84 is horizontal or nearly horizontal, the EC 84 is raised up by the upward movement of the guide plates 232, 234, so that the EC 84 may take a posture which allows the EC 84 to enter the narrowest portion of the guide hole 236, that is, a posture in which the lengthwise direction of the EC 84 is vertical or nearly vertical. When the EC 84 takes this posture as a result of the elimination of the clogging and/or the bridging and/or the changing of the posture, and simultaneously takes the same angular phase as that of the guide hole 236, the EC 84 enters the narrowest portion of the guide hole 236 and moves, by gravity, to the initial end portion of the chute 80.

The ECs 84 are moved toward the narrowest portion of the guide hole 236, while being guided by the inclined surfaces 220, 222, 224, 226 and the upper inclined surfaces 240, 242 of the two guide plates 232, 234. In particular, the two inclined surfaces 220, 224 contain an acute angle, so that the respective postures of the ECs 84 which have been moved on the inclined surfaces 220, 224 toward the narrowest portion of the guide hole 236 are changed by the edges at the boundary between the inclined surfaces 220, 224 and the vertical side surfaces of the narrowest portion of the guide hole 236, and are thus guided to enter the narrowest portion of the guide hole 236. The many ECs 84 stored in bulk in the hopper 82 are moved little by little toward the narrowest portion of the guide hole 236, while the clogging and/or the bridging are/is solved, and the postures of the ECs 84 are changed, by the movement of the guide plates 232, 234.

When the elevator link 114 is moved upward, the two guide plates 232, 234 are moved downward to their lower-dead positions. As the guide plates 232, 234 are lowered, the ECs 84 around the guide hole 236 are lowered to follow the guide plates 232, 234, and are guided by the upper inclined surfaces 240, 242 of the guide plates 232, 234 toward the narrowest portion of the guide hole 236. In addition, since the first guide plate 232 is moved upward relative to the second guide plate 234, the ECs which are lying on their sides or are being inclined are raised up and promoted to enter the narrowest portion of the guide hole 236.

When the first guide plate 232 is moved upward, i.e., in a direction in which the guide plate 232 is separated from the ridge 170 of the second member 152, the guide plate 232, however, is not completely separated from the ridge 170, so that the ECs 84 do not enter the small spaces produced when the guide plate 232 is partly separated from the ridge 170, and are smoothly guided by the continuous guide surfaces 244, 174 to the chute 80. The ECs 84 which have been moved in the guide hole 236 are scooped by the scoop surface 198 of the scraper 188, from the guide surface 246, are deflected from their vertical postures, and are moved along the inner side surface 190. When the second guide plate 234 is moved upward, the plate 234 is not completely separated from the scraper 188, so that the ECs 84 do not enter the small spaces produced when the guide plate 234 is partly separated from the scraper 188, and are smoothly moved along the continuous guide surfaces 246, 196. The ECs 84 which have entered the chute 80 by being guided by the guide 238, are fed to the EC-supply portion of the EC feeder 12, because the air in the chute 80 is sucked and the air flows in the chute 80. Thus, the many ECs 84 are moved to the EC-supply portion, in the state in which the ECs 84 are arranged in one array. The guide hole 236 is designed such that the two long sides of the rectangular cross section of the hole 236 are parallel to the lengthwise direction of the EC feeder 12 and the two short sides of the same are parallel to the widthwise direction of the feeder 12. Therefore, when each EC 84 passes through the vertical, initial end portion of the chute 80, both the thicknesswise and widthwise directions of the EC 84 are horizontal. However, the chute 80 is twisted by 90 degrees between its initial end portion and its terminal end portion. Accordingly, the posture of the EC 84 is changed while the EC 84 is moved in the chute 80. When the EC 84 reaches the EC-supply portion, the widthwise direction of the EC 84 is horizontal but the thicknesswise direction thereof is vertical, as shown in FIGS. 3 and 4. This posture is the posture in which the EC 84 is sucked and held by the EC-suck head 22.

In case, when the two guide plates 232, 234 are moved downward, one or more ECs 84 are bitten between the respective lower portions of the inclined surfaces 220, 222, 224, 226 that define the upper surface of the guide 238, and the vertical side surfaces of the guide plates 232, 234, and consequently the guide plates 232, 232 come to deadlock because of wedge effect, the guide plates 232, 234 remain stopped at the position where the guide plates 232, 234 have reached the deadlock, because, when the guide plates 232, 234 are moved downward, the cam lever 290 is pivoted back by the biasing action of the spring member 298 so as to follow the elevator link 114. Thus, the guide plates 232, 234 and the ECs 84 are prevented from being damaged. The biting of the ECs 84 is eliminated when the guide plates 232, 234 are moved upward at the next time.

In the above-described first embodiment, the two guide plates 232, 234 as the two movable guide members that correspond to the two short sides of the rectangular cross section of the guide hole 236 are moved relative to the second and third members 152 154 as the two stationary guide members which cooperate with the two movable guide members to provide the four guide members which define the guide hole 236 and provide the guide 238. However, it is possible that two movable guide members which correspond to the two long sides of the rectangular cross section of the guide hole 236 be moved relative to two stationary guide members which correspond to the two short sides of the rectangular cross section of the guide hole 236. In addition, it is possible that one movable guide member which corresponds to one of the two long sides and one movable guide member which corresponds to one of the two short sides be moved relative to one stationary guide member which correspond to the other of the two long sides and one stationary guide member which corresponds to the other of the two short sides. Moreover, it is possible that three or four guide members be moved.

In the first embodiment, the guide 238 is provided by the four guide members 152, 154, 232, 234. However, the guide may be provided by two guide members. In addition, in the first embodiment, each time one EC 84 is taken out by the EC-suck head 22, the two guide plates 232, 234 are reciprocated one time, i.e., moved up and down. However, it is possible that each time one EC 84 is taken out by the head 22, the guide plates 232, 234 be reciprocated two or more times.

Figure 14:
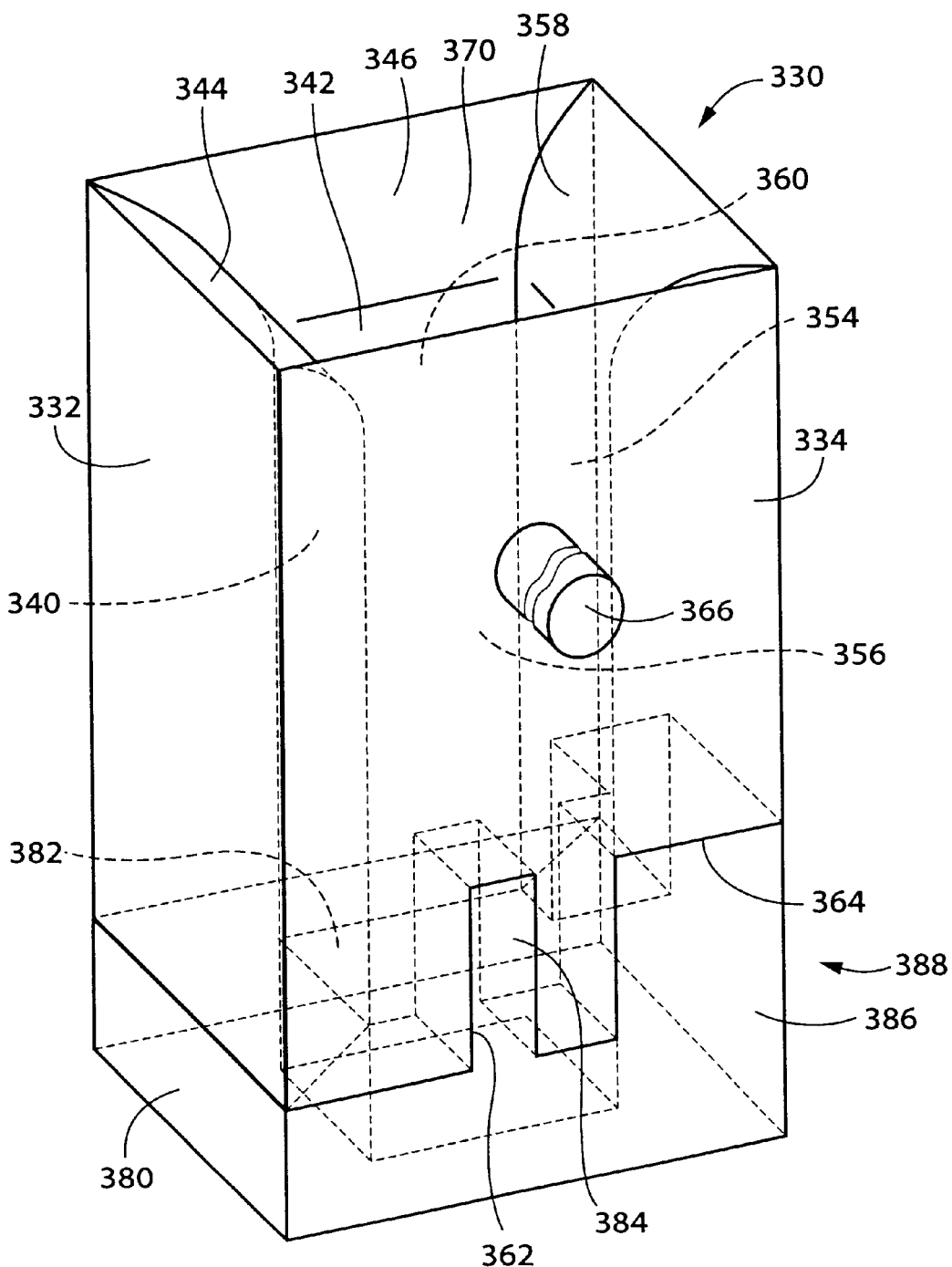
FIG. 14 is a perspective view of a guide and a chute-forming member as elements of another EC arranging and supplying device as a second embodiment of the present invention.
Figure 15:
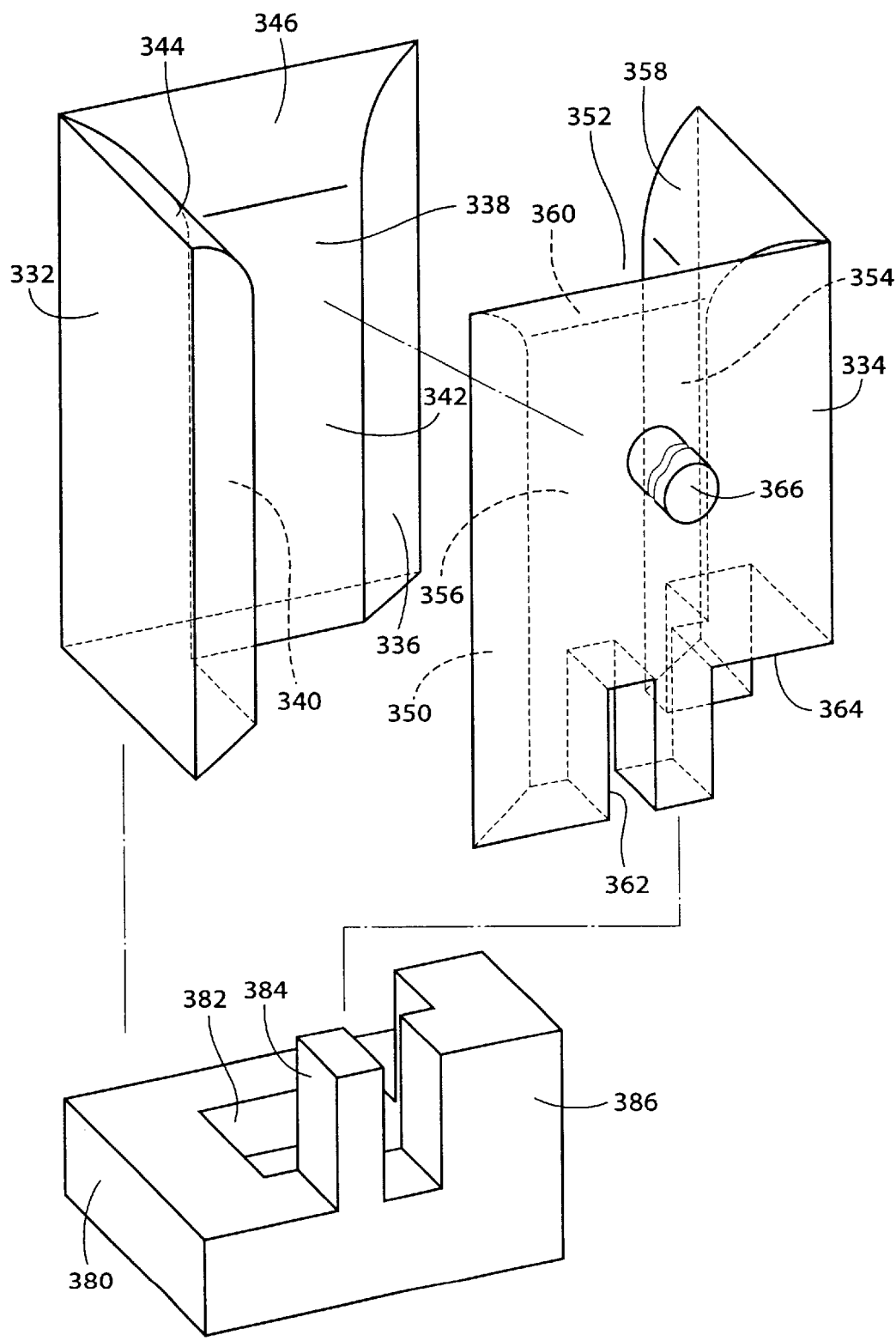
FIG. 15 is a perspective view of a stationary and a movable guide member of the guide of FIG. 14, and the chute-forming member of FIG. 14.
Figure 16:
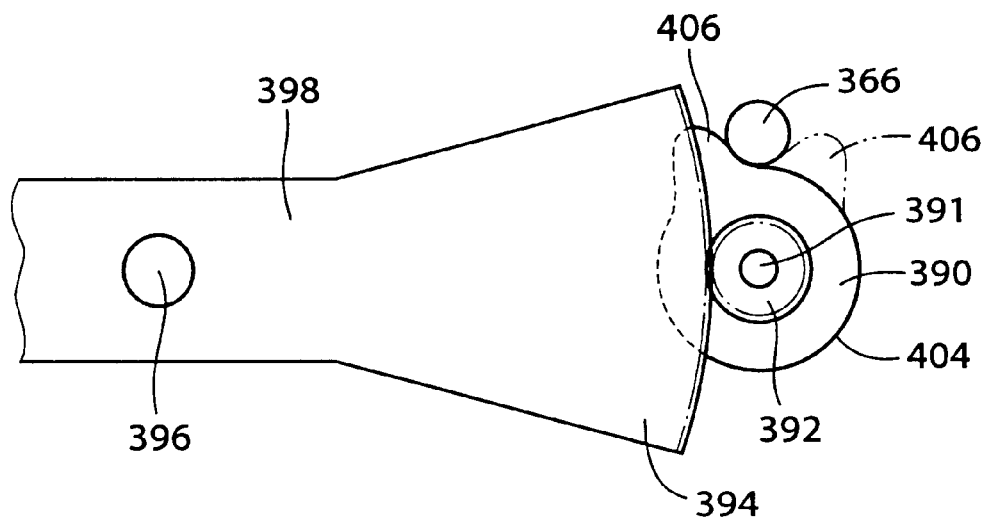
FIG. 16 is a front elevation view of a movable-guide-member moving device which moves the movable guide member of the guide of FIG. 14.

FIGS. 14, 15, and 16 shows a second embodiment of the present invention that relates to the above-indicated case where a guide may be provided by two guide members and, each time one EC is taken out by an EC-suck head, the two guide plates are reciprocated two or more times.

The present EC arranging and supplying device includes a guide 330 which is provided by one stationary guide member 332 and one movable guide member 334. The two guide members 332, 334 may be obtained by cutting a rectangular parallelopiped along one of its two diagonal planes and cutting out a central portion of each of the thus obtained two prisms. As shown in FIG. 15, the stationary guide member 332 has a generally right-triangular transverse cross section, and has a recess 338 which opens in a side surface 336 corresponding to the opposite side of the right angle of the right-triangular cross section and which is vertically formed through the thickness of the member 332. The recess 338 is defined by two inner side surfaces 340, 342. Respective upper end portions of the two side surfaces 340, 342 are curved to provide respective part-cylindrical surfaces 344, 346.

Like the stationary guide member 332, the movable guide member 334 has a generally right-triangular transverse cross section, and has a recess 352 which opens in a side surface 350 corresponding to the opposite side of the right angle of the right-triangular cross section and which is vertically formed through the thickness of the member 334. The recess 352 is defined by two inner side surfaces 354, 356 respective upper end portions of which are curved to provide respective part-cylindrical surfaces 358, 360. The movable guide member 334 additionally has two recesses 362, 364. The recess 362 opens in a lower surface of the member 334, and is horizontally formed through the thickness of the same 334. The recess 364 is formed by cutting off one right-angular corner of the movable guide member 334, opens in the lower surface of the same 334, and is horizontally formed through the thickness of the same 334. The recess 364 has an L-shaped transverse cross section, and corresponds to respective portions of the two sides of the right-triangular cross section that contain the right angle. Moreover, the movable guide member 334 has an engage pin 366 which projects from an outer surface of the member 334 that is opposite to the recess 352, and which extends perpendicularly to a direction in which the member 334 is moved.

The respective side surfaces 336, 350 of the stationary and movable guide members 332, 334 are contacted with each other to provide the guide 330. The guide 330 has a guide hole 370 which has a rectangular transverse cross section taken along a horizontal plane and which functions as a vertically extending guide passage. The respective inner side surfaces 340, 342, 354, 356 of the two guide members 332, 334 provide four guide surfaces; and the respective curved surfaces 344, 346, 358, 360 of the two guide members 332, 334 cooperate with one another to provide four upper surfaces of the guide 330. Each of the curved surfaces 344, 346, 358, 360 is curved such that as the each curved surface approaches a center line of the guide hole 370, the each curved surface extends in a downward direction. Each of the stationary and movable guide members 332, 334 defines corresponding two sides out of four sides of a rectangle corresponding to a rectangular transverse cross section of a chute, the two sides being adjacent to each other.

As shown in FIG. 14, the stationary and movable guide members 332, 334 are assembled with a chute-forming member 380 which has a rectangular transverse cross section. As shown in FIG. 15, the chute-forming member 380 has a chute-forming hole 382 which has a rectangular transverse cross section and which is vertically formed through a central portion of the member 380. An upper opening of the chute-forming member 380 has the same dimensions as those of a lower opening of the guide hole 370 and, when the stationary and movable guide members 332, 334 are assembled with the chute-forming member 380, the four inner surfaces 340, 342, 354, 356 are flush with four inner side surfaces of the chute-forming hole 382, on respective common planes. The chute-forming member 380 has two projecting portions 384, 384 projecting upward from an upper surface of the member 380. The two projecting portions 362, 364 has respective transverse cross sections corresponding to those of the two recesses 362, 364 of the guide member 334, respectively. Respective inner side surfaces of the two projecting portions 384, 386 are flush with the inner side surfaces of the the chute-forming member 380, on respective common planes.

As shown in FIG. 14, the stationary guide member 332 is placed on the chute-forming member 380, and is fixed to the same 380 by a fixing means (not shown). The movable guide member 334 is placed on the chute-forming member 380, such that the two recesses 362, 364 are fitted on the projecting portions 384, 386 and such that the guide member 334 is vertically movable relative to the chute-forming member 380. It is possible that the stationary guide member 332 be just placed on the chute-forming member 380. In the state in which the two recesses 362, 364 are fitted on the two projecting portions 384, 386, respectively, the respective side surfaces 354, 356 of the movable guide member 334 are flush with the respective inner side surfaces of the projecting portions 384, 386 that faces the guide hole 370, and the four inner side surfaces 340, 342, 354, 356 are flush with the four inner side surfaces of the chute-forming hole 382.

In the present embodiment, the two recesses 362, 368 and the two projecting portions 384, 386 have respective dimensions which assure that when the movable guide member 334 is moved upward to its upper-dead position, the recesses 362, 368 are not completely disengaged or separated from the projecting portions 384, 386. That is, the movable guide member 334 remains continuous with the chute-forming member 380 in a vertical direction, thereby providing a guide surface which is continuous from the guide member 334 to the chute-forming member 380 in the vertical direction. Like the first and second movable guide plates 232, 234. and the second member 152 all of which are employed in the first embodiment, the movable guide member 334 and the chute-forming member 380 cooperate with each other to provide two side surfaces of the four side surfaces of the chute whose transverse cross section is rectangular, and are engaged with each other such that irrespective of which position is taken by the movable guide member 334, the two side surfaces are continuous in the lengthwise direction of the chute. Thus, the respective portions of the movable guide member 334 in which the two recesses 362, 364 are formed, and the two projecting portions 384, 386 of the chute-forming member 380 cooperate with each other to provide a connection portion 388 which connects between the guide 330 and the chute and which may be called as the transitional portion. The movable guide member 334 corresponds to one short side and one long side of the rectangular transverse cross section of the guide hole 370, and at least one recess 362, 364 and at least one projecting portion 384, 386 are engaged with each other, for each of the short and long sides, so that the guide surface for each of the two sides is continuous in the vertical direction as the lengthwise direction of the chute. In addition, a dimension of each of respective portions of the two recesses 362, 364 that correspond to the one long side of the rectangular transverse cross section of the guide hole 370, is smaller than the long sides of the rectangular transverse cross section of each EC 84, and a dimension of a portion of the recess 364 that corresponds to the one short side of the rectangular transverse cross section, is smaller than the short sides of the rectangular transverse cross section of each EC 84. Thus, each EC 84 cannot enter any small spaces which are produced when the movable guide member 334 is moved upward relative to the chute-forming member 380. Consequently each EC 84 is smoothly moved through the connection portion 388.

The stationary and movable guide members 332, 334 and the chute-forming member 380 which are assembled with one another are fitted in a fitting recessed portion of a main frame of an EC feeder that is oriented in a vertical direction. Thus, the fitting recessed portion of the main frame provides a stationary guide-holding portion or member. In the state in which the three members 332, 334, 380 are fitted in the fitting recessed portion, the chute-forming hole 382 formed in the chute-forming member 380 is connected to a chute-forming passage opening in a bottom surface of the fitting recessed portion, and cooperates with the chute-forming passage to provide the chute. The transverse cross section of the chute-forming passage has the same shape and dimensions as those of the cross section of the chute-forming hole 382, so that the four inside surfaces of the chute-forming passage are flush with the four inside surfaces of the chute-forming hole 382, respectively. Thus, the chute-forming hole 382 and the chute-forming passage are continuous with each other without any steps, so that each EC 84 is smoothly moved from the hole 382 to the passage. The chute-forming hole 382 and an end portion of the chute-forming passage that is located on the side of the hole 382 cooperate with each other to provide a vertically extending, initial end portion of the chute.

A hopper (not shown) is detachably attached to the fitting recessed portion of the main frame of the EC feeder. The hopper has a rectangular transverse cross section taken along a horizontal plane, and has four inner side surfaces which are inclined toward one another as they extend downward. In the state in which the guide 330, the chute-forming member 380, and the hopper are attached to the main frame of the EC feeder, the four curved surfaces 344, 346, 358, 360 of the guide 330 are continuous with the four inclined side surfaces of the hopper, respectively, without any gaps left therebetween. Two inclined side surfaces of the four inclined side surfaces of the hopper that are distant from each other in the lengthwise direction of the hopper contain an obtuse angle, and an angle of inclination of each of the two inclined side surfaces with respect to a horizontal plane are smaller than the smallest angle of a corresponding one of the curved surfaces 344, 358 with respect to the horizontal plane. The other two inclined side surfaces of the four inclined side surfaces of the hopper that are distant from each other in the widthwise direction of the hop per contain an acute angle, and an angle of inclination of each of the other two inclined side surfaces with respect to the horizontal plane are smaller than the smallest angle of a corresponding one of the curved surfaces 346, 360 with respect to the horizontal plane. Each of the curved surfaces 344, 346, 358, 360 has a part-cylindrical shape, and the smallest angle of the each curved surface is greater than the angle of inclination of a corresponding one of the respective inclined portions of the four inner side surfaces of the hopper that cooperate with one another to define a bottom surface of the hopper. In addition, the angle of inclination of a lower portion of each curved surface 344, 346, 358, 360 that is located on the side of the guide hole 370 or the chute is greater than the angle of inclination of an upper portion of the each curved surface that is located on the side of the hopper. An outlet of the hopper is defined by the respective inclined portions of the four inner side surfaces of the hopper, and opens in the guide hole 370.

As shown in FIG. 16, the engage pin 366 projecting from the outer surface of the movable guide member 334 is engaged with a plate cam 390 as a rotary cam as a sort of a cam. The plate cam 390 is attached via an axis member 391 to the main frame (not shown) of the EC feeder, such that the plate cam 390 is rotatable about an axis line which is perpendicular to the direction of movement of the movable guide member 334 and extends in the widthwise direction of the feeder. A gear 392 is attached to the plate cam 390, such that the gear 392 is concentric with the cam 390 and is not rotatable relative to the same 390. The gear 392 is meshed with a sector gear 394 integral with a lever 398 which is attached via an axis member 396 to the main frame of the EC feeder such that the lever 398 is pivotable about an axis line extending in the widthwise direction of the feeder. The sector gear 394 has its center on the axis line of pivotal motion of the lever 398. Like the cam lever 290 employed in the first embodiment, the lever 398 is pivotable in opposite directions, when an elevator link is moved upward and downward.

An outer circumferential surface of the plate cam 390 provides a cam surface 404 which includes a single projecting portion 406 whose distance from the axis line (i.e., the axis member 391) gradually increases and then gradually decreases, with respect to a basic circle of the cam surface 404, both when the plate cam 390 is rotated in a forward direction and when the cam 390 is rotated in a backward direction. A spring member (not shown) as an elastic member as a sort of biasing device biases the engage pin 366 in a direction in which the pin 366 engages the cam surface 404.

When the elevator link is moved downward, the lever 398 is pivoted in a forward direction (counterclockwise in FIG. 16) and, owing to the meshing of the sector gear 394 and the gear 392, the plate cam 390 is rotated in the forward direction (clockwise in FIG. 16), so that the projecting portion 406 first moves up the engage pin 366 against the biasing force of the spring member and then allows the pin 366 to move down. Thus, the movable guide member 334 is vertically reciprocated one time. The projecting portion 406 is moved from one side of the engage pin 366, indicated at solid line in FIG. 16. to the other side of the same 366, indicated at two-dot chain line. The movable guide member 344 is moved up, via the outlet of the hopper that opens in the guide hole 370, to its advanced (i.e., upper-dead) position where the guide member 344 projects into the inner space of the hopper, to move ECs, eliminate the clogging of the outlet with the ECs and/or the bridging of the ECs over the outlet, and change the posture of each EC to a vertical posture which assures that the each EC can enter the guide hole 370. The movable guide member 344 is moved down to its retracted (i.e., lower-dead) position where the guide member 344 is retracted from the hopper and is positioned below the hopper and the curved surfaces 358, 360 of the guide member 344 are continuous with the inclined bottom surface of the hopper without any gaps left therebetween. The movable guide member 334 being positioned at its retracted position take the same height position as that of the stationary guide member 332.

When the elevator link is moved up, the lever 398 is pivoted in a backward direction (clockwise in FIG. 16), and the plate cam 390 is rotated in the backward direction (counterclockwise in FIG. 16), so that the engage pin 366 climbs over the projecting portion 406 of the cam surface 404 and the movable guide member 334 is vertically reciprocated one time. Thus, in the second embodiment, each time one EC is supplied from the EC feeder, the movable guide member 334 is reciprocated two times. The movable guide member 334 provides a EC-discharge promoting member; the engage pin 366 provides a cam follower; and the plate cam 390, the gear 392, the sector gear 394, and the lever 398 cooperate with one another to provide a motion converting device which converts the motion of the elevator link into the reciprocative motion of the movable guide member 334. The motion converting device cooperates with the elevator link as a reciprocateable member as a driven member, to provide a movable-guide-member moving device or an EC-discharge-promoting-member reciprocating device. The present EC arranging and supplying device is readable on the thirty-fifth feature (35) described in SUMMARY OF THE INVENTION. The gear ratio of the gear 392 and the sector gear 394 is determined at a value which assures that while the lever 398 is pivoted in the forward or backward direction when the elevator link is moved down or up, the plate cam 390 is rotated by an angle sufficient to cause the engage pin 366 to climb over the projecting portion 406.

The cam surface 404 of the plate cam 390 may include two or more projecting portions 406. In this case, when the plate cam 390 is rotated in one direction, i.e., the forward or backward direction, the movable guide member 334 is reciprocated two or more times.

In the case where the guide 330 is provided by three or more guide members, e.g., four guide members, which include at least two movable guide members, it is possible that each time one EC is supplied, those movable guide members be reciprocated two or more times.

Figure 17:
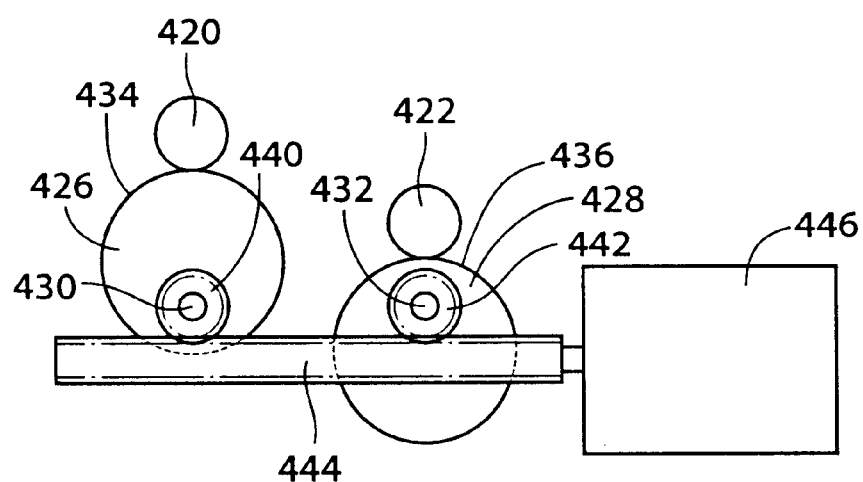
FIG. 17 is a schematic front elevation view of a movable-guide-member moving device of another EC arranging and supplying device as a third embodiment of the present invention.

Though in each of the first and second embodiments the drive source is provided outside the main frame of each EC feeder, it is possible that a drive source be provided on a main frame of an EC feeder, as shown in FIG. 17.

FIG. 17 relates to a third embodiment of the present invention that relates to an EC arranging and supplying device. The present EC arranging and supplying device includes a guide (not shown) which includes, like the guide 238 employed in the EC arranging and supplying device of the EC feeder shown in FIGS. 1 to 13, two stationary guide members and two movable guide members (all not shown). Each of the two movable guide members has an engage pin 420 which extends in a direction perpendicular to a direction in which the each guide member is moved.

Two eccentric cams 426, 428 each as a sort of rotary cam are attached via respective axis members 430, 432 to a main frame (not shown) of the EC feeder, such that each of the cams 426, 428 is rotatable about a horizontal axis line which is perpendicular to the direction of movement of a corresponding one of the two movable guide members. Two spring members (not shown) each as an elastic member as a sort of biasing device bias the two engage pins 420, 422 in respective directions in which the two pins 420, 422 engage respective cam surfaces 434, 436 of the eccentric cams 426, 428. Two worm wheels 440, 442 are attached to the two eccentric cams 426, 428, respectively, such that the two wheels 440, 442 are concentric with the corresponding cams 426, 428 and are not rotatable relative to the same 426, 428. The two worm wheels 440, 442 are meshed with a worm 444 which is rotated by a servomotor 446 as a rotary motor or an electric motor as a sort of drive source that is provided on the main frame of the EC feeder. Thus, the two worm wheels 440, 442 and accordingly the two eccentric cams 426, 428 are rotated in the same direction and at the same speed. The servomotor 446 is controlled by the control device 310 which additionally controls the index servomotor 26, etc.

The two eccentric cams 426, 428 are identical with each other and, owing to the rotation of the two cams 426, 428, the two movable guide members are vertically moved over the same distance or stroke. However, since the two engage pins 420, 424 are engaged with respective portions of the two cam surfaces 434, 436 that have respective angular phases different by 180degrees from each other, the two movable guide members are moved in opposite directions, respectively. In the present embodiment, the two movable guide members have the same shape and dimensions and, in the state in which one of the two movable guide members is positioned at its advanced or upper-dead position where the one movable guide member projects into a hopper, the other movable guide member is positioned at its retracted or lower-dead position where the other movable guide member is retracted out of the hopper. This state corresponds to respective initial positions of the two eccentric cams 426, 428. Each time the two eccentric cams 426, 428 are rotated by 360 degrees from their initial positions, the two movable guide members are concurrently reciprocated in opposite directions, each one time.

In a state in which the two movable guide members are not operated, the two eccentric cams 426, 428 are held at their initial positions. If, from this state, the worm 444 is rotated by the servomotor 446, the two worm wheels 440, 442 is are rotated and the two eccentric cams 426, 428 are rotated, so that the two engage pins 420, 422 are simultaneously moved in opposite directions, respectively. Consequently the two movable guide members are vertically reciprocated, and are alternately projected into the hopper to move the ECs.

While one EC is supplied, the servomotor 446 is operated or rotated by an amount which causes the two eccentric cams 426, 428 to be rotated two or more times and accordingly causes the two movable guide members to be reciprocated two or more times. Therefore, each EC can have more chance to enter the guide, which contributes to improving the reliability of supplying of ECs. In the present embodiment, a portion of the control device 310 that controls the servomotor 446 such. that while one EC is positioned at the EC-supply portion of the EC feeder and supplied from the EC-supply portion, the movable guide members are reciprocated two or more times, provides a movable-guide-member-moving control device.

In the second embodiment, shown in FIGS. 14 to 16, in which the guide 330 is provided by the single stationary guide member 332 and the single movable guide member 334, the drive source may be provided on the main frame of the EC feeder, and the single movable guide member may be reciprocated two or more times while one object is supplied, like in the third embodiment shown in FIG. 17.

A fourth embodiment of the present invention will be described by reference to FIGS. 18 to 25. The present embodiment relates to an EC arranging and supplying apparatus.

In the present EC arranging and supplying apparatus, a guide for introducing ECs stored in a hopper, into a chute, is provided by three members two of which are movable relative to each other in opposite directions, respectively.

Figure 22:
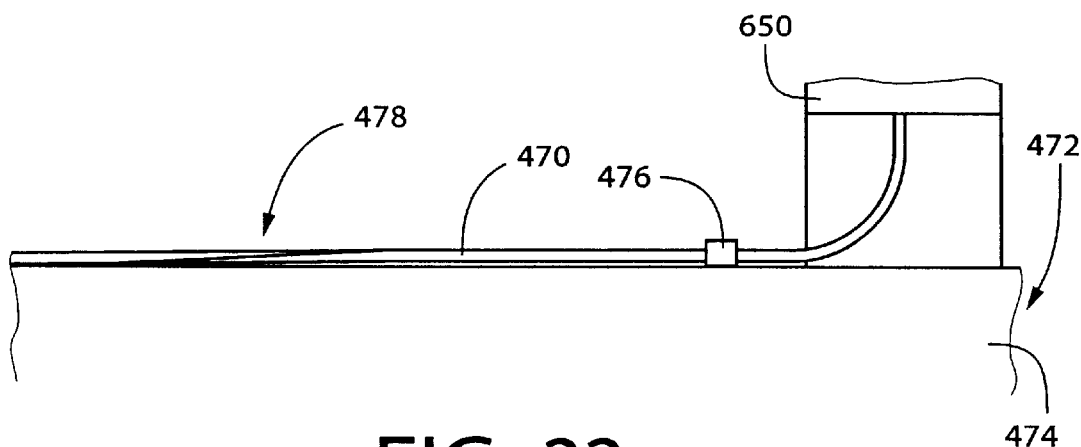
FIG. 22 is a schematic front elevation view of a chute of the EC arranging and supplying apparatus of FIG. 18.
Figure 23:
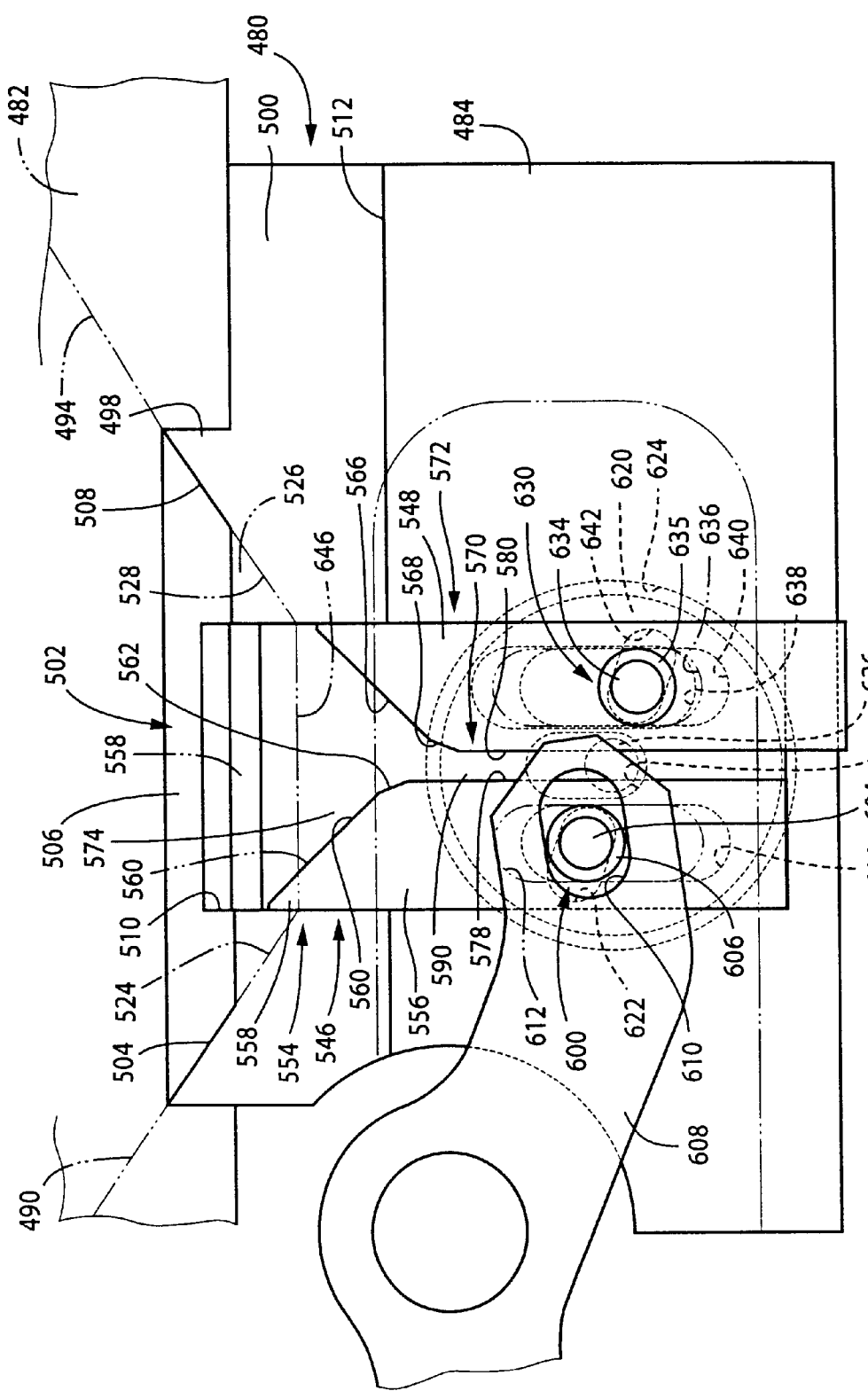
FIG. 23 is a view for explaining the manner of operation of the the first and second movable guide members of the EC arranging and supplying apparatus of FIG. 18.
Figure 24:
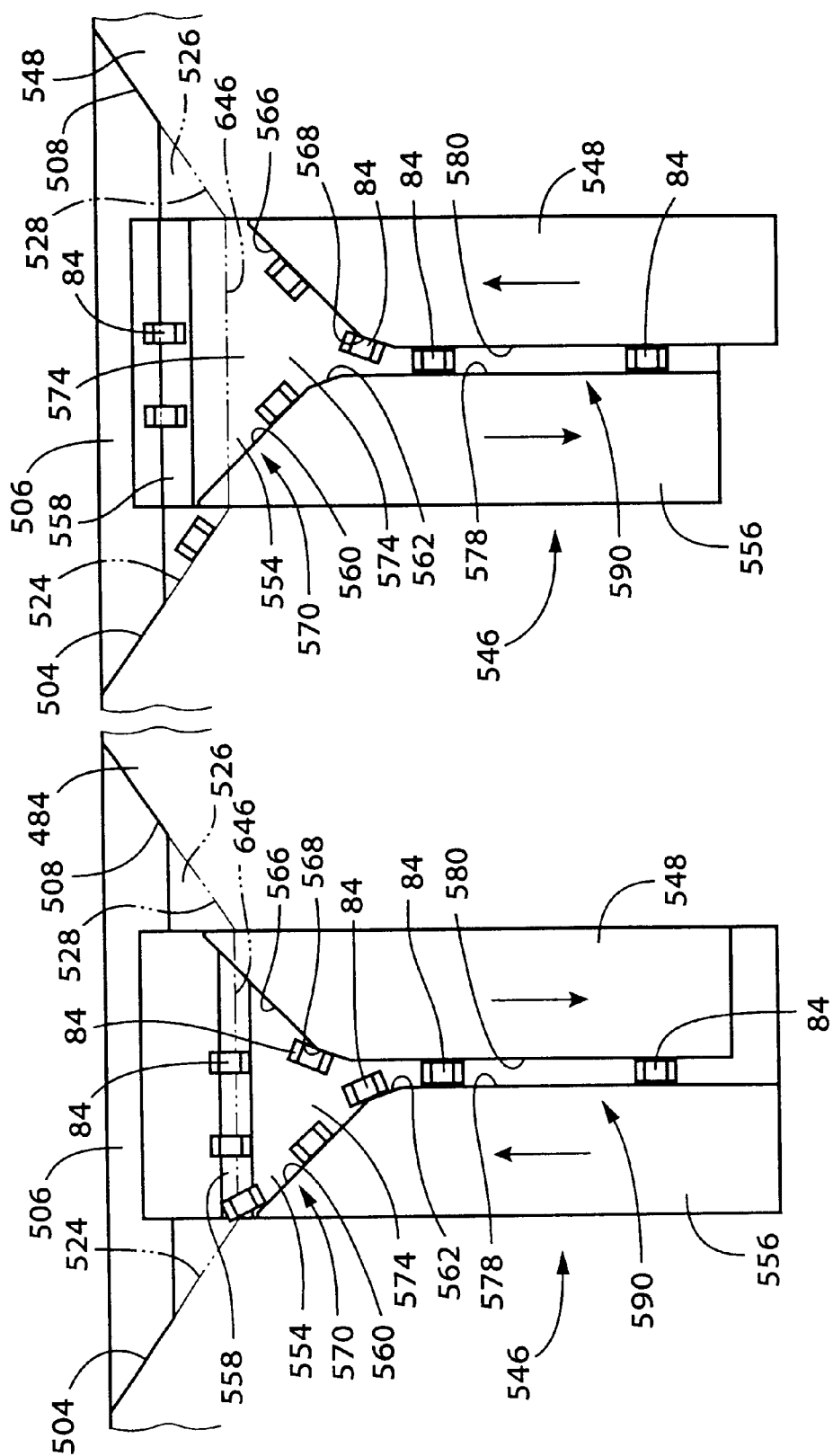
FIGS. 24A and 24B are front elevation views for explaining the manner in which ECs stored in a hopper enter the guide hole in the EC arranging and supplying apparatus of FIG. 18.

The present EC arranging and supplying apparatus includes a chute 470 which is, as shown in FIG. 22, provided by a tubular chute-forming member in the form of a pipe having a rectangular transverse cross section corresponding to that of each EC 84. The chute 480 is disposed on an upper surface of a first member 474 as part of a main frame 472 of an EC feeder. A plurality of hold-down members 476 (only one hold-down member 476 is shown in FIG. 22) cooperate with each other to prevent the chute 470 from moving up off the first member 474. An initial end portion of the chute 470, located on the side of a hopper 480 (FIG. 19), is so curved as to extend vertically upward away from the upper surface of the first member 474 and be connected to a guide hole 570, described later, and a terminal end portion of the chute 470 extends horizontally on the upper surface of the first member 474 and is connected to a passage which reaches an EC-supply portion of the EC feeder that is provided by the first member 474. An intermediate portion between the initial and terminal end portions of the chute 470 is twisted by 90degrees so that the length and width of the rectangular transverse cross section of the initial end portion are parallel to the lengthwise and widthwise directions of the EC feeder, respectively, and the length and width of the rectangular transverse cross section of the terminal end portion are parallel to the withwise direction of the feeder, and vertical, respectively. Accordingly, the chute 470 changes the angular phase of each EC 84, by 90 degrees, while the each EC 84 is fed between the initial and terminal end portions of the chute 470. Therefore, at the EC-supply portion, the each EC 84 takes such a posture that the thicknesswise direction thereof is vertical and the widthwise direction thereof is horizontal. The 90-degree twisted intermediate portion of the chute 470 provides an EC-angular-phase changing portion 478 as an EC-angular-phase changing device. In the present embodiment, the greatest, second greatest, and smallest dimensions of each EC 84 are defined as the length, width, and thickness thereof.

Figure 19:
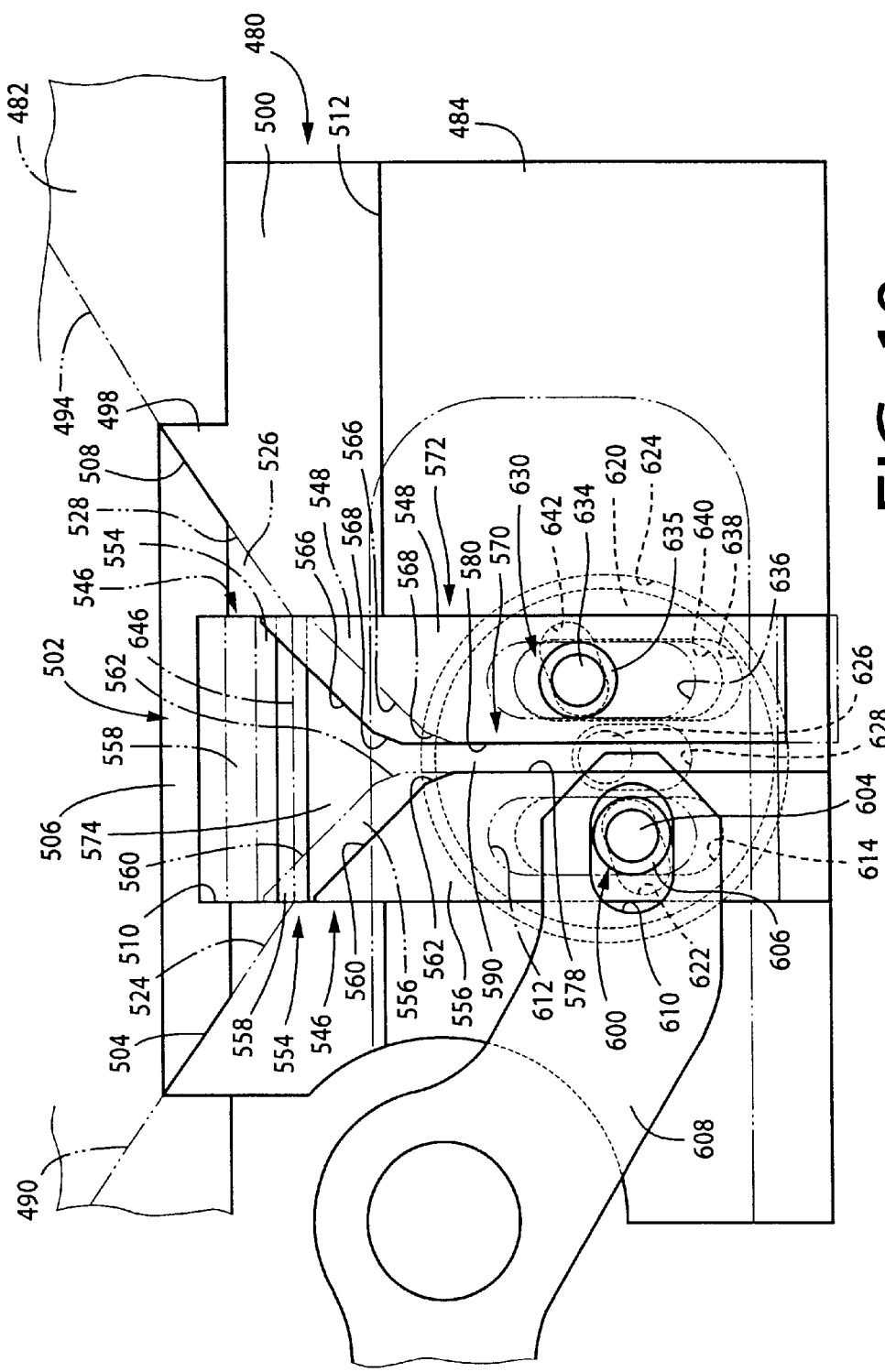
FIG. 19 is a front elevation view showing a guide hole defined by the first and second movable guide members in the EC arranging and supplying apparatus of FIG. 18, without showing a third member.
Figure 20:
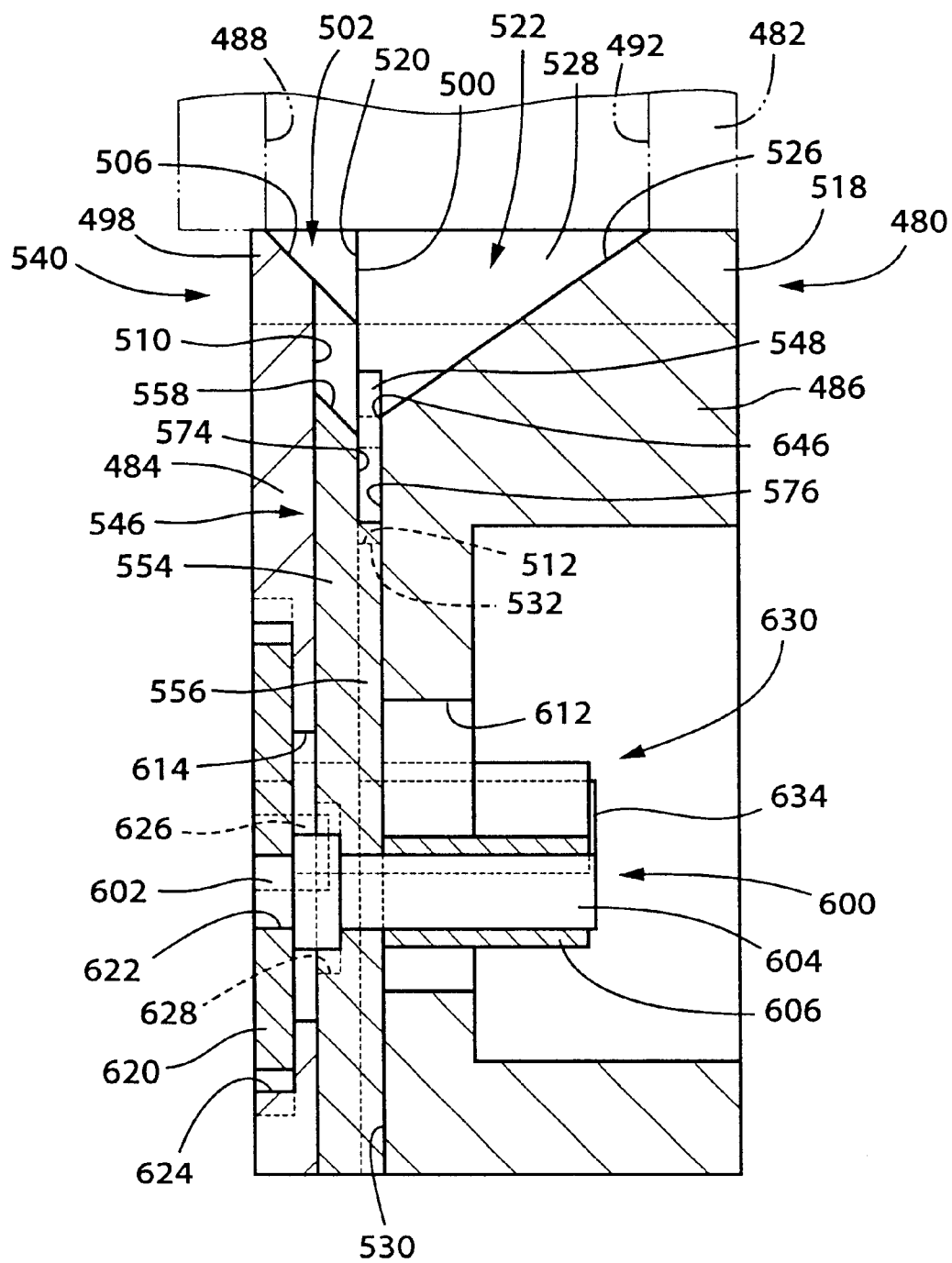
FIG. 20 is a cross-sectioned, side elevation view of the EC arranging and supplying apparatus of FIG. 18, taken along a vertical plane passing through the second movable guide member.
Figure 21:
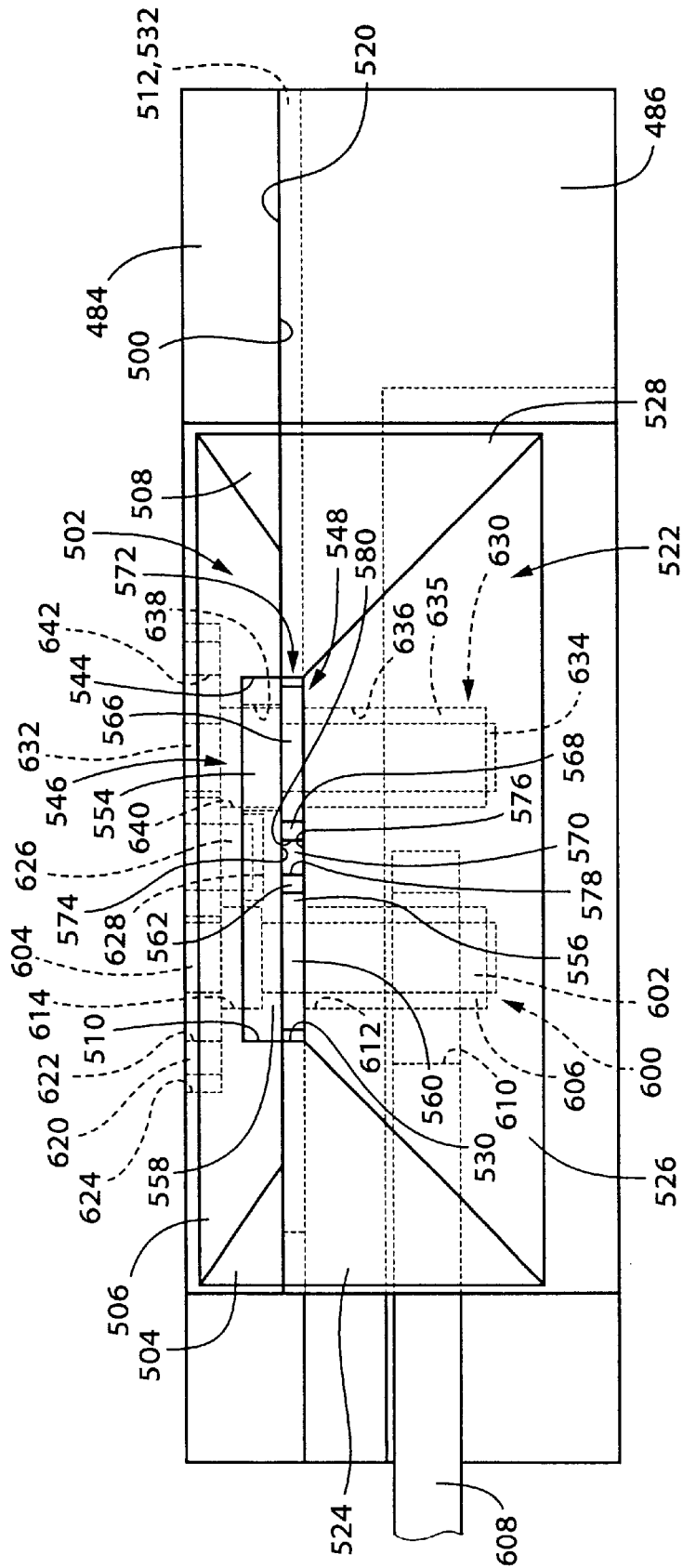
FIG. 21 is a plan view of the EC arranging and supplying apparatus of FIG. 18.

The hopper 480 as part of the present EC arranging and supplying apparatus is provided, as shown in FIGS. 19, 20, and 21, by an integral assembly consisting of a first member 482, a second member 484, and a third member 486. The hopper 480 has a rectangular cross section taken along a horizontal plane, and is disposed such that the lengthwise direction of the hopper 480 is parallel to the lengthwise direction of the EC feeder which employs the present EC arranging and supplying apparatus. The first member 482 has four vertical inner side surfaces 488, 490, 492, 494, and respective lower portions of the two side surfaces 490, 494 which are distant from each other in the lengthwise direction of the EC feeder are inclined inward toward each other as they extend downward.

The second member 484 has a plate-like shape, as shown in FIG. 20, and has a projection 498 provided on an upper surface thereof. The second member 484 has a recess 502, as shown in FIGS. 19 and 20, which opens in both an upper surface of the projection 498 and a vertical contact surface 500 of the second member 484 that contacts the third member 486 when the second and third members 484, 486 are assembled with each other. The recess 502 has a rectangular transverse cross section which is taken along a horizontal plane and which is long in the lengthwise direction of the EC feeder. The recess 502 is defined by three planar, inclined surfaces 504, 506, 508 which are inclined inward toward one another as they extend downward. The second member 484 additionally has a recess 510 which opens in both the middle inclined surface 506, as seen in the lengthwise direction of the hopper 480, and the contact surface 500, which has a rectangular transverse cross section, and which is formed through the thickness of the second member 484 in a vertical direction. The second member 484 has a positioning surface 512, as shown in FIGS. 19 and 20, which is located below the recess 502, which is continuous with, and perpendicular to, the contact surface 500, and which faces upward.

The third member 486 has a block-like shape, as shown in FIG. 20, is thicker than the second member 484, and has a projection 518 provided in a lengthwise intermediate portion of an upper surface thereof. The third member 486 has a recess 522 which opens in both an upper surface of the projection 518 and a vertical contact surface 520 which contacts the second member 484 when the second and third members 484, 486 are assembled with each other. The recess 522 has a rectangular cross section which is taken along a horizontal plane and which is long in the lengthwise direction of the EC feeder. The recess 522 is defined by three planar, inclined surfaces 524, 526, 528 which are inclined, as shown in FIGS. 19 and 20, inward toward one another as they extend downward. The recess 522 is deeper and wider than the recess 510 of the second member 484. That is, a lower end of the recess 522 is located below a lower end of the recess 502.

The three inclined surfaces 524, 526, 528 which define the recess 522 include two inclined surfaces 524, 528 which are distant from each other in the lengthwise direction of the hopper 480 or the EC feeder. Each of the two inclined surfaces 524, 528 is located, as shown in FIG. 21, on the same plane as that on which a corresponding one of the three inclined surfaces 504, 508. The angle of inclination of the intermediate inclined surface 526 is smaller than that of the intermediate inclined surface 506 of the second member 484. The third member 486 additionally has a recess 530 which has a rectangular transverse cross section, which opens in the contact surface 520, and which is formed through the thickness of the third member 486 in a vertical direction. The third member 486 has a positioning surface 532 which is located below the recess 522, which is continuous with, and perpendicular to, the contact surface 520, and which faces downward.

The second and third members 484, 486 position each other in a vertical direction, in a state in which the positioning surface 512 of the second member 484 and, the positioning surface 532 of the third member 486 engage each other. In addition, the respective projections 498, 518 are aligned with each other in a horizontal direction. In this state, the second and third members 484, 486 are assembled with the first member 482. In the state in which the second and third members 484, 486 are assembled with each other, the two recesses 502, 522 are aligned with each other, to provide a bottom portion 540 of the hopper 480. Thus, respective portions of the inclined surfaces 504, 506, 508, 524, 526, 528 that are located on the side of the first member 482 cooperate with one another to provide a bottom surface of the hopper 480; and respective portions of the second and third members 484, 486 that are located on the side of the first member 482 cooperate with each other to provide the bottom portion 540 of the hopper 480. The bottom portion 540 has a funnelform shape whose cross-section area increases in an upward direction.

The respective recesses 510, 530 of the second and third members 484, 486 cooperate with each other to define, as shown in FIG. 21, a movable-guide-member receiving hole 544 which extends in a vertical direction. The movable-guide-member receiving hole 544 has a rectangular transverse cross section, that is, a rectangular cross section which is taken along a horizontal plane, and opens in a space defined by the above-described inclined surfaces 504, 506, 508, 524, 526, 528. A first movable guide member 546 and a second movable guide member 548 are fitted in the movable-guide-member receiving hole 544, such that each of the first and second movable guide members 546, 548 is movable in a vertical direction. In FIG. 19, the third member 486 is not shown, for clearly showing the two movable guide members 546, 548.

Figure 18:
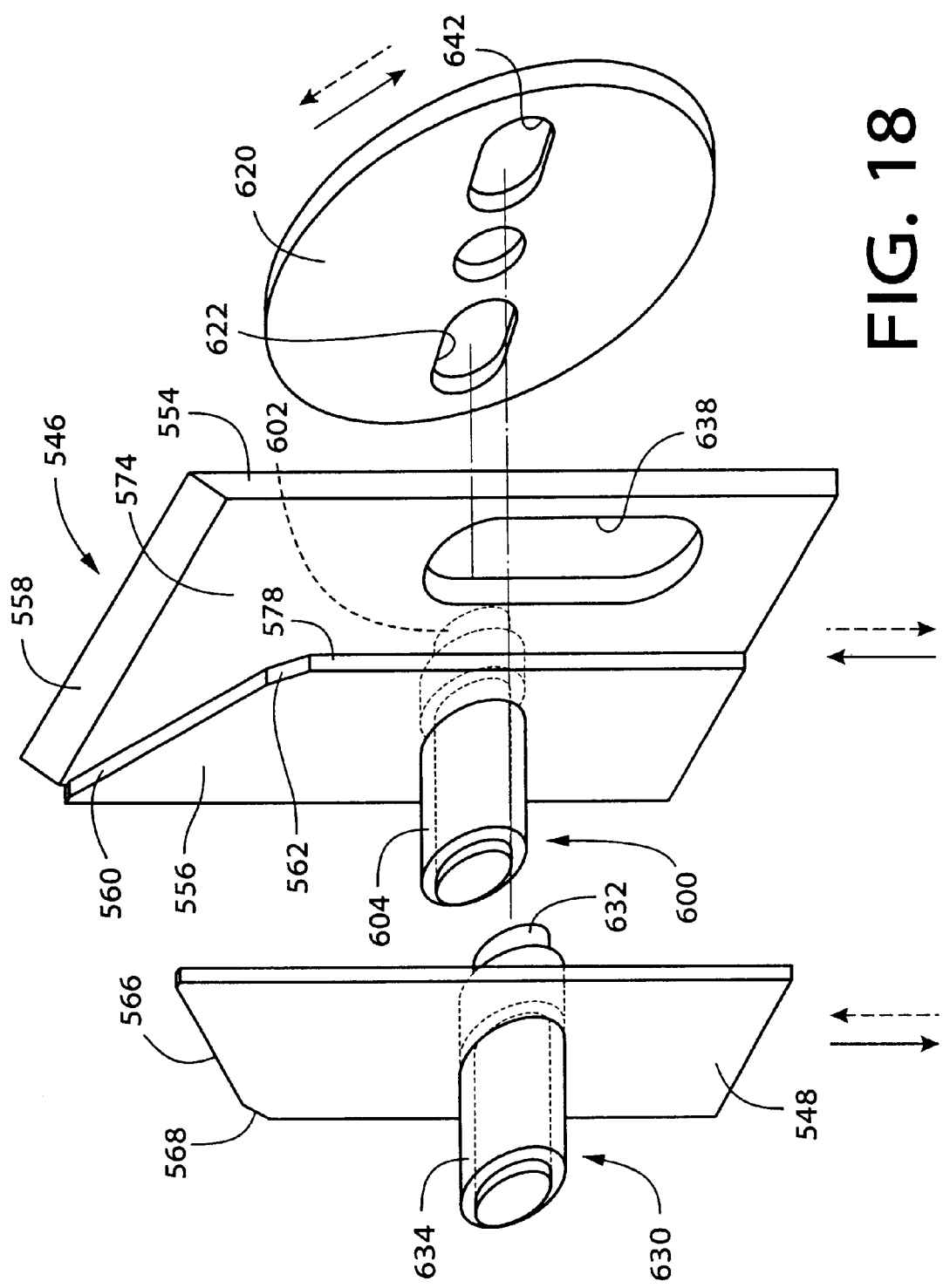
FIG. 18 is an exploded, perspective view of a first and a second movable guide member and a pivotable plate of an EC arranging and supplying apparatus as a fourth embodiment of the present invention.

The chute 470 has a rectangular transverse cross section corresponding to that of each EC 84. The first movable guide member 546 includes, as shown in FIG. 18, a long-side defining portion 554 and a short-side defining portion 556 which define one of the two long sides, and one of the two short sides, of a rectangle corresponding to the rectangular transverse cross section of each EC 84 or the chute 470, respectively. The long-side defining portion 554 has, as shown in FIGS. 19 and 21, the same thickness as the depth (i.e., thickness) of the recess 510 of the second member 484 (as measured in a horizontal direction), and has the same width as the width of the recess 510, and is fitted in the recess 510. The short-side defining portion 556 has a width smaller than that of the long-side defining portion 554, and has the same thickness as the depth of the recess 530 of the third member 486, and is fitted in the recess 530.

The long-side defining portion 554 has, as shown in FIGS. 18 and 20, an inclined upper surface 558 which is inclined outward away from the short-side defining portion 556 as it extends upward. The short-side defining portion 556 is formed integrally with the long-side defining portion 554, such that the short-side defining portion 556 is located below the inclined surface 558 of the long-side defining portion 554. An upper surface of the short-side defining portion 556 is defined by two inclined surfaces 560, 562 which are inclined in respective directions corresponding to the direction of inclination of the inclined surfaces 504, 524 as part of the bottom surface of the hopper 480. The angle of inclination of the upper inclined surface 560 is somewhat greater than that of the inclined surfaces 504, 524, and the angle of inclination of the lower inclined surface 562 is greater than that of the upper inclined surface 560.

The second movable guide member 548 has a plate-like shape, has the same thickness as that of the short-side defining portion 556 of the first movable guide member 546, and defines to the other short side of the rectangle corresponding to the rectangular transverse cross section of each EC 84 or the chute 470. The second movable guide member 548 has a width smaller than that of the long-side defining portion 554 of the first movable guide member 546, and is movably fitted in the recess 530 of the third member 486 such that the second movable guide member 548 is distant from the short-side defining portion 556 by a distant substantially equal to the length of the long sides of the above-indicated rectangle. An upper surface of the second movable guide member 548 is defined by two inclined surfaces 566, 568 which are inclined in respective directions corresponding to the direction of inclination of the inclined surfaces 508, 528 as part of the bottom surface of the hopper 480. The angle of inclination of the upper inclined surface 566 is somewhat greater than that of the inclined surfaces 508, 528, and the angle of inclination of the lower inclined surface 568 is greater than that of the upper inclined surface 566. In the present embodiment, the angle of inclination of the inclined surfaces 566, 568 is equal to that of the inclined surfaces 560, 562 of the short-side defining portion 556.

The third member 486 which provides a stationary guide member defines the other long side of the rectangle corresponding to the rectangular transverse cross section of each EC 84 or the chute 470. The first and second movable guide members 546, 548 and the third member 486 cooperate with one another to define a guide hole 570 which has a rectangular transverse cross section long in the lengthwise direction of the EC feeder, and which extends in a vertical direction. The first and second movable guide members 546, 548 and the third member 486 cooperate with one another to provide a guide 572. An upper surface of the guide 572 is defined by respective portions of the inclined surfaces 524, 526, 528 of the third member 486 that are located opposite to the hopper 480; the inclined surface 558 of the long-side defining portion 554 of the first movable guide member 546; the inclined surfaces 560, 562 of the short-side defining portion 556 of the same 546; and the inclined surfaces 566, 568 of the second movable guide member 548, and is inclined in respective directions corresponding to those of inclination of the bottom surface of the hopper 480.

Thus, the guide 572 includes the four portions corresponding to the four sides of the rectangle corresponding to the rectangular transverse cross section of each EC 84 or the chute 470. The long-side defining portion 554 and the third member 486 cooperate with each other to provide a first pair of portions, and the short-side defining portion 556 and the second movable guide member 548 cooperate with each other to provide a second pair of portions. A vertical surface of the long-side defining portion 554 that is continuous with the inclined surface 558 thereof and a vertical surface of the recess 530 of the third member 486 correspond to the two long sides, as a first pair of sides, of the above-indicated rectangle and provide a first pair of vertical guide surfaces 574, 576 as a first pair of planar surfaces, respectively, which are parallel to an axial direction of the guide 572. The respective inclined surfaces 558, 526 of the long-side defining portion 554 and the third member 486, respectively provided at the upper ends of the first vertical guide surfaces 574, 576, cooperate with each other to provide a first pair of inclined surfaces. Thus, the long-side defining portion 554 has the first vertical guide surface 574 as one of the first planar surfaces, and the inclined surface 558 as one of the first inclined surfaces; and the third member 486 has the first vertical guide surface 576 as the other first planar surface, and the inclined surface 526 as the other first inclined surface.

In addition, a vertical surface of the short-side defining portion 556 that is continuous with the inclined surfaces 560, 562 thereof and a vertical surface of the second movable guide member 548 that is continuous with the inclined surfaces 566, 568 thereof correspond to the two short sides, as a second pair of sides, of the above-indicated rectangle and provide a second pair of vertical guide surfaces 578, 580 as a second pair of planar surfaces, respectively, which are parallel to the axial direction of the guide 572. The respective inclined surfaces 560, 562, 566, 568 of the short-side defining portion 556 and the second movable guide member 548, respectively provided at the upper ends of the second vertical guide surfaces 578, 580, cooperate with each other to provide two second pairs of inclined surfaces. Thus, the short-side defining portion 556 has the second vertical guide surface 578 as one of the second planar surfaces, and the inclined surfaces 560, 562 as the one pair of second inclined surfaces; and the second movable guide plate 548 has the second vertical guide surface 580 as the other second planar surface, and the inclined surfaces 566, 568 as the other pair of second inclined surfaces. The first and second vertical guide surfaces 574, 576, 578, 580 cooperate with one another to provide a narrowest portion 590 which has the same rectangular transverse cross section as that of each EC 84 or the chute 470, has the smallest dimensions of the guide hole 570, and communicates with the chute 470.

An engaging pin 600 is fitted in, and fixed to, the first movable guide member 546, as shown in FIGS. 18, 19, and 20, such that the engaging pin 600 extends perpendicularly to the direction of movement of the guide member 546 and such that opposite end portions of the pin 600 project outward from the long-side and short-side defining portions 554, 556, respectively, and provide two engaging portions 602, 604, respectively. A sleeve 606 is fitted on the engaging portion 604 which projects from the short-side defining portion 556 on the side of the third member 486, and the engaging portion 604 is fitted via the sleeve 606 in an elongate hole 610 formed in a cam lever 608, such that the engaging portion 604 is movable in the elongate hole 610 relative to the cam lever 608. When a link (not shown) of the EC feeder is elevated and lowered, the cam lever 608 is pivoted, like the cam lever 290 employed in the first embodiment, and accordingly the first movable guide member 546 is moved up and down. The third member 486 has an elongate hole 612 in which the engaging portion 604 is fitted such that the portion 604 is vertically movable relative to the third member 486.

The engaging portion 602 which projects from the long-side defining portion 554 is fitted in an elongate hole 614 formed in the second member 484, such that the engaging portion 602 is movable in the elongate hole 614 relative to the second member 484, and additionally is fitted in an elongate hole 622 formed in a pivotable plate 620 as a pivotable member, such that the engaging portion 602 is movable in the elongate hole 622 relative to the pivotable plate 620. The pivotable plate 620 has a circular shape, is fitted in a circular recess 624 formed in the second member 484, and is pivotally fitted on, and supported by, an axis portion 626 projecting from the second member 484, such that the plate 60 is pivotable about an axis line perpendicular to the axial direction of the guide 572. The elongate hole 622 extends radially of the circular pivotable plate 620. The long-side defining portion 554 has an elongate hole 628 for avoiding interference with the axial portion 626 of the pivotable plate 620. The pivotable plate 620 is covered by a member (not shown) as part of the EC feeder that corresponds to the third member 74 employed in the first embodiment, so that the plate 620 is prevented from coming off the circular recess 624 of the second member 484.

An engaging pin 630 is fitted in, and fixed to, the second movable guide member 548, such that the engaging pin 630 extends perpendicularly to the direction of movement of the guide member 548 and such that opposite end portions of the pin 630 project outward from the guide member 548 and provide two engaging portions 632, 634, respectively. A sleeve 635 is fitted on the engaging portion 634 which projects on the side of the third member 486, and the engaging portion 634 is fitted via the sleeve 635 in a vertically elongate hole 636 formed in the third member 486, such that the engaging portion 634 is movable in the elongate hole 636 relative to the third member 486. The engaging portion 632 which projects on the side of the second member 484 extends through an elongate hole 638 formed in the long-side defining portion 554 of the first movable guide member 546, is fitted in an elongate hole 640 formed in the second member 484 such that the engaging portion 632 is movable in the elongate hole 640 relative to the second member 484, and additionally is fitted in another elongate hole 642 formed in the pivotable plate 620. The two elongate holes 622, 642 are diametrically opposite to each other with respect to the center of the pivotable plate 620. A distance between a position where the engaging pin 600 of the first movable guide member 546 is engaged with the pivotable plate 620, and the axis line about which the plate 620 is pivotable is equal to a distance between a position where the engaging pin 630 of the second movable guide member 548 is engaged with the pivotable plate 620, and the axis line of pivotal motion of the plate 620.

When the cam lever 608 is pivoted, the first movable guide member 546 is moved first upward and then downward, and the pivotable plate 620 is pivoted first forward and then backward, so that the second movable guide member 548 is moved first downward and then upward, that is, in the directions opposite to those of movement of the first member 546, at the same speed and by the same distance as the speed and the distance at which and by which the first member 546 is moved. In the present embodiment, the pivotable plate 620 cooperates with the engaging pins 600, 630 as cam followers and the cam lever 608 as a cam to provide a movable-guide-member moving device.

When the first and second movable guide members 546, 548 are thus moved in opposite directions, respectively, an upper end portion of each of the inclined surfaces 560, 566 is moved up and down above and below a boundary 646 between the inclined surface 526 of the third member 486 and a corresponding one 576 of the first vertical guide surfaces 574, 576. Therefore, a space defined by, and between, the two first vertical guide surfaces 574, 576 as the two first planar surfaces, in a direction parallel to the short sides of the rectangle corresponding to the rectangular transverse cross section of the chute 470, is defined, in a direction parallel to the long sides of the same rectangle, by, and between, the two inclined surfaces 560, 566, or one of the two inclined surfaces 560, 566 and an opposite one of two opposed surfaces of the third member 486 that are opposed to each other in the lengthwise direction of the hopper 480 in which the two inclined surfaces 560, 566 are also opposed to each other. In the present embodiment, this space takes, in the direction parallel to the long sides of the rectangle, a maximum distance between the two inclined surfaces 560, 566, or one of the two inclined surfaces 560, 566 and an opposite one of the two opposed surfaces of the third member 486, at a certain time while the first and second movable guide members 546, 548 are moved in opposite directions, respectively, and the maximum distance is about eight times longer than the dimension of the long sides of the rectangle.

Although being not described or illustrated in detail, a connection portion 650 (FIG. 22) like the connection portion employed in each of the first to third embodiments is provided between an end portion of the guide hole 570 that is located on the side of the chute 470, and the initial end portion of the chute 470. While the first and second movable guide members 546, 548 are moved up and down, the connection portion 650 continues to define a continuous guide surface in a lengthwise direction of the chute 470. Thus, each EC 84 is smoothly fed from the guide hole 570 to the chute 470.

In the present embodiment, the first and second movable guide members 546, 548 are moved in synchronism with the EC taking operation of an EC suction head (not shown), and in this way the ECs 84 are introduced into the chute 470. In the state in which the EC feeder is not operated to supply the ECs 84, the cam lever 608 is positioned at a first pivotal position, the first movable guide member 546 is positioned at a lower-dead position thereof, and the second movable guide member 548 is positioned at an upper-dead position thereof, as shown in FIG. 19. Meanwhile, when the cam lever 608 is pivoted to a second pivotal position, as shown in FIG. 22, the first movable guide member 546 is moved upward. As the first movable guide member 546 is moved upward, the pivotable plate 620 is pivoted in a direction indicated at solid arrow in FIG. 18, so that the second movable guide member 548 is moved downward. Then, when the cam lever 608 is pivoted from the second pivotal position to the first pivotal position, the first movable guide member 546 is moved downward, and the pivotable plate 620 is pivoted in an opposite direction indicated at broken arrow, so that the second movable guide member 548 is moved upward.

Thus, the first and second movable guide members 546, 548 are moved in opposite directions, respectively. Therefore, when the first movable guide member 546 is moved upward, as shown in FIG. 24(A), to lift up some ECs 84 in an upper portion of the guide hole 570 and the bottom portion 540 of the hopper 480, the second movable guide member 548 is moved downward. When the second member 548 is moved downward, a space is positively created above the second member 548, so that some ECs 84 around the second member 548 can easily move into the created space, which contributes to prevent the ECs 84 from making a bridge. In addition, the force applied to the ECs 84 from the first member 546 moving upward may be considerably small, which contributes to preventing the ECs 84 from being damaged. Moreover, even through there may be some ECs 84 each lying in a horizontal posture or a posture near the horizontal posture, that posture of each EC 84 is changed to such a posture which enables the each EC 84 to enter the narrowest portion 590 of the guide hole 570. This is the case with FIG. 24(B) in which the first member 548 is moved downward and the second member 548 is moved upward.

As the ECs 84 in the lowest portion of the bottom portion 540 of the hopper 480 are moved downward, the ECs 84 are guided by the inclined surfaces 526, 558, 560, 562, 566, 568, so that the ECs 84 are introduced into the narrowest portion 590 of the guide hole 570 and then are moved by gravity into the chute 470. In the state in which the inclined surfaces 560, 562, 566, 568 are entirely positioned between the two first vertical guide surfaces 574, 576, those surfaces 560, 562, 566, 568 can reliably guide the ECs 84. As described above, the space which is defined between the two first vertical guide surfaces 574, 576 in the direction parallel to the short sides of the above-indicated rectangle, and is defined, in the direction parallel to the long sides of the same rectangle, between the two inclined surfaces 560, 566, or one of the two inclined surfaces 560, 566 and an opposite one of the two opposed surfaces of the third member 486, takes, in the direction parallel to the long sides of the rectangular cross section, a maximum distance between the two inclined surfaces 560, 566, or one of the two inclined surfaces 560, 566 and the opposite one of the two opposed surfaces of the third member 486, at a certain time while the first and second movable guide members 546, 548 are moved in opposite directions, respectively, and the maximum distance is sufficiently long, i.e., about eight times longer than the dimension of the long sides of the rectangle. Thus, each of the ECs 84 can easily enter the space between the two first vertical guide surfaces 574, 576 and then the narrowest portion 590 of the guide hole 570.

Figure 25:
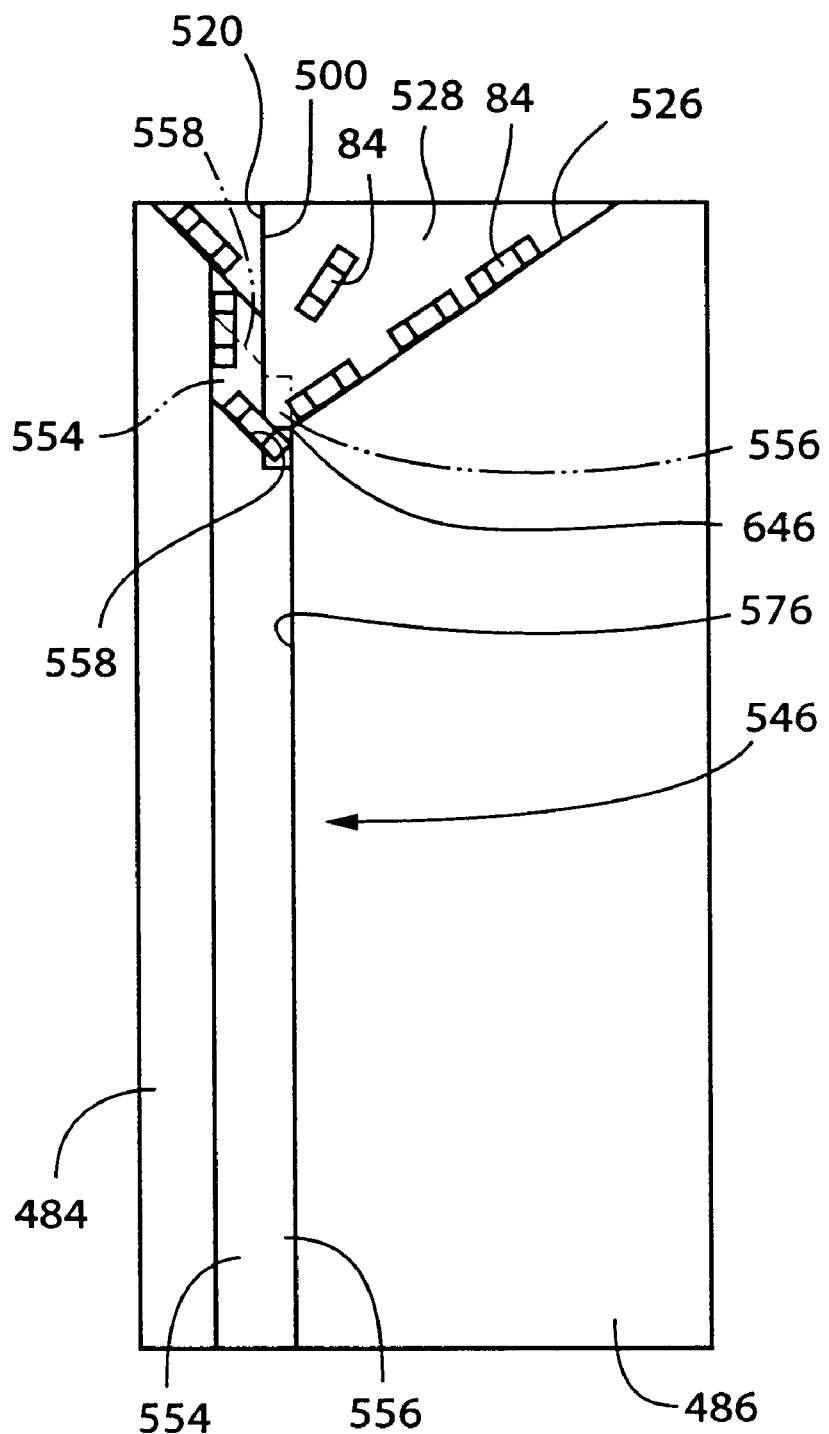
FIG. 25 is a side elevation view for explaining the manner in which the ECs stored in the hopper enter the guide hole in the EC arranging and supplying apparatus of FIG. 18.

As shown in FIG. 25, the upper end portion of the guide hole 570 is partly defined by both the vertical contact surface 500 of the second member 484, and the inclined surface 526 of the third member 486 that is inclined relative to the contact surface 500. Therefore, the ECs 84 are caused to move or slide along both the vertical and inclined surfaces 500, 526 toward the narrowest portion 590. Thus, the ECs 84 do not prevent one another from moving into the narrowest portion 590.

Furthermore, since the first and second movable guide members 546, 548 are moved in opposite directions, respectively, the stroke of each of the two members 546, 548 can be decreased, and accordingly the speed of movement of each EC 84 caused by the movement of the two members 546, 548 can be decreased. Therefore, each EC 84 can be easily fed to the EC-supply portion of the EC feeder, without being delayed from a timing at which the each EC 84 is to be sucked and held by the EC-suction head. In addition, each EC 84 is effectively prevented from being damaged.

A fifth embodiment of the present invention will be described by reference to FIGS. 26 to 32. In the present embodiment, a guide for introducing ECs stored in a hopper, into a chute, is provided by four members three of which are movable. In addition, one of the three movable guide members that defines one of two long sides of a rectangle corresponding to a rectangular transverse cross section of the chute, and the other two movable guide members that define two short sides of the same rectangle, respectively, are moved relative to each other in opposite directions, respectively. Since the other features of the present embodiment are the same as those of the embodiment shown in FIGS. 18 to 25, the same reference numerals as used in the fourth embodiment shown in FIGS. 18 to 25 are used to designate the corresponding elements of the present embodiment and the description of those elements is omitted.

A movable-guide-member receiving hole 544 defined by a second and a third member 484, 486 which are assembled with each other, receives a first, a second, and a third movable guide plate 700, 702, 804 such that each of the guide plates 700, 702, 704 is movable up and down. The first movable guide plate 700 has the same width and thickness as the width and depth of a recess 510 as part of the receiving hole 544, respectively, and is fitted in the recess 510. The first plate 700 defines one of two long sides of a rectangle corresponding to a rectangular transverse cross section of a chute 470, and has an inclined upper surface 706 which is inclined outward away from the second and third movable guide plates 702, 704 as it extends downward.

The second movable guide plate 702 defines one of two short sides of the rectangle corresponding to the rectangular transverse cross section of the chute 470, has a width smaller than that of the movable-guide-member receiving hole 544, and a thickness equal to the depth of a recess 530 which cooperates with the recess 510 to define the receiving hole 544, and is fitted in the recess 530. The second plate 702 has two inclined upper surfaces 708, 710 which are inclined by different angles, respectively. The third movable guide plate 704 defines the other short side of the rectangle corresponding to the rectangular transverse cross section of the chute 470, has a width smaller than that of the movable-guide-member receiving hole 544, and a thickness equal to the depth of a recess 530, and is fitted in the recess 530 such that a space having a dimension substantially equal to the length of the long sides of the rectangle is left between the second and third plates 702, 704. The third plate 704 has two inclined upper surfaces 712, 714 which are inclined by different angles, respectively.

The third member 486 which provides a stationary guide member defines the other long side of the rectangle corresponding to the rectangular transverse cross section of the chute 470. In the state in which the movable-guide-member receiving hole 544 receives the first, second, and third movable guide plates 700, 702, 704, a guide hole 720 is defined which has a rectangular transverse cross section long in the lengthwise direction of the EC feeder and which extends in a vertical direction. Thus, the third member 486 and the first, second, and third plates 700, 702, 704 cooperate with one another to provide a guide 722. The first movable guide plate 700 has the first vertical guide surface 724 as one of the first planar surfaces and the inclined surface 706 as one of the first inclined surfaces; and the third member 386 has the first vertical guide surface 726 as the other first planar surface and the inclined surface 526 as the other first inclined surface.

In the present embodiment, the guide 722 includes the four portions corresponding to the four sides of the rectangle corresponding to the rectangular transverse cross section of the chute 470, i.e., each EC 84. The first movable guide plate 700 and the third member 486 cooperate with each other to provide a first pair of portions, and the second and third movable guide plates 702, 704 cooperate with each other to provide a second pair of portions. A vertical surface of the first plate 700 that is continuous with the inclined surface 706 thereof and a vertical surface of the recess 530 of the third member 486 correspond to the two long sides, as a first pair of sides, of the above-indicated rectangle and provide a first pair of vertical guide surfaces 724, 726 as a first pair of planar surfaces, respectively, which are parallel to an axial direction of the guide 722. The respective inclined surfaces 706, 526 of the first plate 700 and the third member 486, respectively provided at the upper ends of the first vertical guide surfaces 724, 726, cooperate with each other to provide a first pair of inclined surfaces. The second movable guide plate 702 has the second vertical guide surface 724 as one of the first planar surfaces and the inclined surfaces 708, 710 as the one pair of second inclined surfaces; and the third movable guide member 704 has the second vertical guide surface 730 as the other second planar surface and the inclined surfaces 712, 714 as the other pair of second inclined surfaces.

In addition, a vertical surface of the second plate 704 that is continuous with the inclined surfaces 708, 710 thereof and a vertical surface of the third movable guide member 704 that is continuous with the inclined surfaces 712, 714 thereof correspond to the two short sides, as a second pair of sides, of the above-indicated rectangle and provide a second pair of vertical guide surfaces 728, 730 on a second pair of planar surfaces, respectively, which are parallel to the axial direction of the guide 722. The respective inclined surfaces 708, 710, 712, 714 of the second and third movable guide members 702, 704, respectively provided at the upper ends of the second vertical guide surfaces 728, 730, cooperate with each other to provide two second pairs of inclined surfaces. The first and second vertical guide surfaces 724, 726, 728, 730 cooperate with one another to provide a narrowest portion 738 which has the same rectangular transverse cross section as that of the chute 470, i.e., each EC 84, has the smallest dimensions of the guide hole 720, and communicates with the chute 470.

Figure 26:
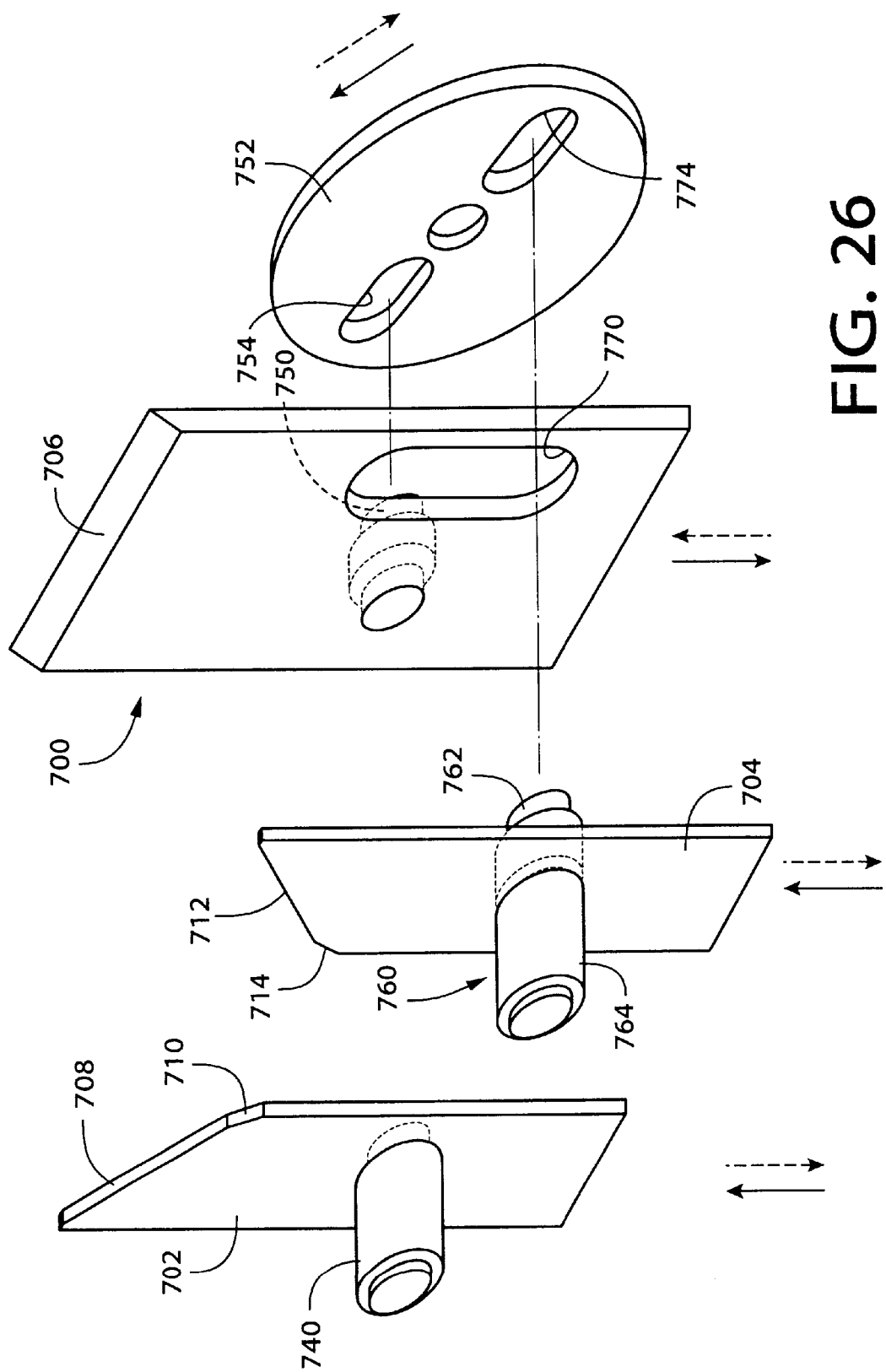
FIG. 26 is an exploded, perspective view of a first, a second, and a third movable guide member and a pivotable plate of an EC arranging and supplying apparatus as a fifth embodiment of the present invention.
Figure 27:
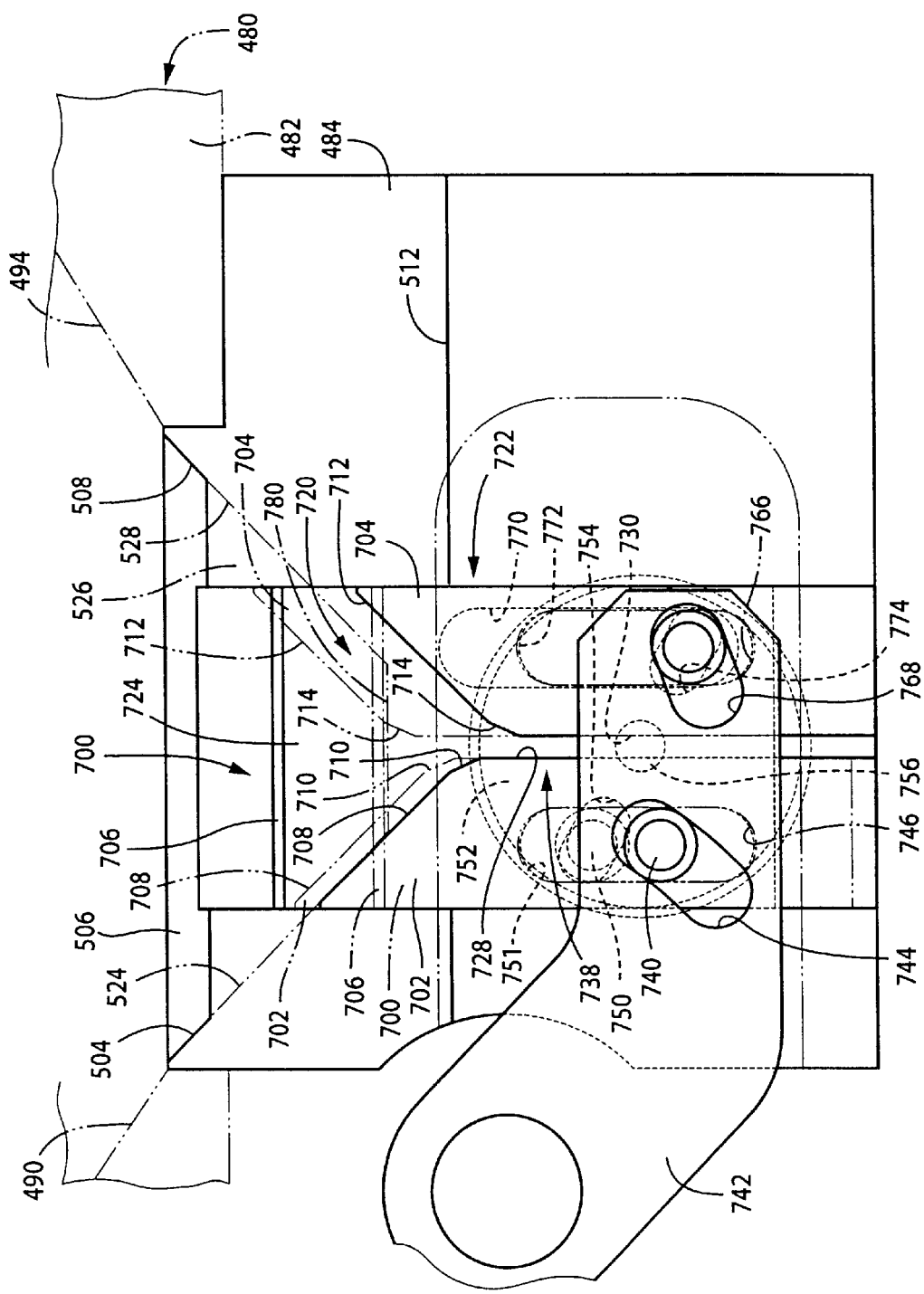
FIG. 27 is a front elevation view showing a guide hole defined by the first, second, and third movable guide members in the EC arranging and supplying apparatus of FIG. 26, without showing a third member.
Figure 28:
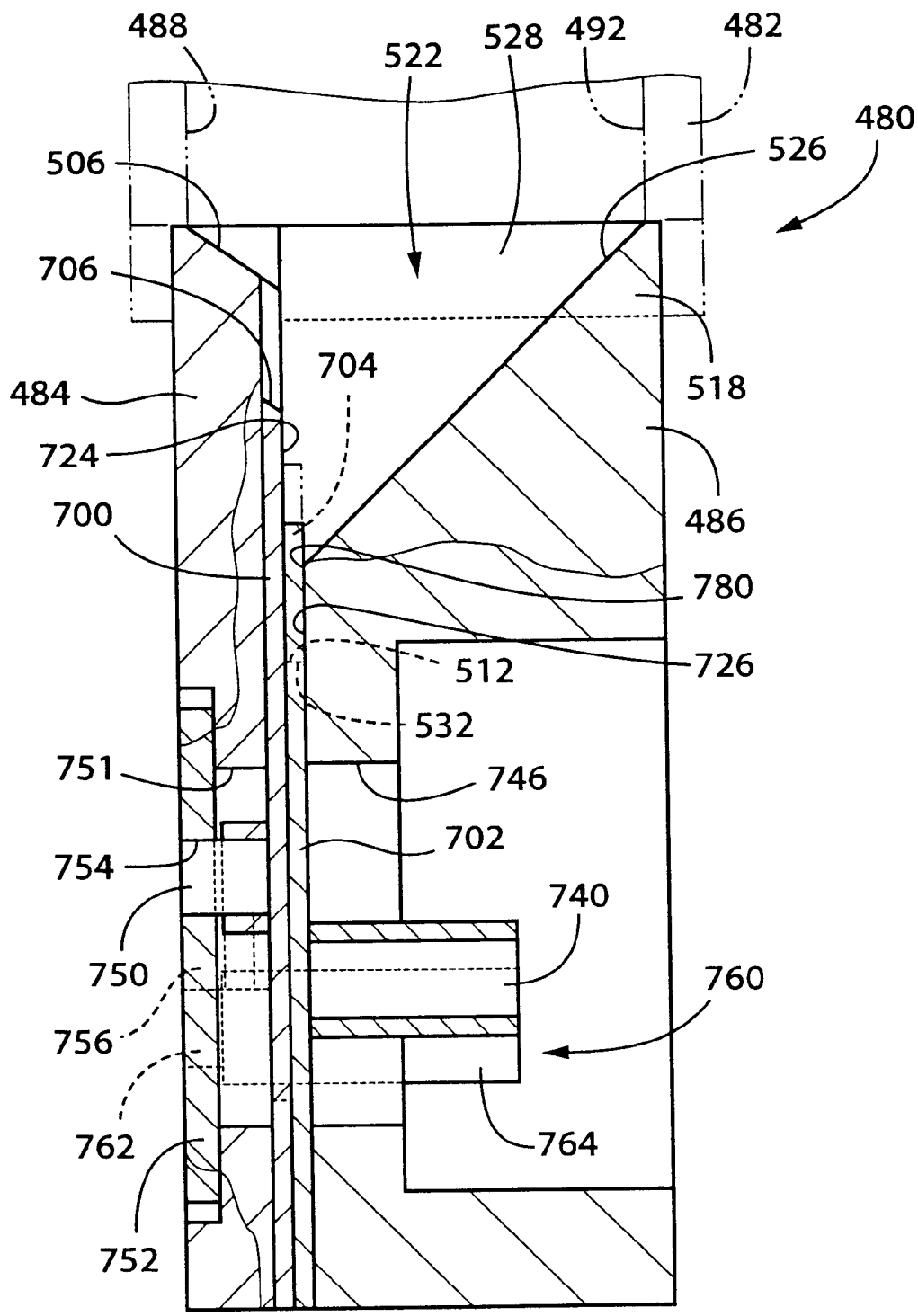
FIG. 28 is a cross-sectioned, side elevation view of the EC arranging and supplying apparatus of FIG. 26, taken along a vertical plane passing through the second movable guide member.

The second movable guide plate 702 has, as shown in FIGS. 26 to 28, an engaging pin 740 as an engaging portion that projects in a direction away from the first movable guide plate 700 and perpendicular to the direction of movement of the second plate 702. The engaging pin 740 is fitted, as shown in FIG. 27, in an elongate hole 744 formed in a cam lever 742, such that the pin 740 is movable in the hole 744 relative to the cam lever 742. When the cam lever 742 is pivoted, the second plate 702 is moved up and down. The third member 486 has an elongate hole 746 in which the engaging pin 740 is fitted such that the pin 540 is vertically movable relative to the third member 486.

Figure 29:
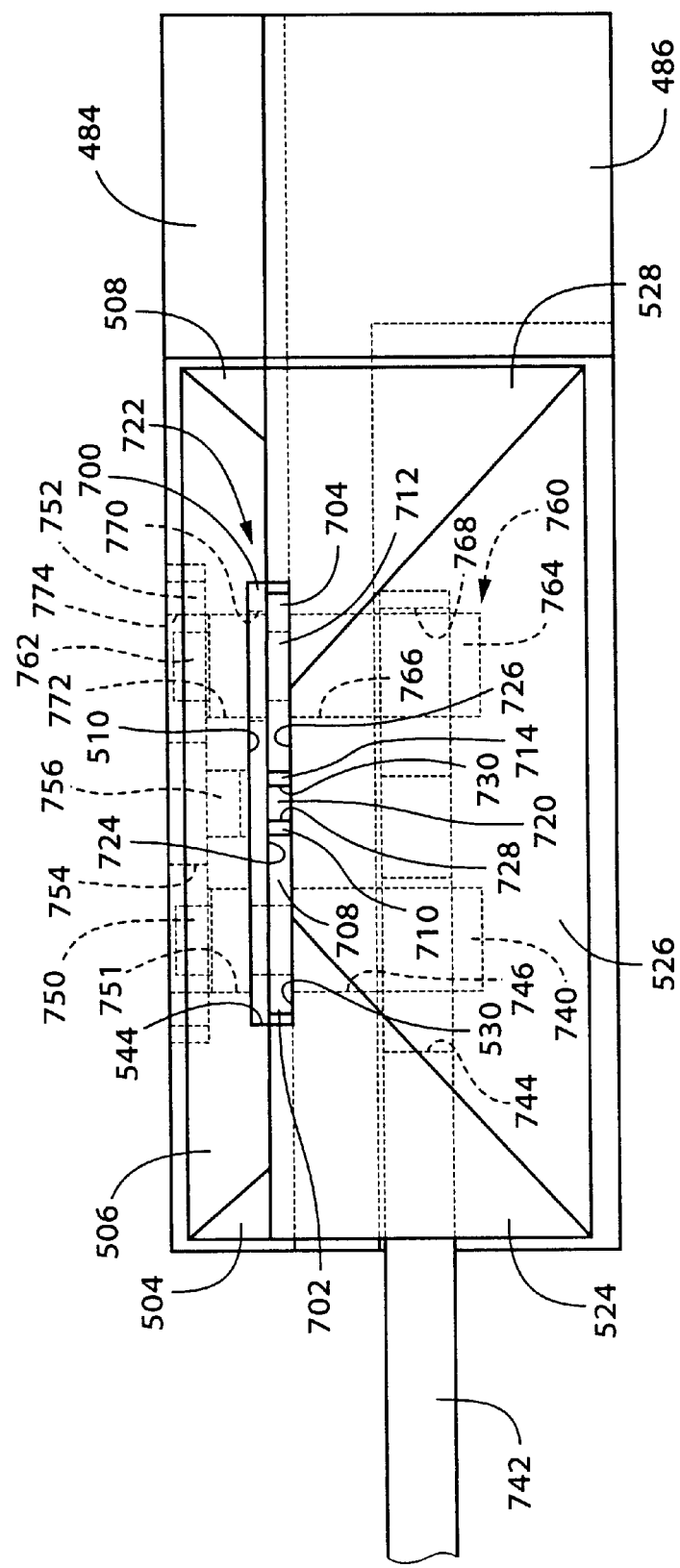
FIG. 29 is a plan view of the EC arranging and supplying apparatus of FIG. 26.

The first movable guide plate 700 has, as shown in FIGS. 28 and 29, an engaging pin 750 as an engaging portion that projects in a direction away from the second movable guide plate 702 and perpendicular to the direction of movement of the first plate 700. The engaging pin 750 is fitted in an elongate hole 751 formed in the second member 484, such that the pin 750 is movable in the hole 751 relative to the second member 484, and is fitted in an elongate hole 754 formed in a disc-like pivotable plate 752 as a pivotable member, such that the pin 750 is movable in the hole 754 relative to the pivotable plate 752. The pivotable plate 752 is pivotally fitted on, and supported by, an axial portion 756 projecting from the second member 484, such that the plate 752 is pivotable about an axis line perpendicular to the axial direction of the guide 722.

The third movable guide plate 704 has, as shown in FIGS. 26 and 29, an engaging pin 760 as an engaging portion that projects in a direction perpendicular to the direction of movement of the third plate 704. The engaging pin 760 has two end portions which project from the third plate 704 and which provide two engaging portions 762, 764, respectively. One 764 of the two engaging portions 762, 764 that projects away from the first plate 700 is fitted in an elongate hole 766 formed in the third member 486, such that the engaging portion 764 is movable in the hole 766 relative to the third member 484, and is fitted in another elongate hole 768 formed in the cam lever 742, such that the engaging portion 764 is movable in the hole 768 relative to the cam lever 764. The other engaging portion 762 passes through an elongate hole 770 formed in the first plate 700, is fitted in an elongate hole 772 formed in the second member 484 such that the engaging portion 762 is movable in the hole 772 relative to the second member 484, and is fitted in another elongate hole 774 formed in the pivotable plate 752 such that the engaging portion 762 is movable in the hole 774 relative to the pivotable plate 752. The two elongate holes 754, 774 of the pivotable plate 752 are diametrically opposite to each other, and a distance between a position where the engaging pin 760 of the third plate 704 is engaged with the pivotable plate 752 and the axis line of pivotal motion of the plate 752 is equal to a distance between a position where the engaging pin 750 of the first plate 700 is engaged with the plate 752 and the axis line of pivotal motion of the plate 752.

Figure 30:
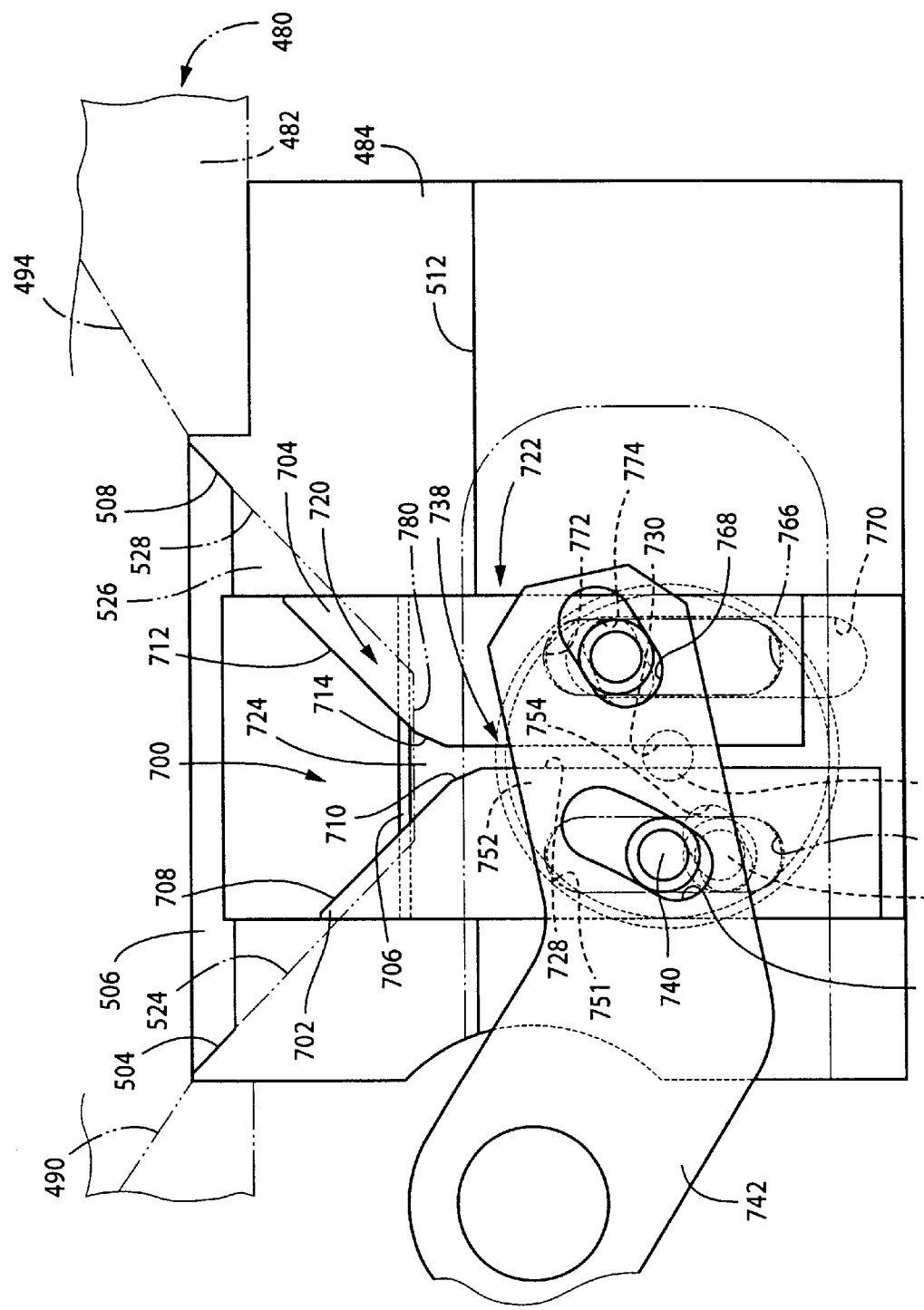
FIG. 30 is a view for explaining the manner of operation of the the first, second, and third movable guide members of the EC arranging and supplying apparatus of FIG. 26.
Figure 31:
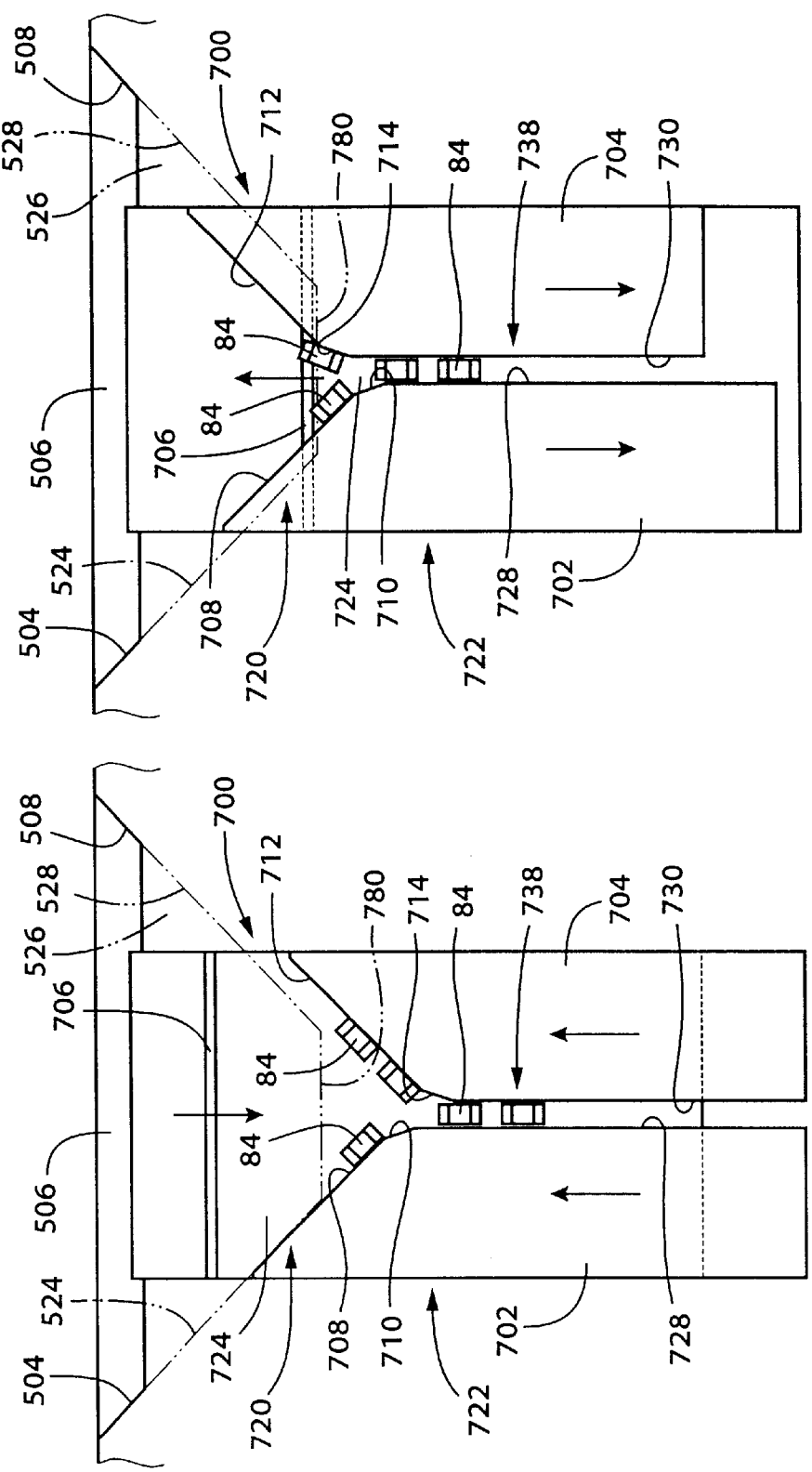
FIGS. 31A and 31B are front elevation views for explaining the manner in which ECs stored in a hopper enter the guide hole in the EC arranging and supplying apparatus of FIG. 26.

When the cam lever 742 is pivoted, the second and third movable guide plates 702, 704 are moved in the same direction but at different speeds, and the first movable guide plate 700 is moved in the opposite direction and at a speed which is equal to that of the third plate 704 but is different from that of the second plate 702. The respective inclined surfaces 708, 712 of the second and third plates 702, 704 are located, as shown in FIGS. 27 and 30, such that when the second and third plates 702, 704 are moved up and down, the two inclined surfaces 708, 712 vertically cross a boundary 780 between the inclined surfaces 524, 526, 528 of the third member 486 and a corresponding one 726 of the two first vertical guide surfaces 724, 726. In the present embodiment, the boundary 780 includes, as shown in FIG. 27, two inclined portions which are inclined, in the plane including the first vertical guide surface 726, by the same angles as those of inclination of the inclined surfaces 524, 528, and a horizontal portion which is located, in the same plane, between the two inclined portions. The first vertical guide surface 726 has, at two opposite end portions of the upper end portion thereof that are opposite to each other in the lengthwise direction of the EC feeder, two triangular portions the width of each of which decreases in an upward direction. A space which is defined by, and between, the two first vertical guide surfaces 724, 726, in a direction parallel to the short sides of the above-indicated rectangle, is defined, in a direction parallel to the long sides of the same rectangle, by, and between, the two inclined surfaces 708, 712, or one of the two inclined surfaces 708, 712 and an opposite one of the two opposed surfaces of the third member 486 that are opposed to each other in the direction parallel to the long sides of the rectangle. In the present embodiment, this space takes, in the direction parallel to the long sides of the rectangle, a maximum distance between the two inclined surfaces 708, 712, or one of the two inclined surfaces 708, 712 and an opposite one of the two opposed surfaces of the third member 486, at a certain timing while the second and third movable guide members 702, 704 are moved, and the maximum distance is about eleven times longer than the dimension of the long sides of the rectangle.

Figure 32:
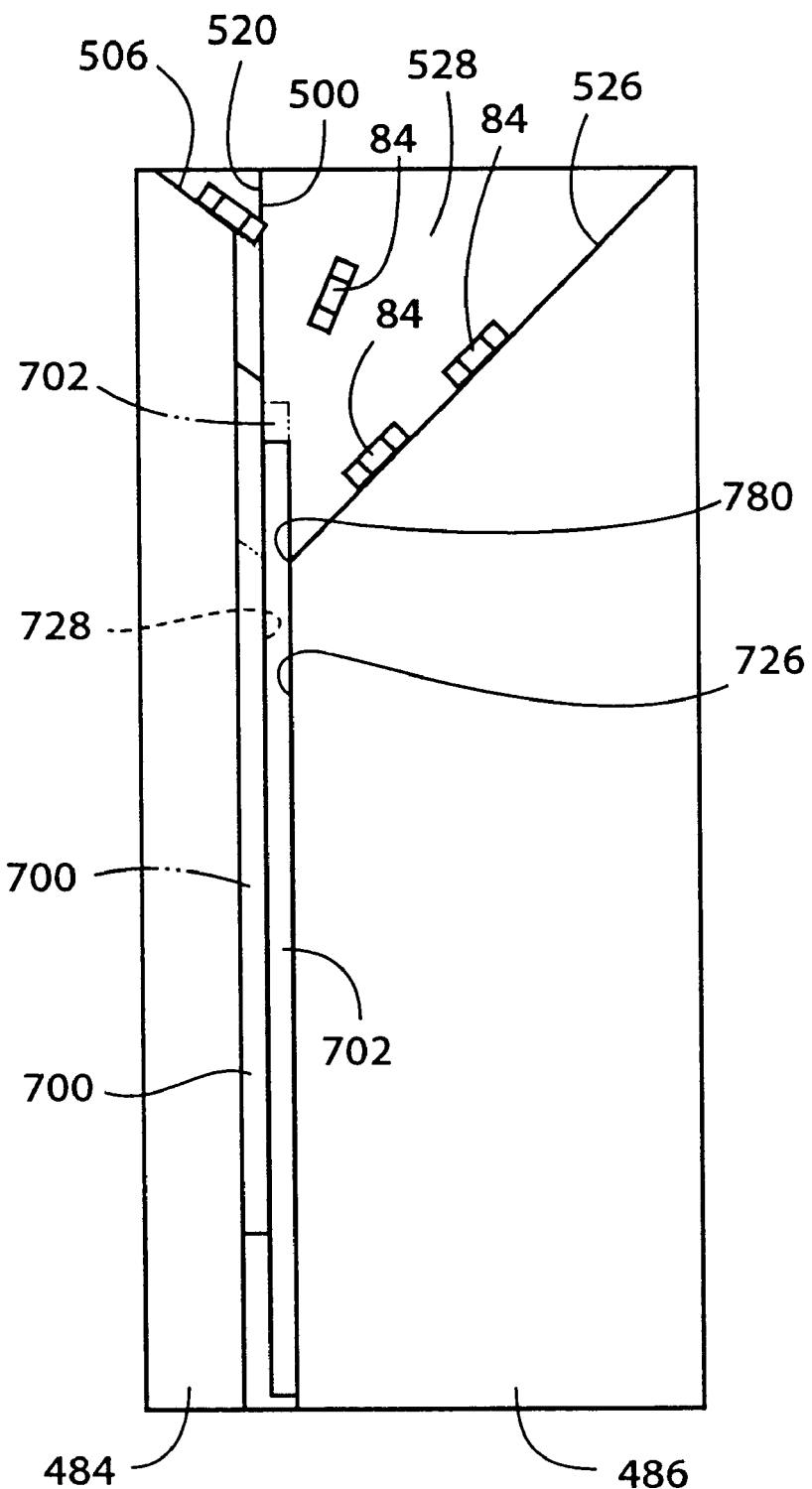
FIG. 32 is a side elevation view for explaining the manner in which the ECs stored in the hopper enter the guide hole in the EC arranging and supplying apparatus of FIG. 26.

In the present embodiment, when the cam lever 742 is pivoted, the second and third movable guide plates 702, 704 are directly moved upward and downward, and the upward and downward movements of the third plate 704 are transmitted to the first movable guide plate 700 via the pivotable plate 752, so that the first plate 700 is moved in directions opposite to the upward and downward directions of movement of the second and third plates 702, 704. The movement speed of the first plate 700 is the same as that of the third plate 704. In the state in which the first plate 700 is moved to its lower-dead position, the second member 484 guides the ECs 84 in place of the first plate 700. The respective movements of the first, second, and third plates 700, 702, 704 cooperate with one another to prevent the ECs 84 from making a bridge, thereby changing the respective postures of the ECs 84. Consequently the ECs 84 are guided, as shown in FIGS. 31(A), 31(B), and 32, by the inclined surface 526, etc., to enter the narrowest portion 738 of the guide hole 720.

Respective distances of the axis line of pivotal motion of the cam lever 742 from the respective positions where the second and third movable guide plates 702, 704 are engaged with the cam lever 742, differ from each other, so that the second and third plates 702, 704 are moved in the same direction but at different strokes and different speeds. More specifically described, the third plate 704 is moved at a greater stroke and a higher speed than those at which the second plate 702 is moved. Therefore, when the second and third plates 702, 704 are moved upward, the third plate 704 that is moved at a higher speed is moved up, as shown in FIG. 31(B), to its upper-dead position higher than that to which the second plate 702 is moved up. That is, the third plate 704 enters the mass of ECs 84 located above the second and third plates 702, 704, while pushing those ECs 84 toward the second plate 702. Thus, the third plate 704 can easily prevent the ECs 84 from making a bridge. Meanwhile, when the second and third plates 702, 704 are moved downward, the third plate 704 that is moved at a higher speed creates, as shown in FIG. 31(A), a wider space, thereby promoting the movement of the ECs 84 above the second and third plates 702, 704, and thereby preventing the ECs 84 from making a bridge.

The long-side defining portion 554 of the first movable guide member 546 employed in the fourth embodiment shown in FIGS. 18 to 25 has, in the upper end portion thereof, only the inclined surface 558 extending parallel to the two long sides of the rectangle corresponding to the rectangular transverse cross section of the chute 470. However, the first movable guide member 546 may be replaced with a different first movable guide member 800, shown in FIG. 33 relating to a sixth embodiment of the present invention, which includes a long-side defining portion 802 which has, in an upper end portion thereof, not only an inclined surface 806 which is inclined outward away from a short-side defining portion 804 as it extends upward, but also two inclined surfaces 808 which are formed in opposite end portions of the upper end portion in a direction parallel to the above-indicated long sides and which are inclined outward away from each other as they extend downward. In this embodiment, when the first guide member 800 is moved up to enter the mass of ECs 84, the inclined surfaces 808 push the mass of ECs 84 toward both sides of the first guide member 800, thereby preventing the ECs 84 from making a bridge.

Figure 34:
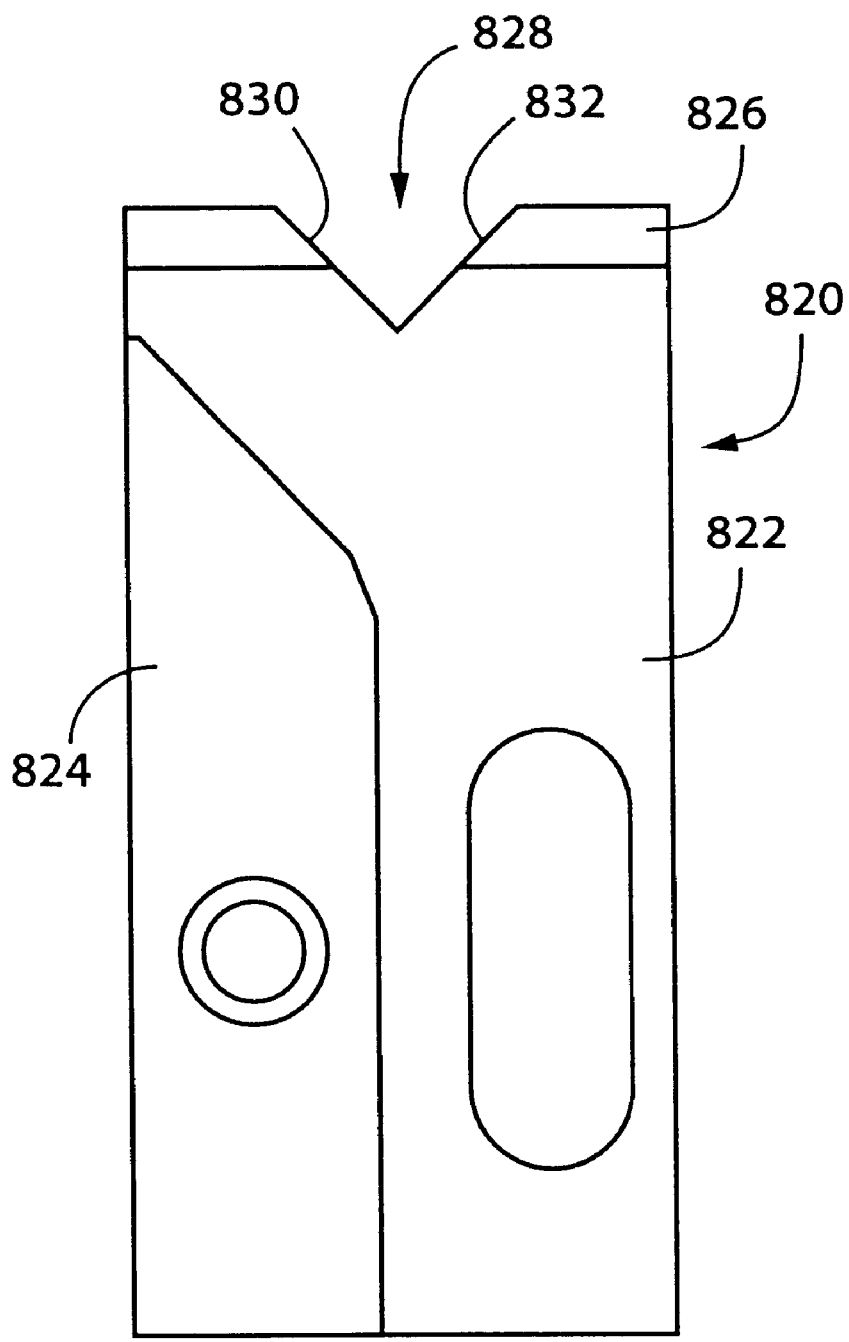
FIG. 34 is a front elevation view of a first movable guide member as part of a guide of an EC arranging and supplying apparatus as a seventh embodiment of the present invention.

FIG. 34 relating to a seventh embodiment of the present invention, shows a different first movable guide member 820 which may be used in place of the first movable guide member 546. The first guide member 820 includes a long-side defining portion 822 which has, in an upper end portion thereof, not only an inclined surface 826 which is inclined outward away from a short-side defining portion 824 or a third member (not shown) as it extends upward, but also a recess 828 which has a V-shaped cross section and which is formed in a middle portion of the upper end portion in a direction parallel to the two long sides of the above-indicated rectangle. In this embodiment, when the first guide member 820 is moved up to enter the mass of ECs 84, two inclined surfaces 830, 832 which cooperate with each other to define the recess 828 slowly enter the mass of ECs 84, thereby preventing the ECs 84 from making a bridge.

Figure 33:
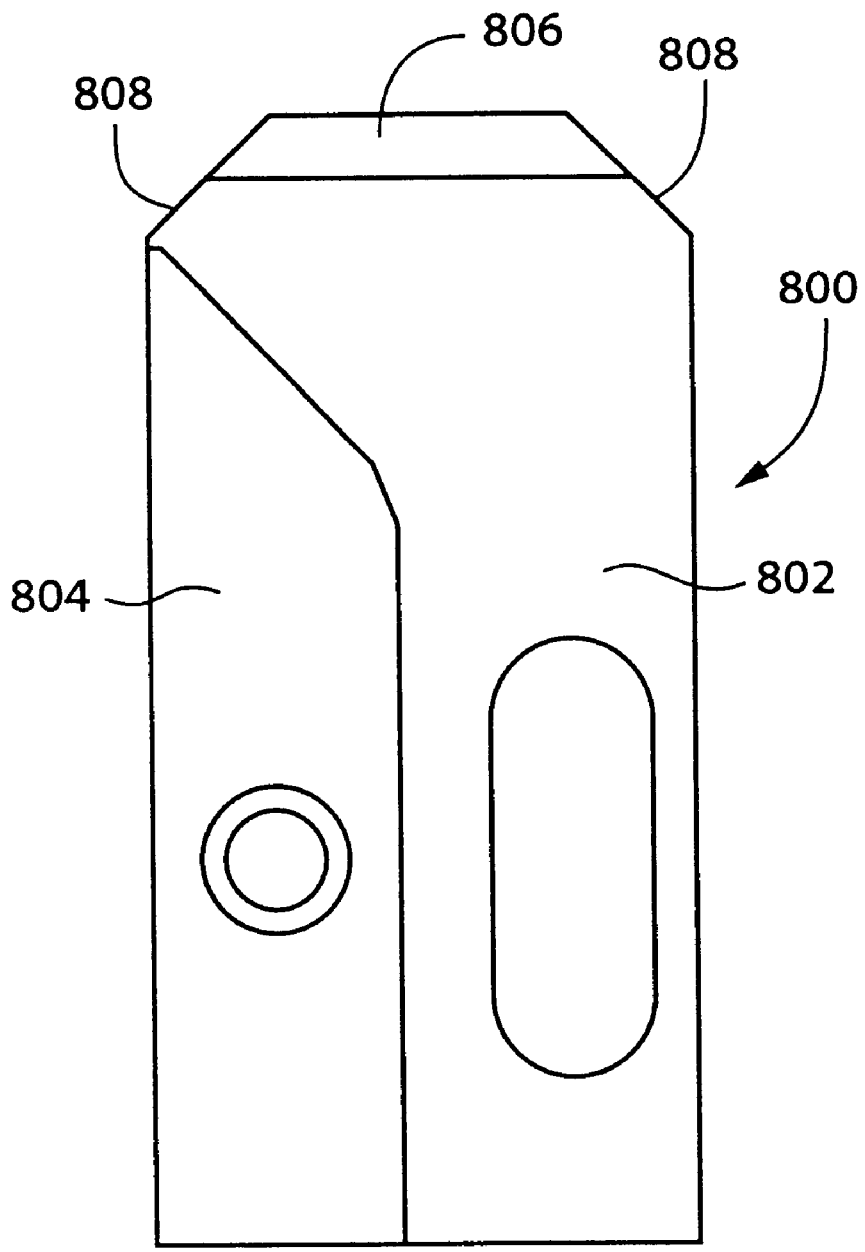
FIG. 33 is a front elevation view of a first movable guide member as part of a guide of an EC arranging and supplying apparatus as a sixth embodiment of the present invention.

The first movable guide member 800 or 820 shown in FIG. 33 or 34 may be used to replace the first movable guide member 700 employed in the fourth embodiment shown in FIGS. 26 to 32.

An eighth embodiment of the present invention will be described by reference to FIGS. 35 to 40. In the present embodiment, a guide 870 is provided by a first and a second movable guide member 872, 874 shown in FIG. 35 and a second and a third member 876, 878, shown in FIG. 37, of a first, the second member 876, and the third member 878 which cooperate with one another to provide a hopper.

Figure 36:
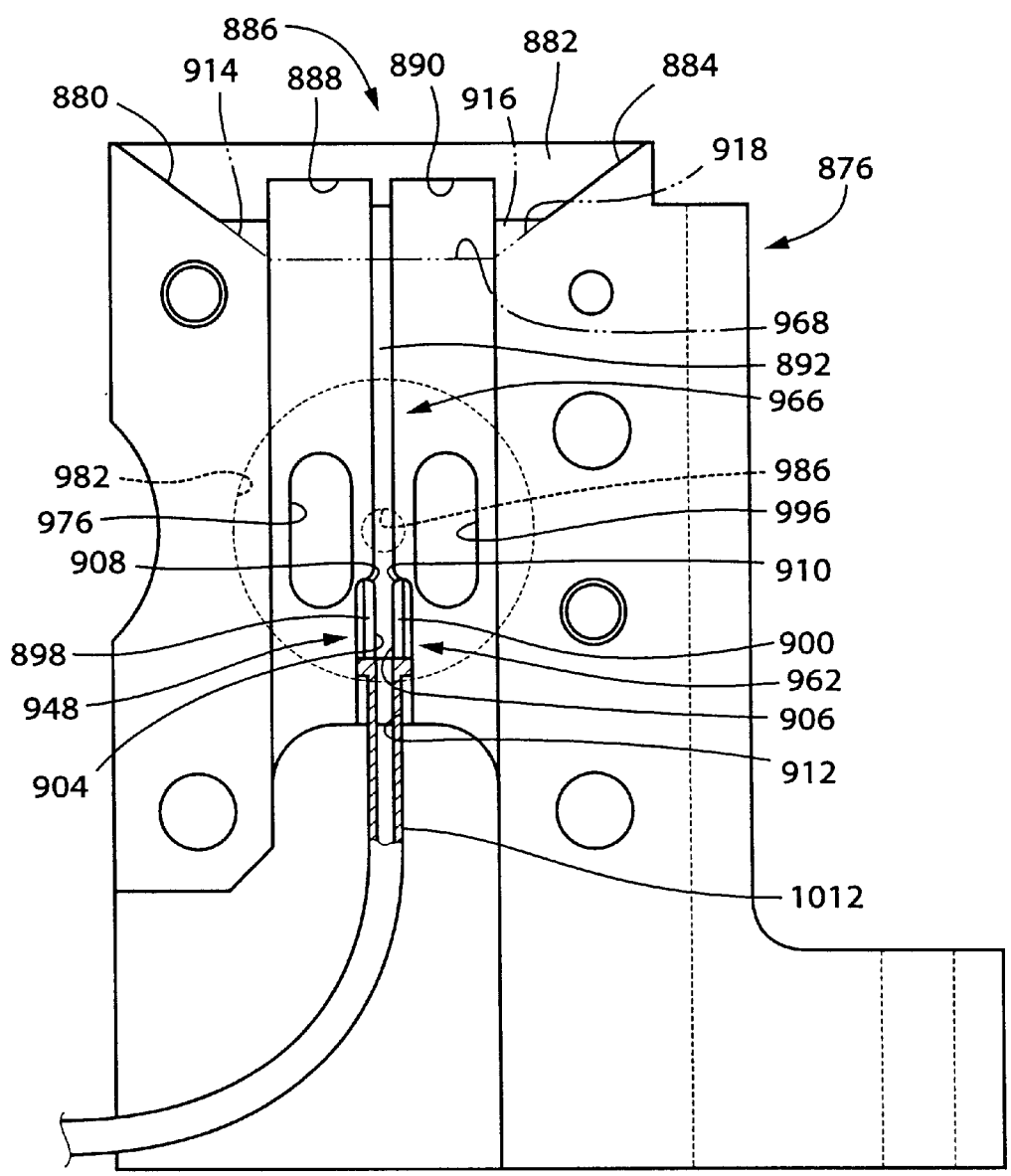
FIG. 36 is a partly cross-sectioned, front elevation view of a second member of the EC arranging and supplying apparatus whose movable guide members are shown in FIG. 35.
Figure 37:
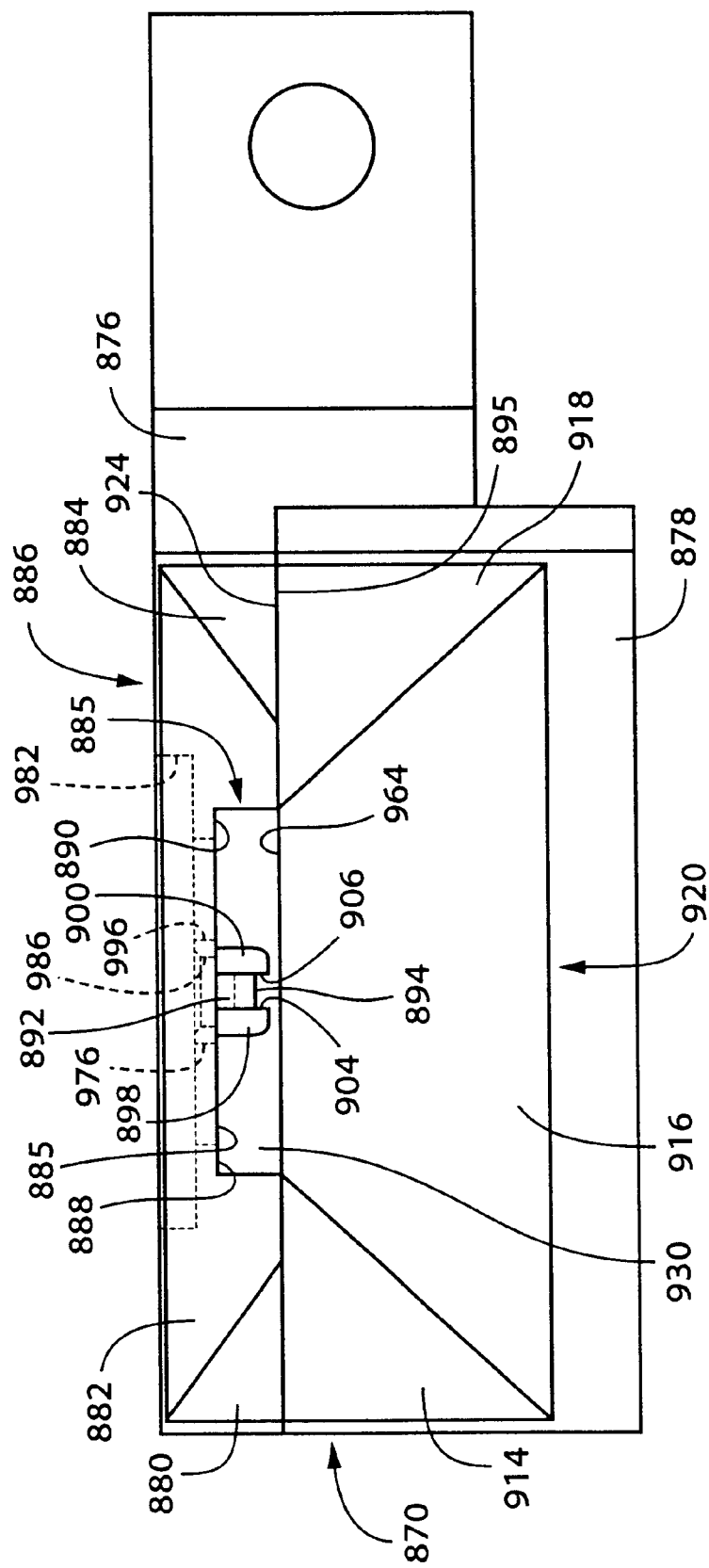
FIG. 37 is a plan view of the second member and a third member of the EC arranging and supplying apparatus whose movable guide members are shown in FIG. 35.

The second member 876 has, as shown in FIGS. 36 and 37, a recess 886 which is defined by three inclined surfaces 880, 882, 884 and which opens in an upper surface of the second member 876; and a vertical recess 885 which is formed through the second member 876 in a vertical direction. The second member 876 has a vertical ridge 892 at a widthwise center position of the recess 885, so that two vertical recesses 888, 890 are provided on both sides of the ridge 892, respectively. The ridge 892 has a thickness smaller than a depth of the recesses 888, 890, and has a vertical end surface 894 parallel to a lengthwise direction of an EC feeder. A distance between the vertical end surface 894 and a contact surface 895 of the second member 876 that contacts the third member 878 when the second and third members 876, 878 are assembled with each other, as seen in a widthwise direction of the EC feeder, is equal to a length of two short sides of a rectangle corresponding to a rectangular transverse cross section of a chute 1012 (FIG. 36).

Two vertical ridges 898, 900 which are shorter than the vertical ridge 892 are provided, as shown in FIGS. 36 and 37, on both sides of a lower portion of the ridge 892 in a widthwise direction of the same 892. Each of the ridges 898, 900 has a thickness greater than that of the ridge 892, and projects to a position between the end surface 894 and the contact surface 895 in the widthwise direction of the EC feeder. The two ridges 898, 900 define, on both sides of the end surface 894 in the widthwise direction thereof, two guide surfaces 904, 906, respectively, which extend in a vertical direction and which are opposed to each other in the widthwise direction of the end surface 894. Each of the guide surface 904, 906 has a width equal to half the length of the short sides of the above-indicated rectangle. The two ridges 898, 900 have, above the guide surfaces 904, 906, respective inclined surfaces 908, 910 which are inclined outward away from each other as they extend upward. The second member 876 has, as shown in FIGS. 36 and 39, a vertical recess 912 which is provided below the ridges 892, 898, 900 with a gap left between the recess 912 and the ridges 892, 898, 900 and which has a rectangular transverse cross section.

Figure 39:
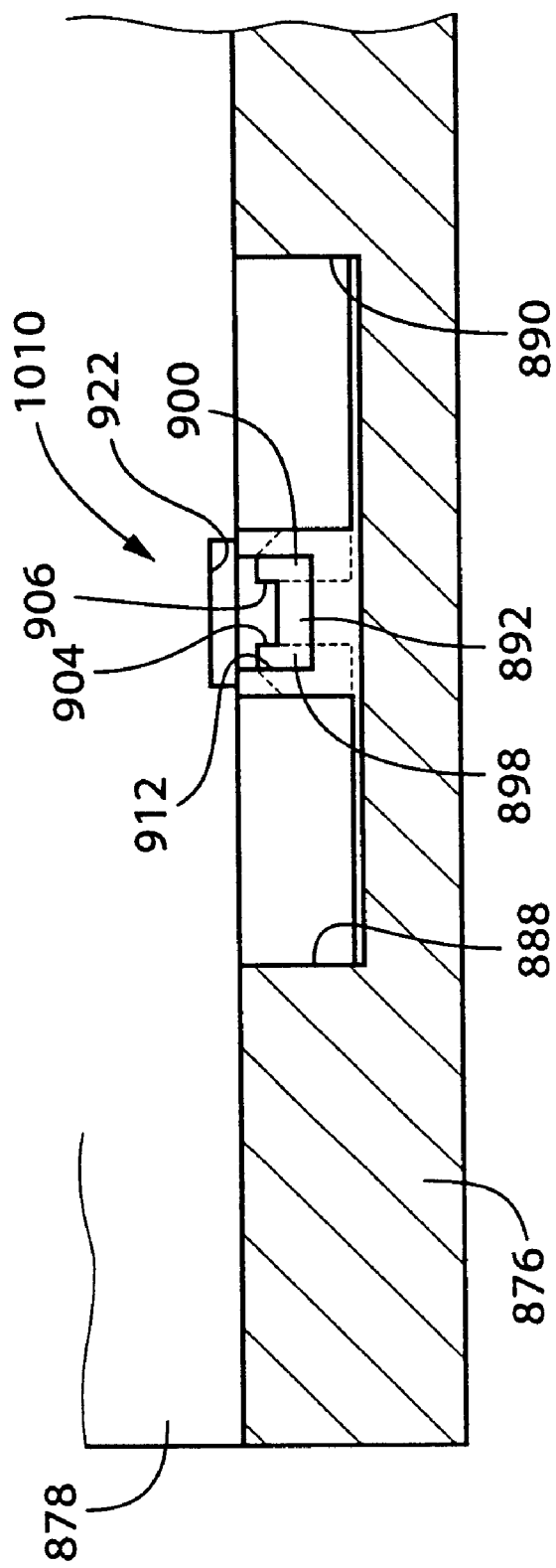
FIG. 39 is a cross-sectioned, bottom view of the second member shown in FIG. 36, taken along a plane passing through a portion of the second member that is located below a recess as part of a chute connector.

The third member 878 has, as shown in FIG. 37, a recess 920 which is defined by three inclined surfaces 914, 916, 918 and which opens in an upper surface of the third member 878; and a vertical recess 922 which opens, as shown in FIG. 39, in a lower surface of the third member 878 and which has a rectangular transverse cross section.

When the second and third members 876, 878 are assembled with each other, the contact surface 895 of the second member 876 contacts a contact surface 924 of the third member 876, so that a vertical, movable-guide-member receiving hole 930 having a rectangular transverse cross section, as shown in FIG. 37, is defined. The first and second movable guide members 872, 874 are fitted in the vertical recesses 898, 900 each as part of the vertical movable-guide-member receiving hole 930, respectively, such that each of the guide members 872, 874 is movable in a vertical direction. The second and third members 876, 878 and the first and second movable guide members 872, 874 cooperate with one another to define a vertical guide hole 932 which has a rectangular transverse cross section, as shown in FIG. 38.

Figure 38:
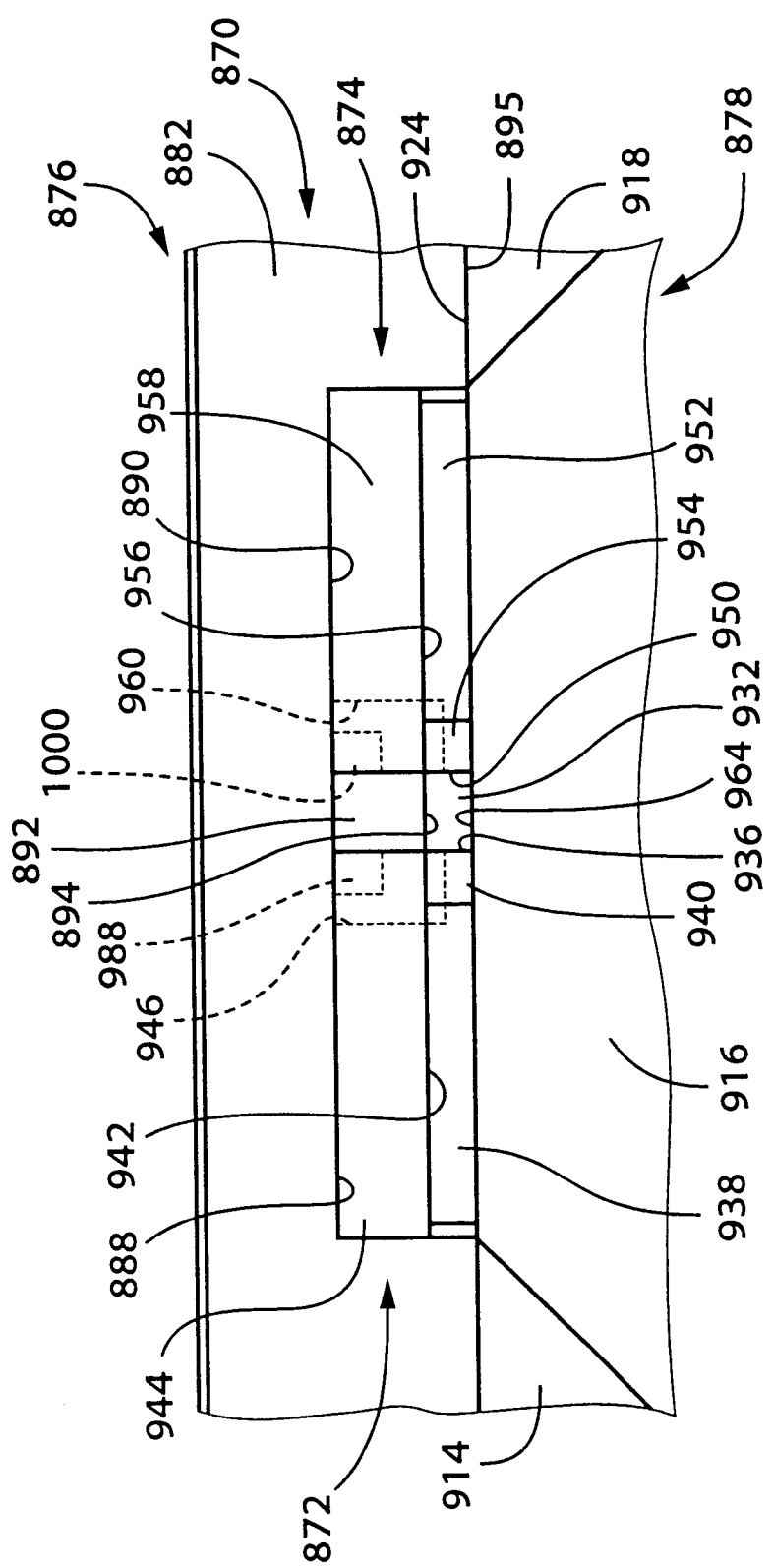
FIG. 38 is a plan view showing a state in which the first and second movable guide members are received in a movable-guide-member receiving hole defined by the second and third members shown in FIG. 37.

A portion of the first movable guide member 872 that projects over the end surface 894 of the ridge 892 toward the third member 878, has a vertical guide surface 936 which defines one of the two short sides of the above-indicated rectangle and which is perpendicular to the end surface 894 and parallel to the widthwise direction of the EC feeder, as shown in FIG. 38. The first guide member 872 has two inclined surfaces 938, 940 each of which is inclined upward away from the second movable guide member 874. The directions of inclination of the inclined surfaces 938, 940 correspond to those of the respective inclined surfaces 880, 914 of the second and third members 876, 878. The angle of inclination of the lower inclined surface 940 is greater than that of the upper one 938. The first guide member 872 has a vertical guide surface 942 which is perpendicular to the inclined surfaces 938, 940 and is flush with the end surface 894 of the ridge 892. The first guide member 872 has, above the guide surface 942, an inclined surface 944 which is inclined outward away from the third member 878 as it extends upward.

Figure 35:
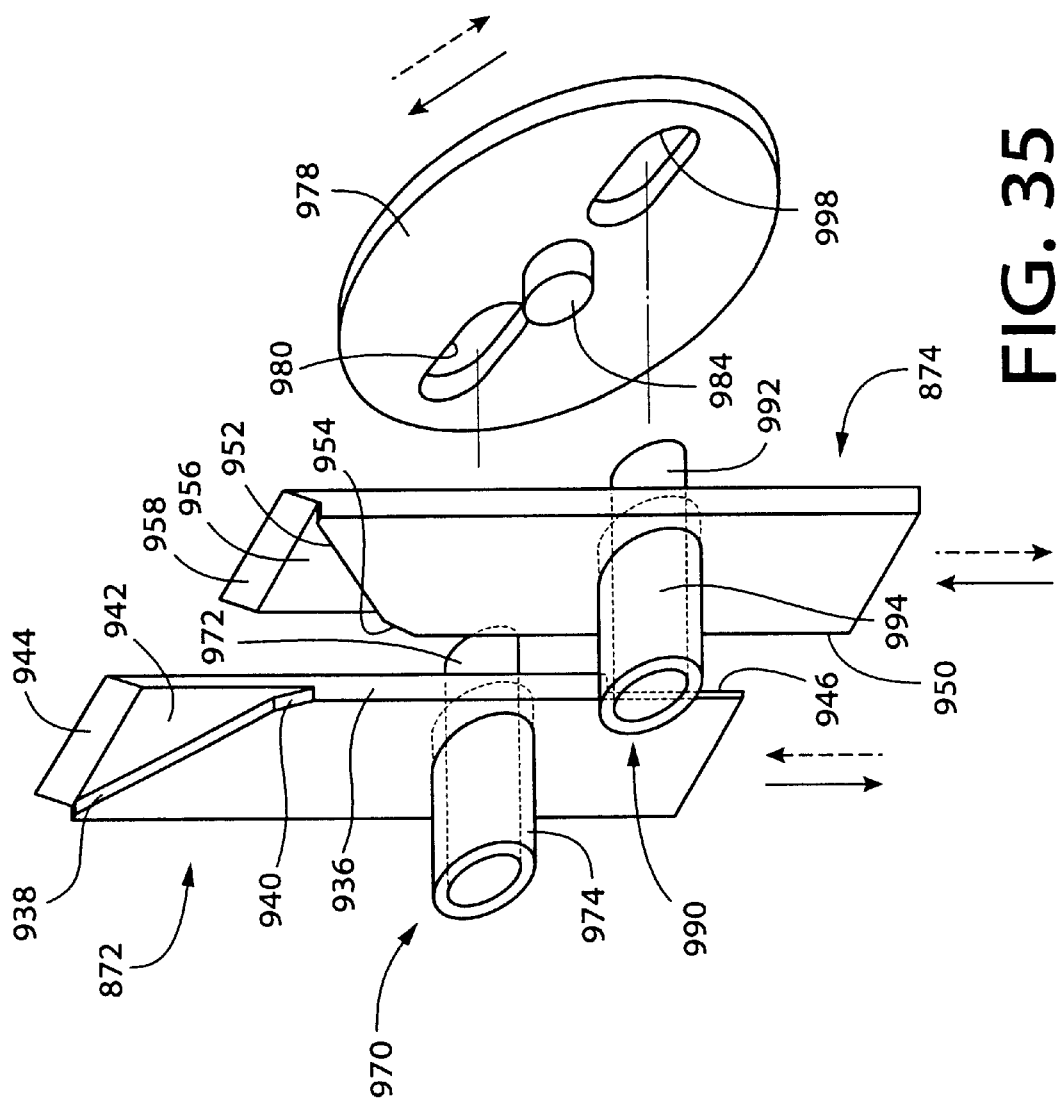
FIG. 35 is an exploded, perspective view of a first and a second movable guide member and a pivotable plate of an EC arranging and supplying apparatus as an eighth embodiment of the present invention.

The first movable guide member 872 has, in a lower end portion thereof, a vertical recess 946, as shown in FIG. 35, so that the first guide member 872 is fitted on one 898 of the two ridges 898, 900 provided on both sides of the lower portion of the central ridge 892, such that the first guide member 872 is vertically movable relative to the second member 876. The width of a lower end portion of the guide surface 936 that corresponds to the recess 946 is half the width of a remaining portion of the guide surface 936, and the lower end portion of the guide surface 936 is flush with the guide surface 904 of the ridge 898. The ridge 898 and the recess 946 have respective lengths which assure that even when the first guide member 872 is moved up to its upper-dead position, the first guide member 872 does not come off the ridge 898, that is, a portion of the guide surface 936 and a portion of the guide surface 904 remain continuous with each other in a lengthwise direction of the guide 870. Each of a width of the recess 946 of the guide surface 936 and a distance between an end surface of the ridge 898 and the contact surface 895 is equal to half the length of the short sides of the above-indicated rectangle. Therefore, when the first guide member 872 is moved relative to the ridge 898, no space that can fully receive a whole EC 84 is created. Thus, each EC 84 can be smoothly moved by being guided by the guide surfaces 936, 904. Thus, a connection portion 948 having a continuous guide surface is provided between a chute-side end portion of the guide hole 932, and an initial end portion of the chute 1012. In addition, since the inclined surface 908 provided at the upper end portion of the guide surface 904 functions as a guide surface, each EC 84 can move without any problems through the guide hole 932 even in the case where the guide surface 936 is positioned somewhat inward from the guide surface 936 into the guide hole 932.

The second movable guide member 874 has a structure similar to that of the first movable guide member 872. In short, the second guide member 874 has a vertical guide surface 950 which is perpendicular to the end surface 894 of the central ridge 892; two inclined surfaces 952, 956 which have different angles of inclination; a vertical guide surface 956 which is flush with the end surface 894; an inclined surface 958 provided above the guide surface 956; a recess 960 in which the other 900 of the side ridges 898, 900 is fitted; and a connection portion 962.

In the present embodiment, one of the two long sides of the rectangle corresponding to the rectangular transverse cross section of the chute 1012 is defined by respective portions of the first and second movable guide members 872, 874 that define the guide surfaces 942, 956, respectively, and to the central ridge 892; and the other long side is defined by the third member 878. The central ridge 892 provides a stationary guide member which corresponds to the central portion of the one long side. The above-indicated respective portions of the first and second movable guide members 872, 874 that define the guide surfaces 942, 956, respectively, provide two side portions located on both sides of the central portion of the one long side, respectively. The third member 878 provides a stationary guide member. The above-indicated respective portions of the first and second movable guide members 872, 874 that define the guide surfaces 942, 956, respectively, and the central ridge 892 cooperate with the third member 878 to provide a first pair of portions; the guide surfaces 942, 956 and the end surface 894 cooperate with a vertical guide surface 964 which is continuous with the inclined surface 916 of the third member 878, to provide a first pair of sides which extend parallel to the axial direction of the guide 870, or a first pair of planar surfaces which define the two long sides of the above-indicated rectangle, respectively; and the inclined surfaces 944, 958, 882, 916 provide first inclined surfaces. The respective portions of the first and second guide members 872, 874 that project over the end surface 894 of the central ridge 892 provide a second pair of portions; and the guide surfaces 936, 950 provide a second pair of sides which extend parallel to the axial direction of the guide 870, or a second pair of planar surfaces which define the two long sides of the above-indicated rectangle, respectively; and the inclined surfaces 938, 940, 952, 954 provide second inclined surfaces. In addition, the end surface 894 of the central ridge 892, the guide surfaces 936, 950 of the first and second guide members 872, 874, and a portion of the guide surface 964 of the third member 878 that is opposed to the end surface 894 cooperate with one another to define a narrowest portion 966 of the guide hole 932. Moreover, the inclined surfaces 880, 882, 884 of the second member 876, respective portions of the inclined surfaces 914, 916, 918 of the third member 878 that are opposite to the first member, the inclined surfaces 938, 940, 944 of the first guide member 872, and the inclined surfaces 952, 954, 958 of the second guide member 874 cooperate with one another to define an upper surface of the guide 870.

Figure 40:
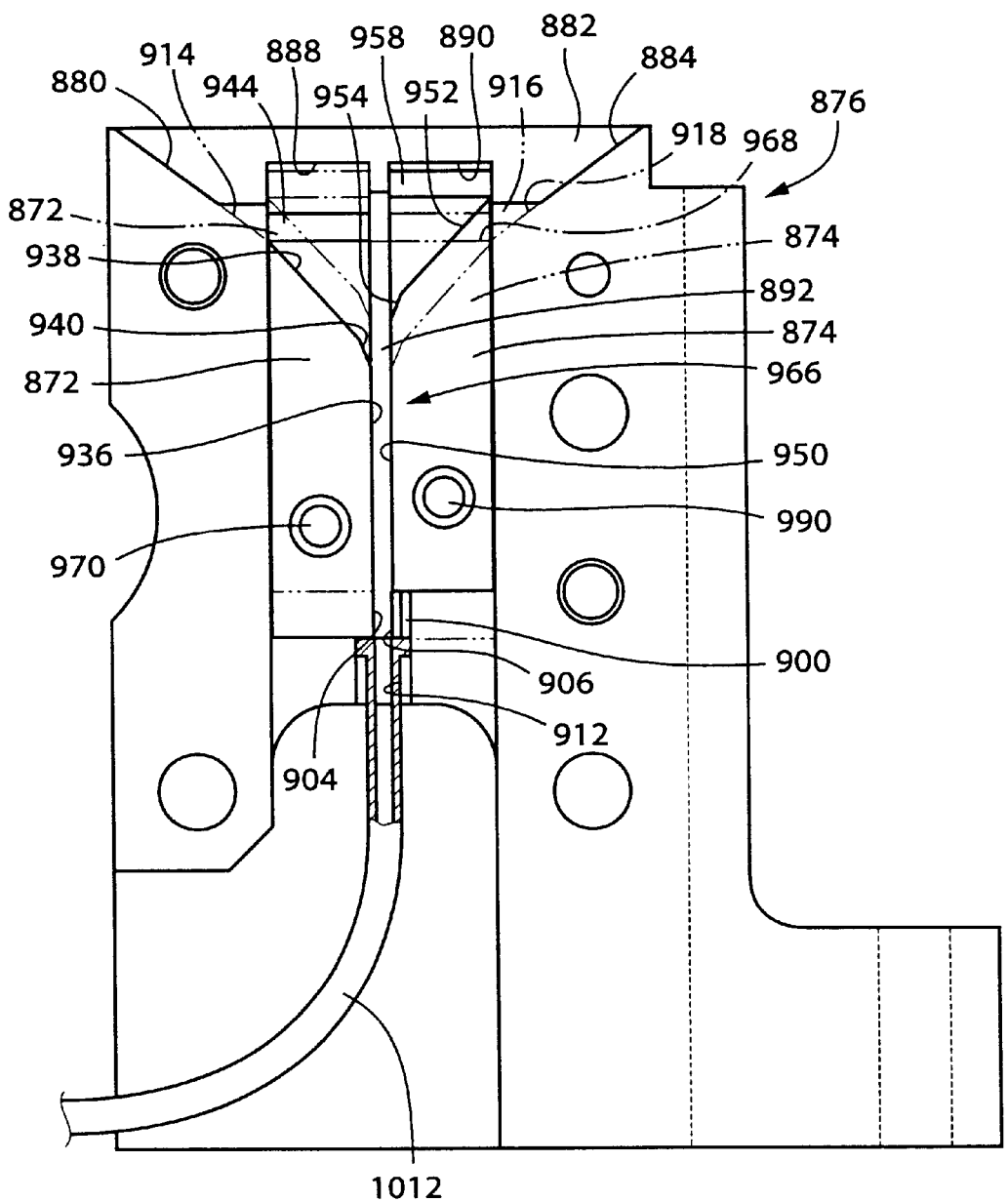
FIG. 40 is a partly cross-sectioned, front elevation view showing a state in which the first and second movable guide members are fitted in the second member shown in FIG. 35.

When the first and second movable guide members 872, 874 are moved, each of the inclined surfaces 938, 952 is moved, as shown in FIG. 40, up to an upper-dead position where an upper end portion of the each surface 938, 952 is positioned above a boundary 968 between the inclined surface 916 of the third member 878 and the guide surface 964, and down to a lower-dead position where the upper end portion of the each surface 938, 952 is positioned below the boundary 968. A space which is defined by, and between, the guide surfaces 942, 956 and the end surface 894, and the guide surface 964, in a direction parallel to the short sides of the above-indicated rectangle, is defined, in a direction parallel to the long sides of the same rectangle, by, and between, respective lower portions of the two inclined surfaces 938, 952 that are located below the boundary 968, or one of the two lower portions and an opposite one of two opposed surfaces of the third member 878 that are opposed to each other in the direction parallel to the long sides of the rectangle. In the present embodiment, this space takes, in the direction parallel to the long sides of the rectangle, a maximum distance between the respective lower portions of the two inclined surfaces 938, 952, or one of the two lower portions and an opposite one of the two opposed surfaces of the third member 878, at a certain timing while the first and second movable guide members 872, 874 are moved, and the maximum distance is about eight times longer than the dimension of the long sides of the rectangle.

The first movable guide member 872 has, as shown in FIG. 35, an engaging pin 970 which projects in a direction perpendicular to the direction of movement of the first guide member 872. The engaging pin 970 has two end portions which project from the first guide member 872 and which provide two engaging portions 972, 974, respectively. One 974 of the two engaging portions 972, 974 is fitted in an elongate hole (not shown) formed in the third member 878, such that the engaging portion 974 is vertically movable in the hole relative to the third member 878, and is fitted in an elongate hole (not shown) formed in a cam lever (not shown), such that the engaging portion 974 is movable in the hole relative to the cam lever. The other engaging portion 972 is fitted in an elongate hole 976 (FIG. 36) formed in the second member 876, such that the engaging portion 972 is vertically movable in the hole 976 relative to the second member 876, and is fitted in an elongate hole 980 formed in a pivotable plate 978 (FIG. 35), such that the engaging portion 972 is movable in the hole 980 relative to the pivotable plate 978. The pivotable plate 978 is fitted in a receiving hole 982 formed in the second member 876, such that an axial portion 984 projecting from the central portion of the plate 876 is pivotally fitted in a receiving hole 986 formed in the second member 876 and according the pivotable plate 978 is pivotable about an axis line perpendicular to an axis line of the guide 870. The first movable guide member 872 has, as shown in FIG. 38, a recess 988 for avoiding interference with the axial portion 984 of the pivotable plate 978.

Similarly, the second movable guide member 874 has, as shown in FIG. 35, an engaging pin 990 which projects in a direction perpendicular to the direction of movement of the second guide member 874. The engaging pin 990 has two end portions which project from the second guide member 874 and which provide two engaging portions 992, 994, respectively. One 994 of the two engaging portions 992, 994 is fitted in another elongate hole (not shown) formed in the third member 878, such that the engaging portion 994 is vertically movable in the hole relative to the third member 878. The other engaging portion 992 is fitted in an elongate hole 996 (FIG. 36) formed in the second member 876, such that the engaging portion 992 is vertically movable in the hole 996 relative to the second member 876, and is fitted in another elongate hole 998 formed in the pivotable plate 978, such that the engaging portion 992 is movable in the hole 998 relative to the pivotable plate 978. The two elongate holes 980, 998 of the pivotable plate 978 are diametrically opposite to each other, and the first and second movable guide members 872, 874 are engaged with the pivotable plate 978 at respective positions which are equally distant from the axis line of pivotal motion of the plate 978. The second guide member 874 has, as shown in FIG. 38, a recess 1000 for avoiding interference with the axial portion 986 of the plate 978.

When the second and third members 876, 878 are assembled with each other, a chute connector 1010 having a rectangular cross section as shown in FIG. 39 is provided. In the present embodiment, the chute 1012 is provided by a pipe having a rectangular cross section, and the initial end portion of the chute 1012 is fitted in the chute connector 1010 to provide a passage continuous with the guide hole 932. The rectangular transverse cross section of the initial end portion of the chute 1012 takes the same angular position as that of the guide hole 932, and an intermediate portion of the chute 1012 is twisted by 90 degrees so that the rectangular transverse cross section of a terminal end portion of the chute 1012 takes an angular phase different by 90 degrees from that of the initial-end portion thereof. Thus, each EC 84 is fed to an EC-supply portion of the EC feeder, in a posture thereof in which the thicknesswise direction of the each EC 84 is vertical and the widthwise direction of the same 84 is horizontal, and in this posture the each EC 84 is supplied to an EC-suction head.

In the present embodiment, when the cam lever (not shown) is pivoted, the first movable guide member 872 is moved upward and downward, and the pivotable plate 978 i s pivoted, so that the second movable guide member 874 is moved at the same speed as that of the first guide member 872 but in directions opposite to the upward and downward directions of movement of the first guide member 872. Thus, the ECs 84 present in the bottom portion of the hopper and the upper portion of the guide hole 932 are positively moved, so that the hopper and the guide hole 932 are effectively prevented from being clogged with the ECs 84, or the ECs 84 are effectively prevented from making bridges. Accordingly, the ECs 84 are smoothly moved downward little by little by being guided by the inclined surfaces 880, 882, 884, 914, 916, 918, 938, 940, 952, 954, and are eventually introduced into the narrowest portion 966 of the guide hole 932.

Figure 41:
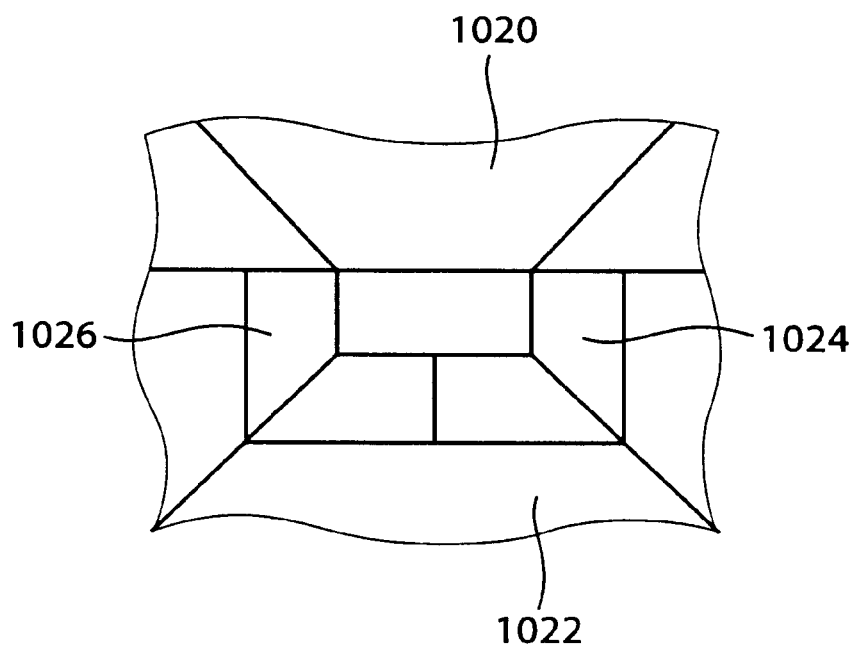
FIG. 41 is a plan view of a guide of another EC arranging and supplying device as a ninth embodiment of the present invention.

FIG. 41 shows a ninth embodiment relating to a guide of another arranging and supplying apparatus. The present apparatus includes a second member 1020 and a third member 1022 of a main frame member that correspond to the second and third members 152, 154 of the main frame member employed in the first embodiment shown in FIG. 7. The present guide includes two movable guide members, i.e., a first movable guide member 1024 and a second movable guide member 1026 which are moved relative to each other like the two movable guide members 232, 234 employed in the first embodiment. In the present embodiment, a portion of the guide that defines four sides of a rectangle corresponding to a rectangular transverse cross section of a chute, is divided into the two movable guide members 1024, 1026 by two dividing planes including a first plane which extends parallel to the two long sides of the rectangle, and a second plane which extends from an intermediate point on one of the two short sides of the same.

Figure 42:
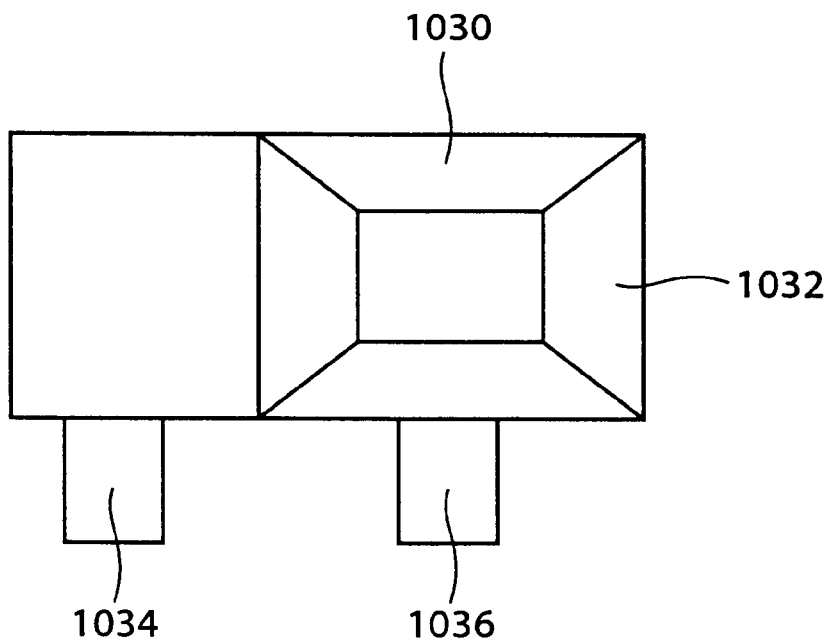
FIG. 42 is a plan view of a guide of another EC arranging and supplying device as a tenth embodiment of the present invention.

FIG. 42 shows a tenth embodiment relating to a guide of another arranging and supplying apparatus. The present guide includes two movable guide members, i.e., a first movable guide member 1030 and a second movable guide member 1032 each of which is moved like the movable guide member 335 employed in the second embodiment shown in FIG. 15. The two movable guide members 1030, 1032 have respective engage pins 1034, 1036 each of which is moved up and down by a cam lever like the cam lever 742 shown in FIG. 27. In the present embodiment, the guide includes the two movable guide members 1030, 1032, and a movement amount and a movement speed of one of the two movable guide members 1030, 1032 differs from a corresponding one of a movement amount and a movement speed of the other movable guide member.

In each of the illustrated embodiments, the guide hole 236, 370, 570, 732 includes a first portion whose cross section taken along a horizontal plane has a constant area, and a second portion whose cross section taken along a horizontal plane has an area which increases in an upward direction toward the hopper. However, it is not essentially required that the guide hole include the first portion whose cross section has the constant area. That is, the guide hole may consists of only the second portion whose cross section has the changing area. In this case, the guide hole is defined by inclined or curved surfaces, and the hopper and the chute are connected by those inclined or curved surfaces. In addition, it is not essentially required that the guide hole include the second portion whose cross section has the changing area. That is, the guide hole may consists of only the first portion whose cross section has the constant area.

In the second embodiment shown in FIGS. 14 to 16, the guide 330 is divided into the stationary guide member 332 and the movable guide member 334, such that the stationary guide member 332 corresponds to a first pair of adjacent sides of the four sides of the rectangular transverse cross section of the chute and the movable guide member 332, 334 corresponds to a second pair of adjacent sides of the four sides. In short, the guide 330 is divided along a diagonal line of the rectangular transverse cross section. However, the guide 330 may be divided along a line other than the diagonal line. For example, the guide 330 may be divided along a line parallel to the long sides of the rectangle, or along a line parallel to the short sides of the rectangle. This is also true with the case where the chute has a quadrangular transverse cross section other than the rectangular cross section.

In the second embodiment shown in FIGS. 14 to 16, the guide 330 is provided by the guide members 332, 334 which are separate from the chute-forming member 380 which provides the chute, and the guide members 332, 334 are assembled with the chute-forming member 380. In this case, it is not essentially required that the guide have the same transverse cross section as those of the chute and the guide hole. For example, in the case where the chute and the guide hole have a quadrangular transverse cross section, the guide may have a circular transverse cross section.

In the fourth embodiment shown in FIGS. 18 to 25, the first and second movable guide members 546, 548 are moved at the same speed. However, the two guide members 546, 548 may be moved at different speeds. For example, the two guide members 546, 548 are engaged with the pivotable plate 620 at respective positions remote by different distances from the axis line of pivotal motion of the plate 620. In addition, the short-side defining portion 556 of the first movable guide member 546, and the second movable guide member 548 may have different widths. Moreover, the respective angles of inclination of the two inclined surfaces 560, 562 of the short-side defining portion 556 may differ from those of the two inclined surfaces 566, 568 of the second movable guide member 548, respectively. This is true with the embodiments shown in FIGS. 26 to 40. For example, in the fifth embodiment shown in FIGS. 26 to 32, the three movable guide plates 700, 702 704 may be moved at different speeds.

In each of the illustrated embodiments, the air is flowed in the chute to feed the ECs forward in the chute. Otherwise, as disclosed in U.S. patent application Ser. No. 09/106,703 assigned to the Assignee of the present application, ECs may be fed forward by a belt-type feeding device which includes an endless circulating belt as an EC feeding member. In this case, one end portion of a curved portion of a chute that is opposite to the other end portion thereof located on the side of a hopper may open in the vicinity of an upper surface of the belt, and the belt may be circulated by a belt driving device, so that the ECs which have been placed onto the upper surface of the belt through the chute are fed forward by the circulation of the belt. In the case where each EC is placed onto the belt, with an angular phase with which the EC is to be sucked and held by an EC-suck head, the guide and the chute may have a transverse cross section which assures that each EC is fed forward with the same angular phase as that with which the each EC is to be placed onto the belt, or alternatively a portion of the guide that is located on the side of the hopper may have a transverse cross section having an angular phase different from that of each EC with which the each EC is to be placed onto the belt and an angular-phase changing portion which changes the angular phase of the each EC to an angular phase with which the each EC is to be sucked and held by the EC-suck head, may be included in the chute, between the guide and the belt.

In each of the illustrated embodiments, the air in the chute 80 is sucked through the end surface 90 of the chute 80. However, the air may be sucked through a different surface of the chute, e.g., a bottom surface or a side surface of the chute.

Alternatively, it is possible that only a first portion of a chute that is around the EC-take-out aperture 88 be horizontal, and a second portion of the chute that connects between the first portion and the vertically extending, initial end portion of the chute be inclined relative to a horizontal plane, so that ECs are fed forward, because of the inclination of the second portion, toward the EC-take-out aperture. The first portion of the chute may also be inclined.

In the case where the guide has at least one curved upper surface, the curved upper surface may be curved while the radius of curvature thereof is changed, so that the minimum angle of inclination of the curved upper surface is greater than the angle of inclination of the bottom surface of the hopper, and/or so that the angle of inclination of a lower portion of the curved upper surface located on the side of the chute is greater than the angle of inclination of an upper portion of the curved upper surface located on the side of the hopper.

In the first embodiment, the elongate hole 292 of the cam lever 290 extends along an arc. However, the elongate hole may extend along a straight line. In the latter case, the elongate hole provides an engaging hole as a sort of engaging recessed portion, and is formed in an engaging lever.

The principle of the present invention is applicable to not only an EC arranging and supplying device of an EC feeder but also any sort of EC arranging and supplying device which includes a chute, a hopper, and a guide and which causes a number of objects each having a short columnar shape, to be arranged into an array and be supplied in the array.

In each of the illustrated embodiments, the EC feeders employed are ones which supply ECs to an EC mounting apparatus including a plurality of EC-suck heads which are revolved about an axis line to suck and hold the ECs and mount the ECs on a printed-wiring board. However, the principle of the present invention may be applied to an EC arranging and supplying device of an EC feeder which supplies ECs to an EC mounting apparatus which is linearly moved by a moving device in one direction to suck and mount ECs, or an EC mounting apparatus which is linearly moved in two directions perpendicular to each other on a reference plane to suck and mount ECs. In either case, at least one of the EC feeder and an EC-suck head is moved relative to the other of the feeder and the head, by a moving device, so that the feeder supplies the EC to the EC-suck head. Depending upon the specific construction of an EC mounting apparatus with which an EC feeder is used, the EC feeder may be one which is linearly moved on a movable table in one direction, as described in the first embodiment, one which is moved in two directions perpendicular to each other on a reference plane, or one which is stationary, i.e., is fixed at a position where ECs are supplied. Thus, each EC mounting apparatus may be called as an EC taking-out apparatus or an EC transferring apparatus.

In each of the illustrated embodiments, the elevator link 114 as the driven member is driven by a driving device which includes the index servomotor 26 as the drive source. However, the elevator link 114 may be driven by a driving device which includes an exclusive drive source other than the servomotor 26. This driving device including the exclusive drive source may be shared by two or more EC feeders, or may be provided for each EC feeder.

While the present invention has been described in its preferred embodiments, the present invention may be embodied with other changes, improvements, and modifications that may occur to a person skilled in the art without departing from the scope and spirit of the invention defined in the appended claims.

What is claimed is:

1. An apparatus for arranging and supplying a plurality of objects, the apparatus comprising:
   a chute which includes at least one end portion extending in a direction inclined with respect to a horizontal plane, and which causes the objects arranged in an array to be moved;
   a hopper which is provided on a side of said one end portion of the chute, which stores the objects in bulk, and which includes a funnelform bottom portion;
   a guide which is provided between a lower end of the bottom portion of the hopper and an upper end of said one end portion of the chute, and which guides, in a guiding direction, the objects from the hopper to the chute while arranging the objects into the array, the guide including a plurality of guide members comprising at least two movable guide members each of which is movable in the guiding direction, wherein a movement amount of one of the two movable guide members differs from a movement amount of the other of the two movable guide members; and
   a movable-guide-member moving device which moves said two movable guide members by their respective different movement amounts in the guiding direction.

2. An apparatus according to claim 1, wherein said plurality of guide members of the guide further comprises at least one stationary guide member which is not movable.

3. An apparatus according to claim 1, wherein at least one of a movement direction and a movement timing of said one of the two movable guide members differs from a corresponding one of a movement direction and a movement timing of the other of the two movable guide members.

4. An apparatus according to claim 3, wherein the movement direction of said one movable guide member is opposite to the movement direction of said other movable guide member.

5. An apparatus according to claim 1, wherein each of the objects has a prismatic shape having a convex quadrilateral transverse cross section, the chute has a convex quadrilateral transverse cross section corresponding to the transverse cross section of said each object, and said at least two movable guide members of the guide define at least two sides of four sides of a convex quadrilateral corresponding to the transverse cross section of the chute.

6. An apparatus according to claim 5, wherein a portion of the guide that defines the four sides of the quadrilateral corresponding to the quadrilateral transverse cross section of the chute, is divided into less than four guide members comprising said at least two movable guide members.

7. An apparatus according to claim 5, wherein a portion of the guide that defines the four sides of the quadrilateral corresponding to the quadrilateral transverse cross section of the chute, is divided into four guide members comprising said at least two movable guide members.

8. An apparatus according to claim 5, wherein the guide is divided into more than four guide members comprising said at least two movable guide members.

9. An apparatus according to claim 5, wherein a portion of the guide that defines the four sides of the quadrilateral corresponding to the quadrilateral transverse cross section of the chute, is divided into the plurality of guide members by a plurality of dividing planes comprising at least one dividing plane which includes a vertex of the quadrilateral and extends parallel to the guiding direction.

10. An apparatus according to claim 5, wherein a portion of the guide that defines the four sides of the quadrilateral corresponding to the quadrilateral transverse cross section of the chute, is divided into the plurality of guide members by a plurality of dividing planes comprising at least one dividing plane which extends from an intermediate point on one of the four sides of the quadrilateral.

11. An apparatus according to claim 5, wherein the guide includes four guide members which define the four sides of the quadrilateral, respectively, and which comprise said two movable guide members that are opposed to each other and are movable in the guiding direction, and two stationary guide members which are not movable.

12. An apparatus according to claim 5, wherein the guide includes four guide members which define the four sides of the quadrilateral, respectively, and which comprise at least three movable guide members each of which is movable in the guiding direction, and two movable guide members of the three movable guide members are simultaneously moved in opposite directions, respectively.

13. An apparatus according to claim 5, wherein the quadrilateral is a rectangle having two long sides opposed to each other, and two short sides opposed to each other, and the plurality of guide members of the guide comprise a first movable guide member which defines one of the two long sides and is movable in the guiding direction, and two second movable guide members which define the two short sides, respectively, and are movable in the guiding direction, and wherein the first movable guide member is moved in a direction opposite to a direction in which the two second movable guide members are moved.

14. An apparatus according to claim 13, wherein the two second movable guide members are moved at different speeds.

15. An apparatus according to claim 5, wherein the quadrilateral is a rectangle having two long sides opposed to each other, and two short sides opposed to each other, and the plurality of guide members of the guide comprise a first movable guide member which defines one of the two long sides and one of the two short sides that is adjacent to said one long side, a second guide member which defines the other long side, and a third guide member which defines the other short side, and wherein at least one of the second and third guide members comprises a movable guide member which is different from the first movable guide member and is moved in a direction opposite to a direction in which the first movable guide member is moved.

16. An apparatus according to claim 15, wherein the second guide member is a stationary guide member which is not movable.

17. An apparatus according to claim 15, wherein the guide is separated, by a plane which extends parallel to the guiding direction, into a first separated portion and a second separated portion which defines said other side of the convex quadrilateral, and wherein the second separated portion is divided into a middle stationary guide member defining said other side and two side movable guide members which are located on both sides of the middle stationary guide member, respectively.

18. An apparatus according to claim 17, wherein each of the two side movable guide members has a parallel guide surface extending parallel to the guiding direction, and an inclined guide surface which cooperates with the parallel guide surface to guide said each object to a narrowest portion of the guide that is provided along the middle stationary guide member.

19. An apparatus according to claim 18, wherein the parallel guide surface and the inclined guide surface are formed on respective integral portions of said each side movable guide member.

20. An apparatus according to claim 5, wherein the guide includes four portions which define the four sides of the quadrilateral, respectively, and comprise a first pair of portions opposed to each other and a second pair of portions opposed to each other, the two portions of the first pair have respective first planar surfaces which respectively define two first sides of the quadrilateral that are opposed to each other and which extend parallel to the guiding direction, and at least one first inclined surface which extends from an upper end of at least one of the two first planar surfaces and is inclined in a direction away from the other first planar surface as said first inclined surface extends upward, and the two portions of the second pair have two second planar surfaces which are located between the two first planar surfaces and extend parallel to the guiding direction, and at least one second inclined surface which extends from an upper end of at least one of the two second planar surfaces and is inclined in a direction away from the other second planar surface as said second inclined surface extends upward, and a greatest distance between a first portion of the second inclined surface that is located between the two first planar surfaces, and a second portion which is opposed to the first portion in a direction parallel to the two first sides, taken at at least one timing during movement of the movable guide member of the guide, is more than two times greater than a length of each of the two first sides.

21. An apparatus according to claim 20, wherein the quadrilateral is a rectangle, and said each first side is longer than each of the second sides.

22. An apparatus according to claim 20, wherein each of the two portions of the second pair has the second inclined surface.

23. An apparatus according to claim 5, wherein the plurality of guide members of the guide comprise a first guide member which defines two sides of the quadrilateral that are adjacent to each other, and a second guide member which defines the other two sides of the quadrilateral that are adjacent to each other, and wherein said at least two movable guide members of the guide comprise the first and second guide members.

24. An apparatus according to claim 23, wherein a movement direction of said one of the two movable guide members differs from a movement direction of the other movable guide member.

25. An apparatus according to claim 1, further comprising a stationary guide-member holding member which holds the two movable guide members of the guide such that the movable guide members are movable in the guiding direction.

26. An apparatus according to claim 3, wherein the movable-guide-member moving device comprises a pivotable member which is pivotable about an axis line perpendicular to the guiding direction, and which includes two engaging portions which respectively engage the two movable guide members which are simultaneously moved in opposite directions, respectively.

27. An apparatus for arranging and supplying a plurality of objects, the apparatus comprising:
  a chute which includes at least one end portion extending in a direction inclined with respect to a horizontal plane, and which causes the objects arranged in an array to be moved;
  a hopper which is provided on a side of said one end portion of the chute, which stores the objects in bulk, which includes a funnelform bottom portion, and which has an outlet at a lower end of the bottom portion;
  a discharging-promoting member which is provided in a vicinity of the outlet of the hopper, which is movable to an advanced position where the discharging-promoting member projects into the hopper and to a retracted position away from the advanced position, and which promotes discharging of the objects from the hopper to the chute while arranging the objects into the array;
  a positioning device which sequentially positions the objects which have been moved in the array through the chute, one by one, at a predetermined supply position; and
  a reciprocating device which reciprocates, while each one object is positioned at the supply position by the positioning device, the discharging-promoting member between the advanced and retracted positions, a plurality of times.

28. An apparatus according to claim 27, wherein the discharging-promoting member has an upper surface which is inclined, with respect to the horizontal plane, by a first angle which is within a predetermined angle range within which a second angle by which a bottom surface of the hopper, defined by said bottom portion thereof, is inclined with respect to the horizontal plane.

29. An apparatus according to claim 28, wherein the first angle is greater than the second angle.

30. An apparatus according to claim 28, wherein the upper surface of the discharging-promoting member includes a first portion which is located on a side of the bottom portion of the hopper, and a second portion which is located on the side of said one end portion of the chute and is inclined, with respect to the horizontal plane, by an angle greater than an angle by which the first portion is inclined with respect to the horizontal plane.

31. An apparatus according to claim 22, wherein the reciprocating device comprises:
- a cam follower which is provided on the discharging-promoting member such that the cam follower is movable with the discharging-promoting member; and
- a pivotable cam which is pivotable about an axis line perpendicular to a direction in which the discharging-promoting member is moved, and which engages the cam follower and converts an own pivotal motion into a linear motion of the cam follower.

32. An apparatus according to claim 31, wherein the cam follower comprises an engage pin which projects from the discharging-promoting member such that the engage pin extends in a direction perpendicular to the direction in which the discharging-promoting member is moved, and the pivotable cam comprises a cam lever which includes a cam portion which engages the engage pin.

33. An apparatus according to claim 31, wherein the reciprocating device further comprises a driven member which is driven by a drive member which is driven by a drive source which is provided outside the apparatus.

34. An apparatus according to claim 33, wherein the driven member comprises a reciprocateable member, and the reciprocating device further comprises a motion converting device which converts a single reciprocative movement of the reciprocateable member into a plurality of reciprocative movements of the discharging-promoting member.

35. An apparatus according to claim 31, further comprising a drive source which drives the pivotable cam.

36. An apparatus according to claim 35, wherein the drive source comprises an electric motor.

37. An apparatus according to claim 35, wherein the reciprocating device further comprises a driving control device which operates, while the apparatus supplies said each one object, the drive source by an amount which causes the plurality of reciprocative movements of the discharging-promoting member.

38. An apparatus according to claim 22, wherein said each one object is an electric component which has a generally rectangular-parallelopiped shaped.

* * * * *